(12) United States Patent
Lee et al.

(10) Patent No.: US 12,191,424 B2
(45) Date of Patent: Jan. 7, 2025

(54) PIXEL AND DISPLAY DEVICE INCLUDING THE SAME

(71) Applicant: Samsung Display Co., LTD., Yongin-si (KR)

(72) Inventors: Jeong Hyun Lee, Yongin-si (KR); Sung Geun Bae, Yongin-si (KR); Myeong Hun Song, Yongin-si (KR); Jong Chan Lee, Yongin-si (KR); Tae Hee Lee, Yongin-si (KR); Kyung Ah Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 571 days.

(21) Appl. No.: 17/150,499

(22) Filed: Jan. 15, 2021

(65) Prior Publication Data
US 2021/0391503 A1   Dec. 16, 2021

(30) Foreign Application Priority Data
Jun. 15, 2020   (KR) .................. 10-2020-0072583

(51) Int. Cl.
*H01L 33/38*   (2010.01)
*H01L 27/15*   (2006.01)
*H01L 33/62*   (2010.01)

(52) U.S. Cl.
CPC .......... *H01L 33/387* (2013.01); *H01L 27/156* (2013.01); *H01L 33/62* (2013.01)

(58) Field of Classification Search
CPC ..... H01L 33/387; H01L 27/156; H01L 33/62; H01L 25/0753; H01L 25/0752; H01L 25/075; H01L 25/167; H01L 33/08
See application file for complete search history.

(56) References Cited

U.S. PATENT DOCUMENTS

| 12,046,626 B2 | 7/2024 | Lee et al. | |
| 2008/0179602 A1* | 7/2008 | Negley | H01L 27/156 438/34 |
| 2017/0179097 A1* | 6/2017 | Zhang | H01L 25/167 |
| 2018/0012876 A1* | 1/2018 | Kim | H01L 33/387 |

(Continued)

FOREIGN PATENT DOCUMENTS

| KR | 10-2009-0119862 | 11/2009 |
| KR | 10-2020-0010701 | 1/2020 |

(Continued)

*Primary Examiner* — Latanya N Crawford Eason
(74) *Attorney, Agent, or Firm* — KILE PARK REED & HOUTTEMAN PLLC

(57) ABSTRACT

A display device includes a pixel, which includes at least one first light emitting element disposed between a first electrode and a second electrode; at least one second light emitting element disposed between a second electrode and a third electrode; at least one third light emitting element disposed between a third electrode and a fourth electrode; a first intermediate electrode disposed on the second electrode and electrically connected to the at least one first light emitting element and the at least one second light emitting element; and a second intermediate electrode disposed on the fourth electrode and electrically connected to the at least one third light emitting elements. The first intermediate electrode and the second intermediate electrode are electrically connected to each other.

22 Claims, 22 Drawing Sheets

(56) References Cited

U.S. PATENT DOCUMENTS

2018/0175009 A1\* 6/2018 Kim .................. H01L 33/20
2021/0249392 A1  8/2021 Woo et al.
2021/0359167 A1\* 11/2021 Lee ................. H01L 27/156

FOREIGN PATENT DOCUMENTS

| KR | 10-2020-0037911 | 4/2020 |
| KR | 10-2021-0102560 | 8/2021 |
| WO | 2008/091837 | 7/2008 |

\* cited by examiner

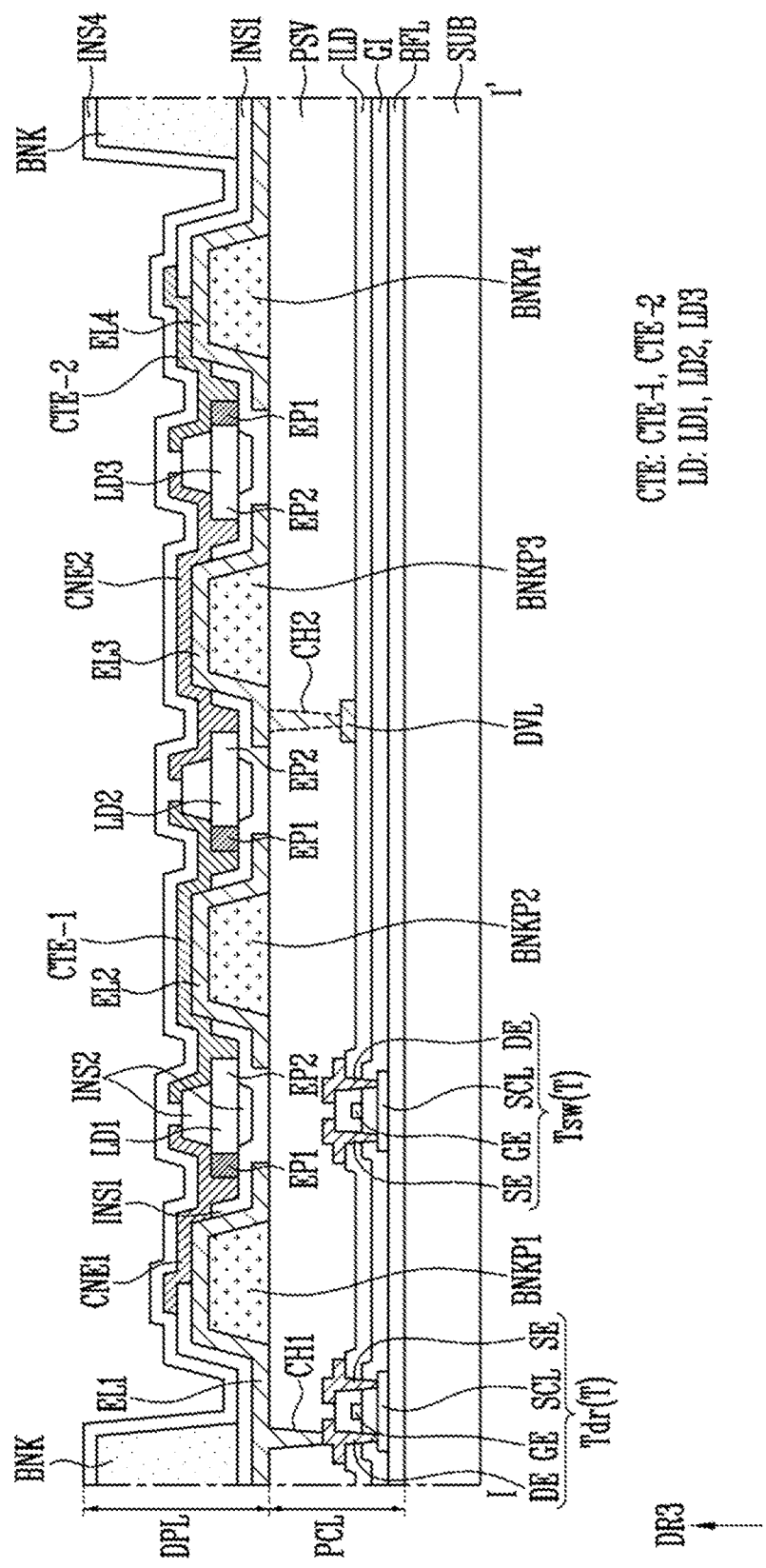

LD: LD1, LD2, LD3, LD4, LD5, LD6

PIXEL AND DISPLAY DEVICE INCLUDING THE SAME

CROSS-REFERENCE TO RELATED APPLICATION

The present application claims priority to and the benefit of Korean Patent Application No. 10-2020-0072583 under 35 U.S.C. § 119 (a), filed in the Korean Intellectual Property Office (KIPO) on Jun. 15, 2020, the entire contents of which are incorporated herein by reference.

BACKGROUND

1. Technical Field

The disclosure generally relates to a pixel and a display device including the same.

2. Description of the Related Art

As interest in information displays and demand for portable information media increase, research and commercialization have focused on display devices.

SUMMARY

The embodiments provide a pixel and a display device including the same, in which the light emission efficiency of light emitting elements is improved.

In accordance with an aspect of the disclosure, there is provided a pixel including a first electrode, a second electrode, a third electrode, and a fourth electrode each disposed on a substrate and physically separated from each other; at least one first light emitting element disposed between the first electrode and the second electrode; at least one second light emitting element disposed between the second electrode and the third electrode; at least one third light emitting element disposed between the third electrode and the fourth electrode; a first contact electrode disposed on the first electrode and electrically contacting the first electrode and a first end of the at least one first light emitting element; a first intermediate electrode disposed on the second electrode and electrically contacting a second end of the at least one first light emitting element and a first end of the at least one second light emitting element; a second contact electrode disposed on the third electrode and electrically contacting the third electrode, a second end of the at least one second light emitting element, and a second end of the at least one third light emitting element; and a second intermediate electrode disposed on the fourth electrode and electrically contacting a first end of the at least one third light emitting element. The first intermediate electrode and the second intermediate electrode may be electrically connected to each other.

The first electrode, the second electrode, the third electrode, and the fourth electrode may be disposed on the same layer and may be sequentially arranged in a first direction.

The first end of the at least one first light emitting element, the first end of the at least one second light emitting element, and the first end of the at least one third light emitting element may include a semiconductor layer of a same type.

The at least one second light emitting element and the at least one third light emitting element may be electrically connected in parallel to each other. The at least one second light emitting element and the at least one third light emitting element may be electrically connected in series to the at least one first light emitting element between the first electrode and the third electrode.

The first electrode may be electrically connected to one of a transistor and a power line, and the third electrode may be electrically connected to the other of the transistor and the power line.

The first intermediate electrode and the second intermediate electrode may be integral with each other and form an intermediate electrode.

The intermediate electrode may be spaced apart from the second contact electrode and may surround at least a portion of the second contact electrode in a plan view.

The intermediate electrode may have a closed loop structure.

The pixel may further include a bank disposed on the substrate and including a first opening and a second opening spaced apart from each other. In a plan view, the first contact electrode, the second contact electrode, the first intermediate electrode, and the second intermediate electrode may be located in the first opening, and a first end of each of the first electrode, the second electrode, the third electrode, and the fourth electrode may be located in the second opening.

The first intermediate electrode may electrically contact the second electrode, and the second intermediate electrode may electrically contact the fourth electrode.

The first intermediate electrode and the second intermediate electrode may not electrically contact the second electrode and the fourth electrode. The second electrode and the fourth electrode may be electrically disconnected from the first electrode and the third electrode.

The first contact electrode and the first intermediate electrode may be disposed on a same layer.

In accordance with another aspect of the disclosure, there is provided a pixel including a first electrode, a second electrode, a third electrode, a fourth electrode, a fifth electrode, a sixth electrode, a seventh electrode, and an eighth electrode, each disposed on the substrate and physically separated from each other; at least one first light emitting element disposed between the first electrode and the second electrode; at least one second light emitting element disposed between the second electrode and the third electrode; at least one third light emitting element disposed between the third electrode and the fourth electrode; at least one fourth light emitting element disposed between fifth electrode and the sixth electrode; at least one fifth light emitting element disposed between the seventh electrode and the eighth electrode; a first contact electrode disposed on the fifth electrode and electrically contacting the fifth electrode and a first end of the at least one fourth light emitting element; a first intermediate electrode disposed on the sixth electrode and the first electrode and electrically contacting a second end of the at least one fourth light emitting element and first end of the at least one first light emitting element; a second intermediate electrode disposed on the second electrode and the fourth electrode and electrically contacting a second end of the at least one first light emitting element, a first end of the at least one second light emitting element, and a first end of the at least one third light emitting element; a third intermediate electrode disposed on the third electrode and the eighth electrode and electrically contacting a second end of the at least one second light emitting element, a second end of the at least one third light emitting element, and a first end of the at least one fifth light emitting element; and a second contact electrode disposed on the seventh electrode and electrically contacting a second end of the at least one fifth light emitting element.

The first electrode, the second electrode, the third electrode, the fourth electrode, the fifth electrode, the sixth electrode, the seventh electrode, and the eighth electrode may be disposed on the same layer. The first electrode, the second electrode, the third electrode, and the fourth electrode may be sequentially arranged in a first direction in a plan view, and the fifth electrode, the sixth electrode, the seventh electrode, and the eighth electrode may be sequentially arranged in the first direction in the plan view. The fifth electrode, the sixth electrode, the seventh electrode, and the eighth electrode may be spaced apart from the first electrode, the second electrode, the third electrode, and the fourth electrode, respectively, located in a second direction intersecting the first direction in the plan view.

The first intermediate electrode may include a 1-1-th intermediate electrode overlapping the sixth electrode, and a 1-2-th intermediate electrode which extends in the second direction from the 1-1-th intermediate electrode and overlaps the first electrode. The third intermediate electrode may include a 3-1-th intermediate electrode overlapping the third electrode, and a 3-2-th intermediate electrode which extends in the second direction from the 3-1-th intermediate electrode and overlaps the eighth electrode. The second intermediate electrode may include a 2-1-th intermediate electrode overlapping the second electrode, and a 2-2-th intermediate electrode which extends from the 2-1-th intermediate electrode while detouring the 3-1-th intermediate electrode and overlaps the fourth electrode.

The fifth electrode may be electrically connected to one of a transistor and a power line, and the seventh electrode may be electrically connected to the other of the transistor and the power line.

The first end of the at least one first light emitting element, the first end of the at least one second light emitting element, the first end of the at least one third light emitting element, the first end of the at least one fourth light emitting element, and the first end of the at least one fifth light emitting element may include a semiconductor layer of a same type.

The at least one second light emitting element and the at least one third light emitting element may be electrically connected in parallel to each other, and the at least one first light emitting element, the at least one second light emitting element, the at least one fourth light emitting element, and the at least one fifth light emitting element may be electrically connected in series between the fifth electrode and the seventh electrode.

The pixel may further include at least one sixth light emitting element disposed between the sixth electrode and the seventh electrode. The first intermediate electrode may electrically contact a first end of the at least one sixth light emitting element, and the second contact electrode may electrically contact a second end of the at least one sixth light emitting element.

In accordance with still another aspect of the disclosure, there is provided a display device including a substrate including a plurality of pixel areas; and a pixel provided in each of the pixel areas. The pixel may include a first electrode, a second electrode, a third electrode, and a fourth electrode each disposed on the substrate and physically separated from each other; at least one first light emitting element disposed between the first electrode and the second electrode; at least one second light emitting element disposed between the second electrode and the third electrode; at least one third light emitting element disposed between the third electrode and the fourth electrode; a first contact electrode disposed on the first electrode and electrically contacting the first electrode and a first end of the at least one first light emitting element; a first intermediate electrode disposed on the second electrode and electrically contacting a second end of the at least one first light emitting element and a first end of the at least one second light emitting element; a second contact electrode disposed on the third electrode and electrically contacting the third electrode, a second end of the at least one second light emitting element, and a second end of the at least one third light emitting element; and a second intermediate electrode disposed on the fourth electrode and electrically contacting a first end of the at least one third light emitting element. The first intermediate electrode and the second intermediate electrode may be electrically connected to each other.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 7A, 7B, and 7C are schematic cross-sectional views illustrating various embodiments of the pixel taken along line I-I' shown in FIG. 6.

DETAILED DESCRIPTION OF THE EMBODIMENTS

Figure 1A:
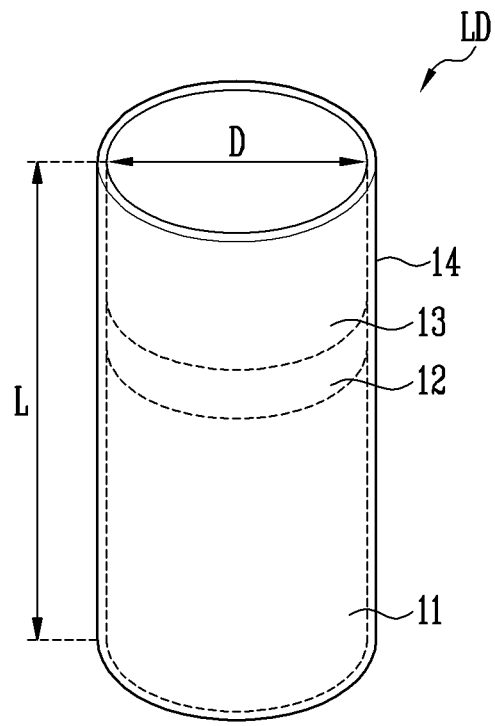
FIG. 1A is a perspective view schematically illustrating a light emitting element in accordance with an embodiment.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Like numbers refer to like elements throughout. In the drawings, the thickness of certain lines, layers, components, elements, or features may be exaggerated for clarity. It will be understood that, although the terms "first," "second," or the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed or disposed "on" or "above" another element indicates not only a case where the element is placed "directly on" or "just above" the other element but also a case where an additional element is interposed between the element and the other element. On the contrary, an expression that an element such as a layer, region, substrate, or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure and items required for those skilled in the art to easily understand the content of the disclosure will be described in detail with reference to the accompanying drawings.

Figure 1B:
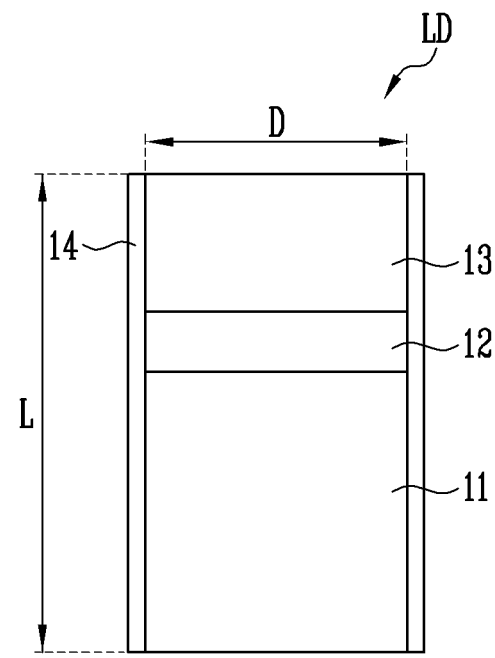
FIG. 1B is a schematic cross-sectional view of the light emitting element shown in FIG. 1A.
Figure 2A:
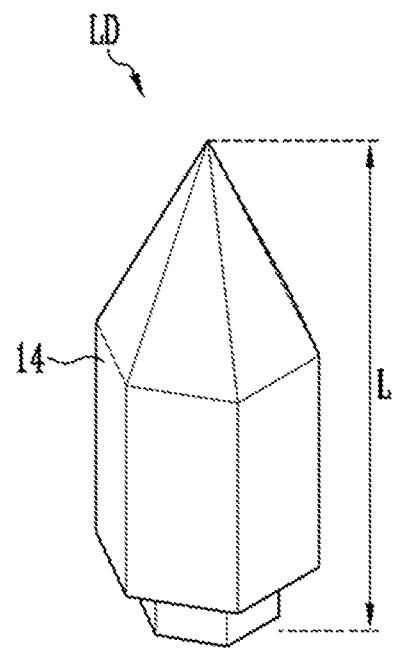
FIG. 2A is a perspective view schematically illustrating a light emitting element in accordance with another embodiment.
Figure 2B:
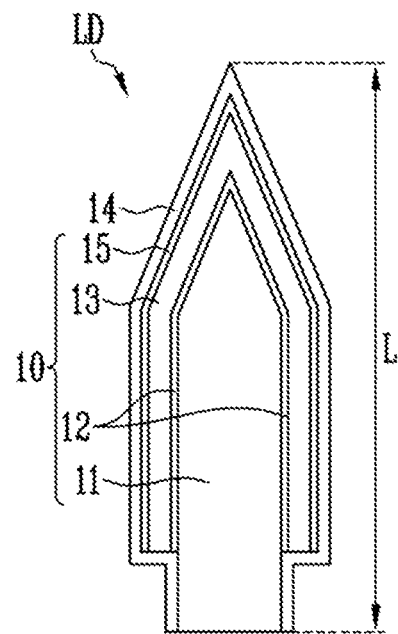
FIG. 2B is a schematic cross-sectional view of the light emitting element shown in FIG. 2A.

FIG. 1A is a perspective view schematically illustrating a light emitting element in accordance with an embodiment. FIG. 1B is a schematic cross-sectional view of the light emitting element shown in FIG. 1A. FIG. 2A is a perspective view schematically illustrating a light emitting element in accordance with another embodiment. FIG. 2B is a schematic cross-sectional view of the light emitting element shown in FIG. 2A.

In an embodiment, the kind and/or shape of the light emitting element is not limited to the embodiments shown in FIGS. 1A, 1B, 2A, and 2B.

Referring to FIGS. 1A, 1B, 2A, and 2B, each light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure in which the first semiconductor layer 11, the active layer 12, and the second semiconductor layer 13 are sequentially stacked.

The light emitting element LD may be provided in a shape extending in a direction. In case that an extending direction of the light emitting element LD is a length direction, the light emitting element LD may include a first end portion (or lower end portion) and a second end portion (or upper end portion) in the extending direction. Any one of the first and second semiconductor layers 11 and 13 may be disposed at the first end portion (or lower end portion) of the light emitting element LD, and the other of the first and second semiconductor layers 11 and 13 may be disposed at the second end portion (or upper end portion) of the light emitting element LD. In an example, the first semiconductor layer 11 may be disposed at the first end portion (or lower end portion) of the light emitting element LD, and the second semiconductor layer 13 may be disposed at the second end portion (or upper end portion) of the light emitting element LD.

The light emitting element LD may be provided in various shapes. In an example, the light emitting element LD may have a rod- or bar-like shape, which is elongated in its length direction (i.e., its aspect ratio is greater than 1). In an embodiment, a length L of the light emitting element LD in the length direction may be larger than a diameter D (or a width of a cross-section) of the light emitting element LD. The light emitting element LD may include, for example, a light emitting diode (LED) small enough to have a diameter D and/or a length L to a degree of micro or nano scale.

The diameter D of the light emitting element LD may be about 0.5 μm to about 500 μm, and the length L of the light emitting element LD may be about 1 μm to about 10 μm.

However, the diameter D and the length L of the light emitting element LD are not limited thereto, and the size of the light emitting element LD may be modified to be suitable for requirements (or design conditions) of a lighting device or a self-luminescent display device, to which the light emitting element LD is applied.

The first semiconductor layer 11 may include, for example, at least one n-type semiconductor layer. For example, the first semiconductor layer 11 may include any one semiconductor material among InAlGaN, GaN, AlGaN, InGaN, AlN, and InN, and may include an n-type semiconductor layer doped with a first conductive dopant (or n-type dopant) such as Si, Ge or Sn. However, the material forming (or constituting) the first semiconductor layer 11 is not limited thereto. The first semiconductor layer 11 may be formed of various materials. In an embodiment, the first semiconductor layer 11 may include a gallium nitride (GaN) semiconductor material doped with the first conductive dopant (or n-type dopant). The first semiconductor layer 11 may include an upper surface contacting the active layer 12 and a lower surface exposed to the outside in the length L direction of the light emitting element LD. The lower surface of the first semiconductor layer 11 may be the first end portion (or lower end portion) of the light emitting element LD.

The active layer 12 is formed on the first semiconductor layer 11 and may be formed in a single or multiple quantum well structure. In an example, in case that the active layer 12 is formed in the multiple quantum well structure, a barrier layer (not shown), a strain reinforcing layer, and a well layer, which form a unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of about 400 nm to about 900 nm, and use a double hetero structure. In an embodiment, a clad layer (not shown) doped with a conductive dopant may be formed on or under the active layer 12 in the length L direction of the light emitting element LD. In an example, the clad layer may be formed as an AlGaN layer or InAlGaN layer. In some embodiments, a material such as AlGaN or InAlGaN may be used to form the active layer 12. The active layer 12 may be formed of various materials. The active layer 12 may include a first surface contacting the first semiconductor layer 11 and a second surface contacting the second semiconductor layer 13.

In case that an electric field having a voltage equal to or greater than a predetermined voltage is applied to both end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting apparatuses, including a pixel of a display device.

The second semiconductor layer 13 is formed on the second surface of the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and may include a p-type semiconductor layer doped with a second conductive dopant (or p-type dopant) such as Mg. However, the material constituting the second semiconductor layer 13 is not limited thereto. The second semiconductor layer 13 may be formed of various materials. In an embodiment, the second semiconductor layer 13 may include a gallium nitride (GaN) semiconductor material doped with the second conductive dopant (or p-type dopant). The second semiconductor layer 13 may include a lower surface contacting the second surface of the active layer 12 and an upper surface exposed to the outside in the length L direction of the light emitting element LD. The upper surface of the second semiconductor layer 13 may be the second end portion (or upper end portion) of the light emitting element LD.

In an embodiment, the first semiconductor layer 11 and the second semiconductor layer 13 may have different thicknesses in the length L direction of the light emitting element LD. In an example, the first semiconductor layer 11 may have a thickness relatively greater than that of the second semiconductor layer 13 in the length L direction of the light emitting element LD. Accordingly, the active layer 12 of the light emitting element LD may be located more adjacent to the upper surface of the second semiconductor layer 13 than to the lower surface of the first semiconductor layer 11.

Although it is illustrated that each of the first semiconductor layer 11 and the second semiconductor layer 13 is formed as a layer, the disclosure is not limited thereto. In an embodiment, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR layer may be formed as a p-type semiconductor layer such as p-GAlnP, p-AlInP or p-AlGaInP layer, but the disclosure is not limited thereto.

In some embodiments, the light emitting element LD may further include an additional electrode (not shown) (hereinafter, referred to as "first additional electrode") disposed on the second semiconductor layer 13, in addition to the first semiconductor layer 11, the active layer 12, and the second semiconductor layer 13, which are described above. In other embodiments, the light emitting element LD may further include another additional electrode (not shown) (hereinafter, referred to as "second additional electrode") disposed at one end of the first semiconductor layer 11.

Each of the first and second additional electrodes may be an ohmic contact electrode, but the disclosure is not limited thereto. In some embodiments, each of the first and second additional electrodes may be a Schottky contact electrode. The first and second additional electrodes may include a conductive material (or substance). For example, the first and second additional electrodes may include an opaque metal and/or metal oxide using one or a mixture of chromium (Cr), titanium (Ti), aluminum (Al), gold (Au), nickel (Ni), and any oxide(s) or alloy(s) thereof, but the disclosure is not limited thereto. In some embodiments, the first and second additional electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials respectively included in the first and second additional electrodes may be identical to or different from each other. The first and second additional electrodes may be substantially transparent or translucent. Accordingly, light generated by the light emitting element LD can be emitted to the outside of the light emitting element LD through the first and second additional electrodes. In some embodiments, in case that light generated by the light emitting element LD does not pass through the first and second additional electrodes and is emitted to the outside of the light emitting element LD through an area except both the end portions of the light emitting element LD, the first and second additional electrodes may include an opaque metal.

In an embodiment, the light emitting element LD may further include an insulative film 14. However, in some embodiments, the insulative film 14 may be omitted and may be provided to cover or overlap only portions of the first semiconductor layer 11, the active layer 12, and the second semiconductor layer 13.

The insulative film 14 can prevent an electrical short circuit that may occur in case that the active layer 12 contacts a conductive material except the first semiconductor layer 11 and the second semiconductor layer 13. Also, the insulative film 14 minimizes a surface defect of the light emitting element LD, thereby improving the lifespan and light emission efficiency of the light emitting element LD. In case that light emitting elements LD are densely disposed, the insulative film 14 can prevent an unwanted short circuit that may occur between the light emitting elements LD. Whether the insulative film 14 is provided is not limited as long as the active layer 12 can be prevented from occurrence of a short circuit with external conductive material.

The insulative film 14 may be provided in a shape entirely surrounding the outer circumference of the light emitting stack structure including the first semiconductor layer 11, the active layer 12, and the second semiconductor layer 13.

Although a case where the insulative film 14 is provided in a shape entirely surrounding the outer circumference of each of the first semiconductor layer 11, the active layer 12, and the second semiconductor layer 13 is described in the above-described embodiment, the disclosure is not limited thereto. In some embodiments, in case that the light emitting element LD includes the first additional electrode, the insulative film 14 may entirely surround the outer circumference of each of the first semiconductor layer 11, the active layer 12, the second semiconductor layer 13, and the first additional electrode. In other embodiments, the insulative film 14 may not entirely surround the outer circumference of the first additional electrode, or may surround only a portion of the outer circumference of the first additional electrode and may not surround the other portion of the outer circumference of the first additional electrode. In some embodiments, in case that the first additional electrode is disposed at the second end portion (or upper end portion) of the light emitting element LD and the second additional electrode is disposed at the first end portion (or lower end portion) of the light emitting element LD, the insulative film 14 may expose at least one area of each of the first and second additional electrodes.

The insulative film 14 may include a transparent insulating material. For example, the insulative film 14 may include at least one insulating material selected from the group consisting of silicon oxide ($SiO_x$), silicon nitride ($SiN_x$), silicon oxynitride (SiON), aluminum oxide ($AlO_x$), titanium dioxide ($TiO_2$), and the like. However, the disclosure is not limited thereto, and various materials having insulating properties may be used as the material of the insulative film 14.

In some embodiments, the light emitting element LD may include a light emitting pattern 10 having a core-shell structure as shown in FIGS. 2A and 2B. The first semiconductor layer 11 may be located at a core, i.e., the middle (or center) of the light emitting element LD, the active layer 12 may be provided and/or formed in a shape surrounding the outer circumference of the first semiconductor layer 11 in the length L direction of the light emitting element LD, and the second semiconductor layer 13 may be provided and/or formed in a shape surrounding the active layer 12 in the length L direction of the light emitting element LD. The light emitting element LD may further include an additional electrode (not shown) surrounding at least a side of the second semiconductor layer 13. In some embodiments, the light emitting element LD may further include an insulative film 14 which is provided on the outer circumference 15 of the light emitting pattern 10 having the core-shell structure and includes a transparent insulating material. The light emitting element LD including the light emitting pattern 10 having the core-shell structure may be manufactured through a growth process.

The above-described light emitting element LD may be used as a light emitting source for various display devices. The light emitting element LD may be manufactured through a surface treatment process. For example, in case that light emitting elements LD are mixed in a liquid solution (or solvent) to be supplied to each pixel area (e.g., a light emitting area of each pixel or a light emitting area of each sub-pixel), each light emitting element LD may be surface-treated such that the light emitting elements LD are not unequally condensed in the solution but equally dispersed in the solution.

A light emitting unit (or light emitting apparatus) including the above-described light emitting element LD may be used in devices of various types that require a light source, including a display device. In case that light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used in devices of other types that require a light source, such as a lighting device.

Figure 3:
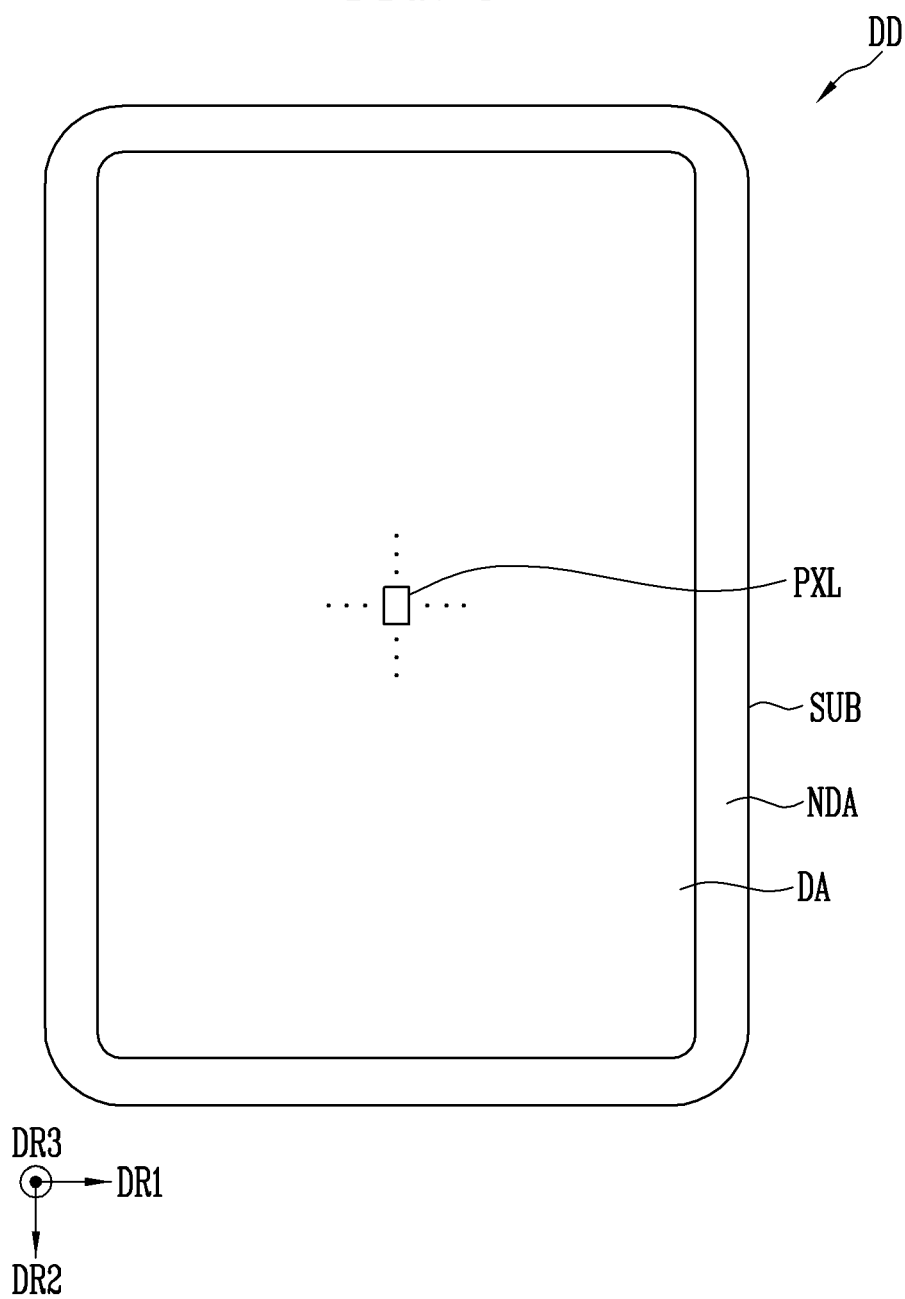
FIG. 3 schematically illustrates a display device in accordance with an embodiment, and particularly, is a schematic plan view of a display device using, as a light source, the light emitting element shown in FIG. 1A or 2A.

FIG. 3 illustrates a display device in accordance with an embodiment, and specifically, is a schematic plan view of a display device using, as a light source, the light emitting element shown in FIG. 1A or 2A.

In FIG. 3, for the sake of convenience, a structure of the display device DD is briefly illustrated based on a display area DA in which an image is displayed.

Referring to FIGS. 1A, 1B, 2A, 2B, and 3, the display device DD may include a substrate SUB, pixels PXL which are provided on the substrate SUB and each includes at least one light emitting element LD, a driving unit (not shown) which is provided on the substrate SUB and drives the pixels PXL, and a line unit (not shown) which connects the pixels PXL and the driving unit.

The disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The display device DD may be classified into a passive matrix type display device and an active matrix type display device according to a method of driving the light emitting element LD. In an example, in case that the display device DD is implemented as the active matrix type display device, each of the pixels PXL may include a driving transistor for controlling an amount of current supplied to the light emitting element LD, a switching transistor for transferring a data signal to the driving transistor, and the like.

The display device DD may be provided in various shapes. In an example, the display device DD may be provided in a rectangular plate shape having two pairs of sides parallel to each other, but the disclosure is not limited thereto. In case that the display device DD is provided in the rectangular plate shape, any one pair of sides among the two pairs of sides may be provided longer than the other pair of sides. For the sake of convenience, a case where the display device DD is provided in a rectangular shape having a pair of long sides and a pair of short sides is illustrated. An extending direction of the long sides is represented as a second direction DR2, an extending direction of the short sides is represented as a first direction DR1, and a direction perpendicular to the extending directions of the long sides and the short sides is represented as a third direction DR3. In the display device DD provided in the rectangular plate shape, a corner portion at which a long side and a short side are in contact with or contact each other may have a round shape.

The substrate SUB may include the display area DA and a non-display area NDA.

The display area DA may be an area in which the pixels PXL for displaying an image are provided. The non-display area NDA may be an area in which the driving unit for driving the pixels PXL and a portion of the line unit which connects the pixels PXL with the driving unit are provided. For the sake of convenience, only a pixel PXL is illustrated in FIG. 3, but pixels PXL may be substantially provided in the display area DA of the substrate SUB.

The non-display area NDA may be provided on at least one side of the display area DA. The non-display area NDA may surround the circumference (or edge) of the display area DA. The non-display area NDA may be provided with the line unit connected to the pixels PXL and the driving unit which is electrically connected to the line unit and drives the pixels PXL.

The line unit may electrically connect the driving unit with the pixels PXL. The line unit may be a fan-out line which provides a signal to each pixel PXL and is electrically connected to signal lines, e.g., a scan line, a data line, an emission control line, and the like, which are electrically connected to each pixel PXL. The line unit may be a fan-out line electrically connected to signal lines, e.g., a control line, a sensing line, or the like, which are electrically connected to each pixel PXL, so as to compensate for a change in the electrical characteristics of each pixel PXL in real time.

The substrate SUB may include a transparent insulating material to enable light to be transmitted therethrough. The substrate SUB may be a rigid or flexible substrate.

An area of the substrate SUB may be provided as the display area DA such that the pixels PXL are disposed therein, and the other area of the substrate SUB may be provided as the non-display area NDA. In an example, the substrate SUB may include the display area DA including pixel areas in which the respective pixels PXL are disposed and the non-display area NDA disposed at the periphery of the display area DA (or adjacent to the display area DA).

Each of the pixels PXL may be provided in the display area DA. In an embodiment, the pixels PXL may be arranged in a stripe or PenTile® arrangement structure in the display area DA, but the disclosure is not limited thereto.

Each pixel PXL may include at least one light emitting element LD driven by a corresponding scan signal and a corresponding data signal. The light emitting element LD may have a size to a degree of micro or nano scale, and be connected in parallel to light emitting elements disposed adjacent thereto. However, the disclosure is not limited thereto. The light emitting element LD may form (or constitute) a light source of each pixel PXL.

Each pixel PXL may include at least one light source, e.g., the light emitting element LD shown in FIG. 1A or 2A, which is driven by a predetermined signal (e.g., a scan signal and a data signal) and/or a predetermined power source (e.g., a first driving power source and a second driving power source). However, in the embodiment, the kind of the light emitting element LD which can be used as the light source of the pixel PXL is not limited thereto. The driving unit provides a predetermined signal and a predetermined power source to each pixel PXL through the line unit, and accordingly, the driving of the pixel PXL can be controlled. The driving unit may include a scan driver, an emission driver, a data driver, and a timing controller.

Figure 4A:
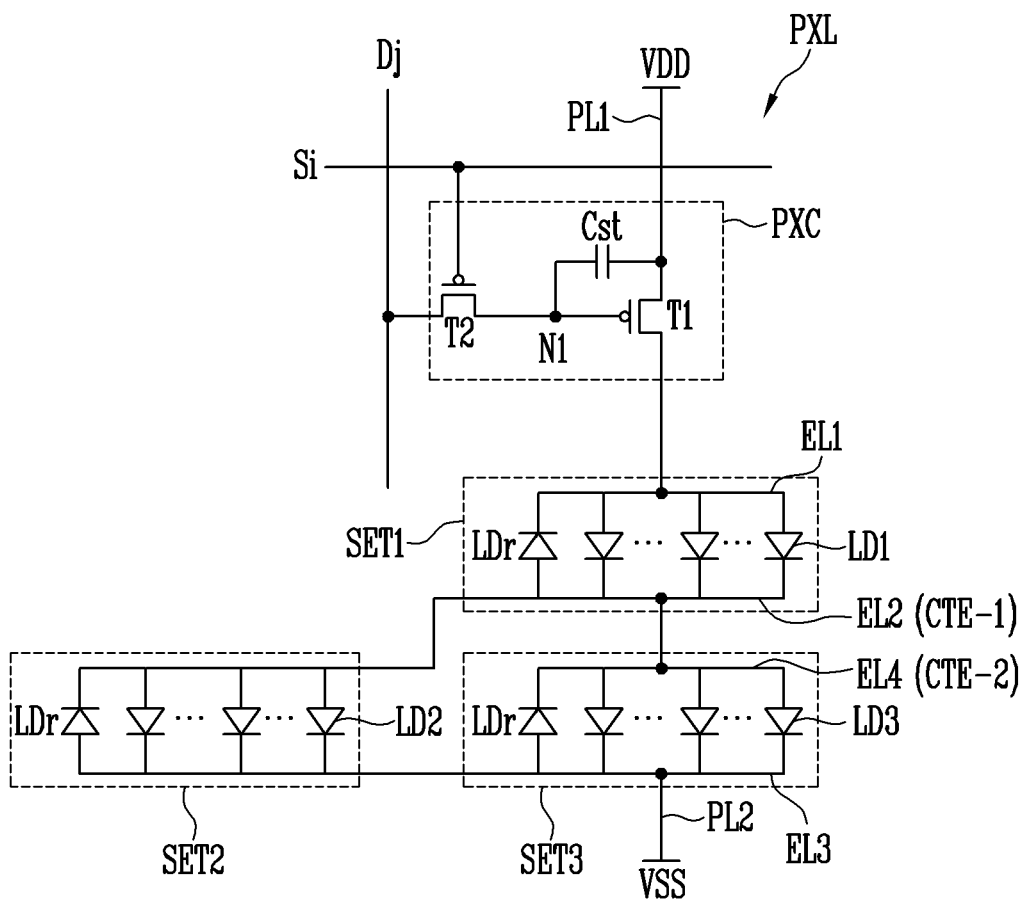
FIGS. 4A, 4B, and 4C are schematic circuit diagrams illustrating various embodiments of an electrical connection relationship between components included in one pixel shown in FIG. 3.
Figure 4B:
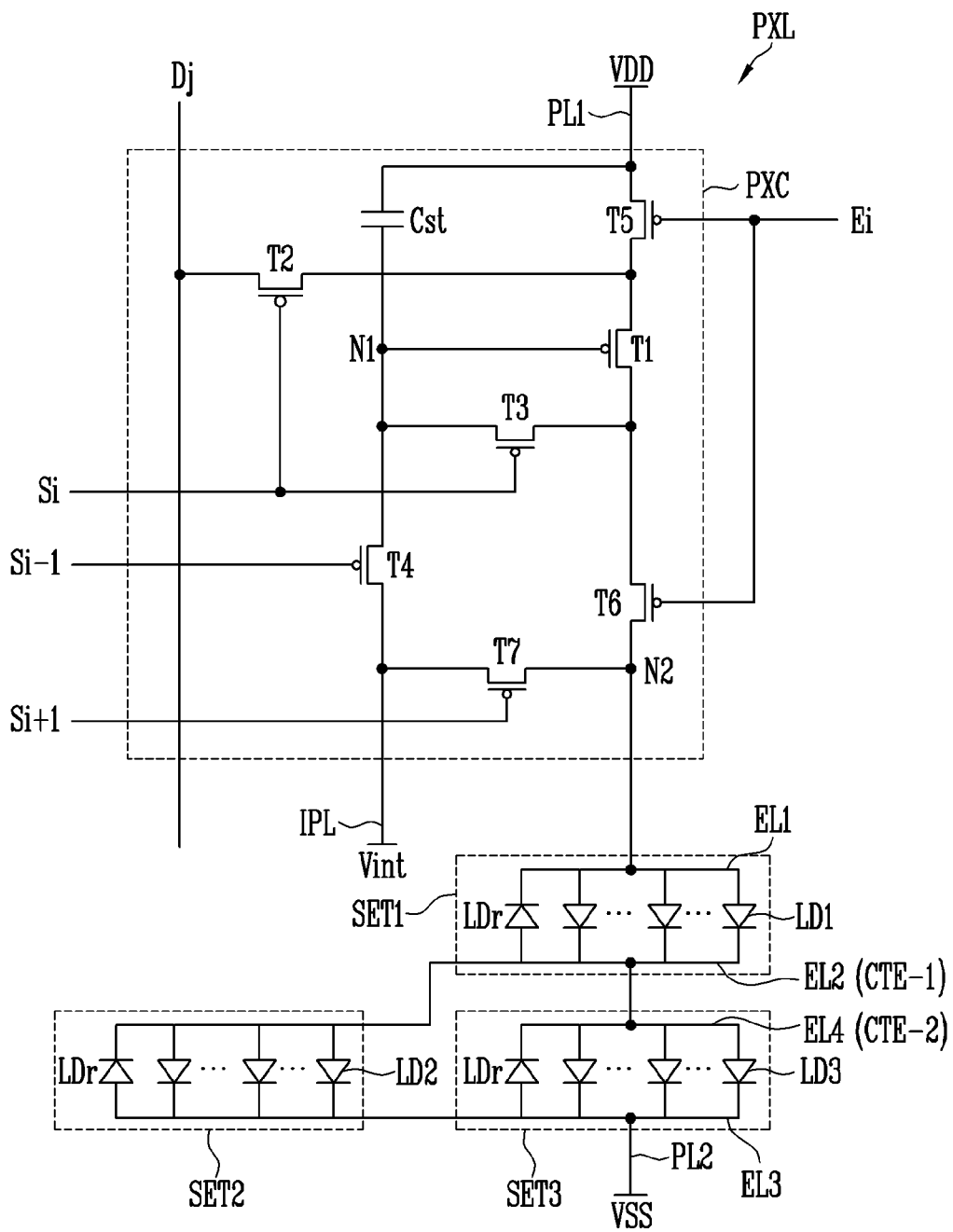
Figure 4C:
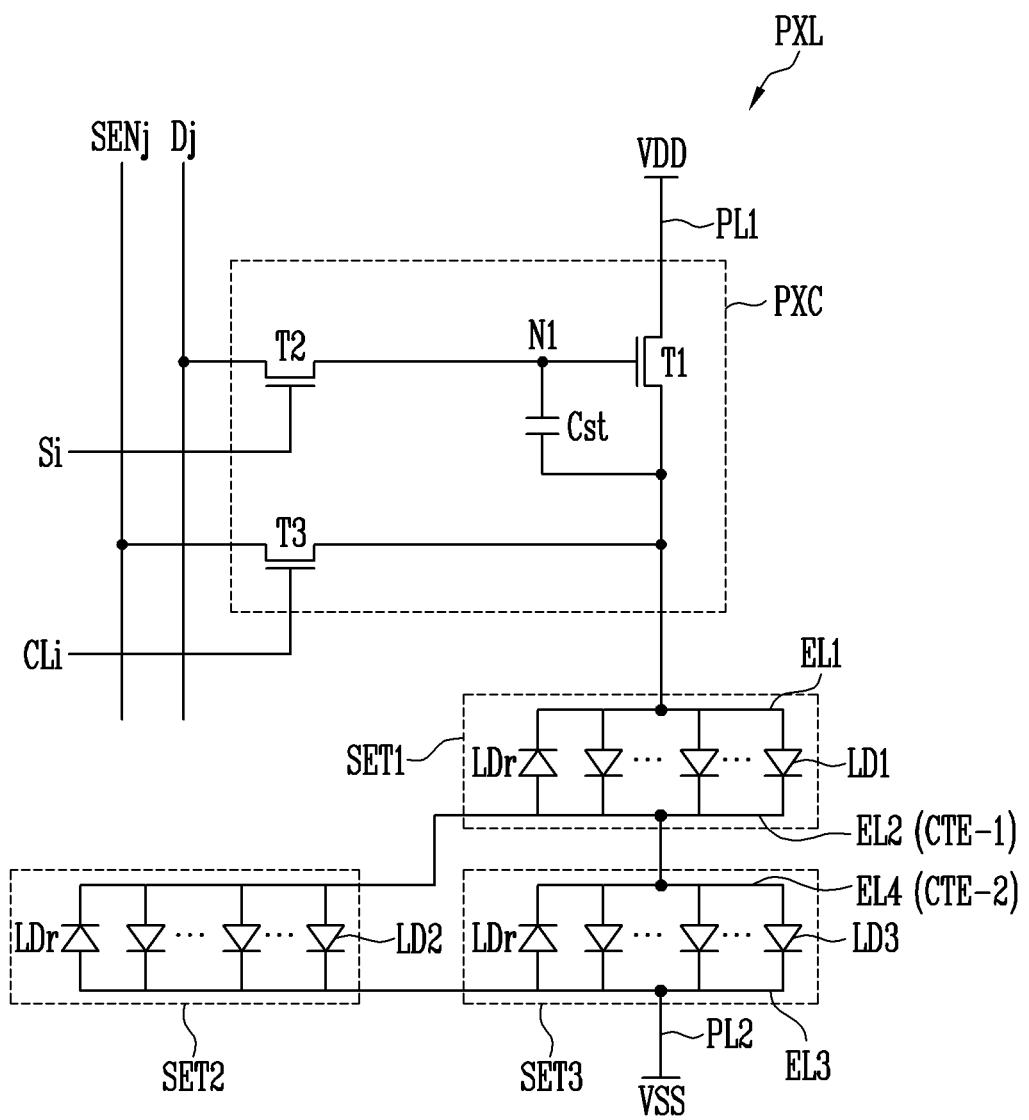

FIGS. 4A, 4B, and 4C are circuit diagrams illustrating various embodiments of an electrical connection relationship between components included in a pixel shown in FIG. 3.

For example, FIGS. 4A, 4B, and 4C illustrate different embodiments of an electrical connection relationship between components included in the pixel PXL applicable to an active display device. However, the kinds of the components included in the pixel PXL to which the embodiments of the disclosure are applicable are not limited thereto.

In FIGS. 4A, 4B, and 4C, the pixel PXL includes not only components included in each of the pixels shown in FIG. 3 but also an area in which the components are provided.

Referring to FIGS. 1A, 1B, 2A, 2B, 3, 4A, 4B, and 4C, a pixel PXL may include a light emitting unit EMU which generates light with a luminance corresponding to a data signal. Also, the pixel PXL may selectively further include a pixel circuit PXC for driving the light emitting unit EMU.

The light emitting unit EMU may include light emitting elements LD electrically connected in parallel between a first power line PL1 to which a voltage of a first driving power source VDD (or a first power voltage) is applied and a second power line PL2 to which a voltage of a second driving power source VSS (or a second power voltage) is applied. For example, the light emitting unit EMU may include a first electrode EL1 (or "first alignment electrode") electrically connected to the first driving power source VDD via the pixel circuit PXC and the first power line PL1, a third electrode EL3 (or "second alignment electrode") electrically connected to the second driving power source VSS through the second power line PL2, and light emitting elements LD electrically connected in parallel in the same direction between the first and third electrodes EL1 and EL3. In an embodiment, the first electrode EL1 may be an anode electrode, and the third electrode EL3 may be a cathode electrode.

Each of the light emitting elements LD included in the light emitting unit EMU may include a first end portion electrically connected to the first driving power source VDD through the first electrode EL1 and a second end portion electrically connected to the second driving power source VSS through the third electrode EL3. The first driving power source VDD and the second driving power source VSS may have different potentials. In an example, the first driving power source VDD may be set as a high-potential power source, and the second driving power source VSS may be set as a low-potential power source.

The light emitting elements LD electrically connected in parallel in the same direction between the first electrode EL1 and the third electrode EL3, to which voltages having different potentials are supplied, may form effective light sources, respectively. The effective light sources may form the light emitting unit EMU of the pixel PXL.

Each of the light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through the light emitting elements LD. Accordingly, the light emitting unit EMU can emit light with a luminance corresponding to the driving current while each light emitting element LD is emitting light with a luminance corresponding to a current flowing therethrough.

In some embodiments, the light emitting unit EMU may further include at least one ineffective light source, e.g., a reverse light emitting element LDr, in addition to the light emitting elements LD forming the respective effective light sources. The reverse light emitting element LDr is electrically connected in parallel together with the light emitting elements LD forming the effective light sources between the first and third electrodes EL1 and EL3, and may be electrically connected between the first and third electrodes EL1 and EL3 in a direction opposite to that in which the light emitting elements LD are connected. Although a predetermined driving voltage (e.g., a forward driving voltage) is applied between the first and third electrodes EL1 and EL3, the reverse light emitting element LDr maintains an inactive state, and accordingly, no current substantially flows through the reverse light emitting element LDr.

The pixel circuit PXC may be electrically connected to a scan line Si and a data line Dj of a corresponding pixel PXL. In an example, in case that assuming that a pixel PXL is disposed on an i-th row (where i is a natural number) and a j-th column (where j is a natural number) of the display area DA, the pixel circuit PXC of the pixel PXL may be electrically connected to an i-th scan line Si and a j-th data line Dj of the display area DA. In some embodiments, the pixel circuit PXC may include first and second transistors T1 and T2 and a storage capacitor Cst. However, the structure of the pixel circuit PXC is not limited to the embodiments shown in FIGS. 4A, 4B, and 4C.

Referring to FIG. 4A, the pixel circuit PXC may include first and second transistors T1 and T2 and a storage capacitor Cst.

A first terminal of the second transistor T2 (switching transistor) may be electrically connected to the j-th data line Dj, and a second terminal of the second transistor T2 may be electrically connected to a first node N1. The first terminal and the second terminal of the second transistor T2 are different terminals. For example, in case that the first terminal is a source electrode, the second terminal may be a drain electrode. A gate electrode of the second transistor T2 may be electrically connected to the i-th scan line Si. The second transistor T2 is turned on in case that a scan signal having a voltage (e.g., a low voltage) at which the second transistor T2 can be turned on is supplied from the i-th scan line Si, to electrically connect the j-th data line Dj with the first node N1. A data signal of a corresponding frame is supplied to the j-th data line Dj. Accordingly, the data signal is transferred to the first node N1. The data signal transferred to the first node N1 is stored in the storage capacitor Cst.

A first terminal of the first transistor T1 (driving transistor) may be electrically connected to the first driving power source VDD, and a second terminal of the first transistor T1 may be electrically connected to the first electrode EL1. A gate electrode of the first transistor T1 may be electrically connected to the first node N1. The first transistor T1 controls an amount of driving current supplied to the light emitting elements LD, corresponding to a voltage of the first node N1.

An electrode of the storage capacitor Cst may be electrically connected to the first driving power source VDD, and another electrode of the storage capacitor Cst may be electrically connected to the first node N1. The storage capacitor Cst stores a voltage corresponding to the data signal supplied to the first node N1 and retains the stored voltage until a data signal of a next frame is supplied.

In FIG. 4A, the pixel circuit PXC illustrated includes the second transistor T2 for transferring a data signal to the inside of the pixel PXL, the storage capacitor Cst for storing the data signal, and the first transistor T1 for supplying a driving current corresponding to the data signal to the light emitting elements LD.

However, the disclosure is not limited thereto, and the structure of the pixel circuit PXC may be variously modified and embodied. In an example, the pixel circuit PXC may further include at least one transistor such as a transistor for compensating for a threshold voltage of the first transistor T1, a transistor for initializing the first node N1, and/or a transistor for controlling an emission time of the light emitting elements LD, or other circuit elements such as a boosting capacitor for boosting the voltage of the first node N1.

Although a case where all the transistors, e.g., the first and second transistors T1 and T2 included in the pixel circuit PXC are implemented with a P-type transistor is illustrated in FIG. 4A, the disclosure is not limited thereto. For example, at least one of the first and second transistors T1 and T2 included in the pixel circuit PXC may be implemented with an N-type transistor.

In some embodiments, the pixel circuit PXC may be further electrically connected to at least another scan line. For example, in case that a pixel PXL is disposed on an i-th row of the display area DA, the pixel circuit PXC of the corresponding pixel PXL may be further electrically connected to an i−1-th scan line Si−1 and/or an i+1-th scan line Si+1 as shown in FIG. 4B. In some embodiments, the pixel circuit PXC may be further electrically connected to a third power source in addition to the first and second driving power sources VDD and VSS. For example, the pixel circuit PXC may also be electrically connected to an initialization power source Vint. The pixel circuit PXC may include first to seventh transistors T1, T2, T3, T4, T5, T6, and T7 and a storage capacitor Cst.

A first terminal, e.g., a source electrode, of the first transistor T1 (driving transistor) may be electrically connected to the first driving power source VDD via the fifth transistor T5, and a second terminal, e.g., a drain electrode, of the first transistor T1 may be electrically connected to a corresponding end portion of each of the light emitting elements LD via the sixth transistor T6. A gate electrode of the first transistor T1 may be electrically connected to a first node N1. The first transistor T1 controls an amount of driving current flowing between the first driving power source VDD and the second driving power source VSS via the light emitting elements LD, corresponding to a voltage of the first node N1.

The second transistor T2 (switching transistor) may be electrically connected between the j-th data line Dj electrically connected to the pixel PXL and the first terminal of the first transistor T1. A gate electrode of the second transistor T2 may be electrically connected to the i-th scan line Si connected to the pixel PXL. The second transistor T2 may be turned on in case that a scan signal having a gate-on voltage (e.g., a low voltage) is supplied from the i-th scan line Si to electrically connect the j-th data line Dj to the first terminal of the first transistor T1. Therefore, in case that the second transistor T2 is turned on, a data signal supplied from the j-th data line Dj is transferred to the first transistor T1.

The third transistor T3 may be electrically connected between the second terminal of the first transistor T1 and the first node N1. A gate electrode of the third transistor T3 may be electrically connected to the i-th scan line Si. The third transistor T3 may be turned on in case that a scan signal having a gate-on voltage is supplied from the i-th scan line Si to electrically connect the second terminal of the first transistor T1 and the first node N1 to each other.

The fourth transistor T4 may be electrically connected between the first node N1 and an initialization power line IPL to which the initialization power source Vint is applied. A gate electrode of the fourth transistor T4 may be electrically connected to a previous scan line, e.g., the i−1-th scan line Si−1. The fourth transistor T4 may be turned on in case that a scan signal having a gate-on voltage is supplied to the i−1-th scan line Si−1 to transfer a voltage of the initialization power source Vint to the first node N1. The initialization power source Vint may have a voltage equal to or smaller than the lowest voltage of the data signal.

The fifth transistor T5 may be electrically connected between the first driving power source VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei and may be turned on in other cases.

The sixth transistor T6 may be electrically connected between the first transistor T1 and the corresponding end portion of each of the light emitting elements LD. A gate electrode of the sixth transistor T6 may be electrically connected to the i-th emission control line Ei. The sixth transistor T6 may be turned off in case that an emission control signal having a gate-off voltage is supplied to the i-th emission control line Ei and may be turned on in other cases.

The seventh transistor T7 may be electrically connected between a second node N2, which is electrically connected to the corresponding end portion of each of the light emitting elements LD, and the initialization power line IPL. A gate electrode of the seventh transistor T7 may be electrically connected to any one of scan lines of a next row, e.g., the i+1-th scan line Si+1. The seventh transistor T7 may be turned on in case that a scan signal having a gate-on voltage is supplied to the i+1-th scan line Si+1 to supply the voltage of the initialization power source Vint to the corresponding end portion of each of the light emitting elements LD.

The storage capacitor Cst may be electrically connected between the first driving power source VDD and the first node N1. The storage capacitor Cst may store a voltage corresponding to a data signal supplied to the first node N1 and a threshold voltage of the first transistor T1 in each frame period.

Although a case where all the transistors, e.g., the first to seventh transistors T1, T2, T3, T4, T5, T6, and T7 included in the pixel circuit PXC are implemented with a P-type transistor is illustrated in FIG. 4B, the disclosure is not limited thereto. For example, at least one of the first to seventh transistors T1, T2, T3, T4, T5, T6, and T7 may be replaced with an N-type transistor.

In an embodiment, the configuration of the pixel circuit PXC is not limited to the embodiments shown in FIGS. 4A and 4B. In an example, the pixel circuit PXC may be configured as the embodiment shown in FIG. 4C.

As shown in FIG. 4C, the pixel circuit PXC may be further connected to a control line CLi and a sensing line SENj. In an example, the pixel circuit PXC may be electrically connected to an i-th control line CLi and a j-th sensing line SENj of the display area DA. The pixel circuit PXC may further include a third transistor T3 in addition to the first and second transistors T1 and T2 shown in FIG. 4A.

The third transistor T3 may be electrically connected between the first transistor T1 and the j-th sensing line SENj. For example, a first terminal of the third transistor T3 may be electrically connected to the first terminal (e.g., the source electrode) of the first transistor T1 electrically connected to the first electrode EL1, and a second terminal of the third transistor T3 may be electrically connected to the j-th sensing line SENj. In case that the j-th sensing line SENj is omitted, the second terminal of the third transistor T3 may be electrically connected to the j-th data line Dj.

In some embodiments, the gate electrode of the third transistor T3 may be electrically connected to the i-th control line CLi. In case that the i-th control line CLi is omitted, the gate electrode of the third transistor T3 may be electrically connected to the i-th scan line Si. The third transistor T3 may be turned on by a control signal having a gate-on voltage (e.g., a high level voltage), which is supplied to the i-th control line CLi during a predetermined sensing period to electrically connect the j-th sensing line SENj with the first transistor T1.

In some embodiments, the sensing period may be a period in which characteristic information (e.g., a threshold voltage of the first transistor T1) of each of the pixels PXL arranged in the display area DA is extracted. During the sensing period, a predetermined reference voltage at which the first transistor T1 can be turned on may be supplied to the first node N1 through the j-th data line Dj and the second transistor T2, or the first transistor T1 may be turned on as each pixel PXL is electrically connected to a current source or the like. The first transistor T1 may be electrically connected to the j-th sensing line SENj as the third transistor T3 is turned on by supplying a control signal having a gate-on voltage to the third transistor T3. Accordingly, characteristic information of each pixel PXL, including the threshold voltage of the first transistor T1, etc., can be extracted through the j-th sensing line SENj. The extracted characteristic information may be used to convert image data such that a characteristic deviation between the pixels PXL is compensated.

Although an embodiment in which all the first to third transistors T1, T2, and T3 are N-type transistors is illustrated in FIG. 4C, the disclosure is not limited thereto. For example, at least one of the first to third transistors T1, T2, and T3 may be replaced with a P-type transistor. Although an embodiment in which the light emitting unit EMU is electrically connected between the pixel circuit PXC and the second driving power source VSS is illustrated in FIG. 4C, the light emitting unit EMU may be electrically connected between the first driving power source VDD and the pixel circuit PXC.

Referring to FIG. 4A, the light emitting unit EMU may include a first stage SET1 (or first sub-light emitting unit) and a second stage SET2 (or second sub-light emitting unit), which are sequentially connected between the first and second driving power sources VDD and VSS, and a third stage SET3 (or third sub-light emitting unit) electrically connected in parallel to the second stage SET2. The light emitting unit EMU may include first, second, third and fourth electrodes EL1, EL2, EL3, and EL4, and each of the first, second, and third stages SET1, SET2, and SET3 may include light emitting elements LD electrically connected in parallel in the same direction between at least two among the first to fourth electrodes EL1 to EL4.

The first stage SET1 may include the first electrode EL1 and the second electrode EL2 (or a first sub-intermediate electrode CTE-1), and may include at least one first light emitting element LD1 electrically connected between the first electrode EL1 and the second electrode EL2 (or the first sub-intermediate electrode CTE-1). The first stage SET1 may include a reverse light emitting element LDr electrically connected in the opposite direction to the first light emitting element LD1 between the first electrode EL1 and the second electrode EL2 (or the first sub-intermediate electrode CTE-1).

The second stage SET2 may include the second electrode EL2 (or the first sub-intermediate electrode CTE-1) and the third electrode EL3, and may include at least one second light emitting element LD2 electrically connected between the second electrode EL2 (or the first sub-intermediate electrode CTE-1) and the third electrode EL3. Also, the second stage SET2 may include a reverse light emitting element LDr electrically connected in the opposite direction to the second light emitting element LD2 between the second electrode EL2 (or the first sub-intermediate electrode CTE-1) and the third electrode EL3.

The third stage SET3 may include the fourth electrode EL4 (or a second sub-intermediate electrode CTE-2) and the third electrode EL3, and may include at least one third light emitting element LD3 electrically connected between the fourth electrode EL4 (or the second sub-intermediate electrode CTE-2) and the third electrode EL3. Also, the third stage SET3 may include a reverse light emitting element LDr electrically connected in the opposite direction to the third light emitting element LD3 between the fourth electrode EL4 (or a second sub-intermediate electrode CTE-2) and the third electrode EL3.

The first sub-intermediate electrode CTE-1 of the first stage SET1 and the second sub-intermediate electrode CTE-2 of the third stage SET3 may be integrally provided to be connected to each other. For example, the first sub-intermediate electrode CTE-1 and the second sub-intermediate electrode CTE-2 may form an intermediate electrode CTE which electrically connects the first stage SET1 with the second stage SET2, which are consecutive. In case that the first sub-intermediate electrode CTE-1 and the second sub-intermediate electrode CTE-2 are integrally provided, the first sub-intermediate electrode CTE-1 and the second sub-intermediate electrode CTE-2 may be different areas of the intermediate electrode CTE.

In the above-described embodiment, the first electrode EL1 may be an anode of a light emitting unit EMU of each pixel PXL, and the third electrode EL3 may be a cathode of the light emitting unit EMU.

As described above, the light emitting unit EMU of the pixel PXL, which includes the stages SET1, SET2, and SET3 (or the light emitting elements LD) electrically connected in a series/parallel hybrid structure, can easily control driving current/voltage conditions to be suitable for specifications of a product to which the light emitting unit EMU is applied.

The light emitting unit EMU of the pixel PXL, which includes the stages SET1, SET2, and SET3 (or the light emitting elements LD) electrically connected in a series/parallel hybrid structure, have a decreased a driving current, as compared with a light emitting unit having a structure in which stages (or light emitting elements LD) are electrically connected only in parallel. The light emitting unit EMU of the pixel PXL, which includes the stages SET1, SET2, and SET3 (or the light emitting elements LD) electrically connected in a series/parallel hybrid structure, can have a decreased driving voltage applied to both ends of the light emitting unit EMU, as compared with a light emitting unit having a structure in which the same number of light emitting elements LD are all connected in series. The light emitting unit EMU of the pixel PXL, which includes the stages SET1, SET2, and SET3 (or the light emitting elements LD) electrically connected in a series/parallel hybrid structure, may include a larger number of light emitting elements LD (or stages SET1, SET2, and SET3) between the same number of electrodes EL1, EL2, EL3, and EL4, as compared with a light emitting unit having a structure in which stages are all connected in series. The light emission efficiency of the light emitting elements LD can be improved, and a ratio of light emitting elements LD which do not emit light due to a failure is relatively decreased even in case that a failure occurs in a specific stage. Accordingly, deterioration of the light emission efficiency of the light emitting elements LD can be reduced.

The structure of a pixel PXL discussed in the disclosure is not limited to the embodiments shown in FIGS. 4A, 4B, and 4C, and the corresponding pixel PXL may have various structures. For example, each pixel PXL may be configured in a passive type light emitting display device, etc. The pixel circuit PXC may be omitted, and both end portions of the light emitting elements LD included in the light emitting unit EMU may be directly connected to the i-th scan line Si, the j-th data line Dj, the first power line PL1 to which the first driving power source VDD is applied, the second power line PL2 to which the second driving power source VSS is applied, and/or a predetermined control line.

Figure 5:
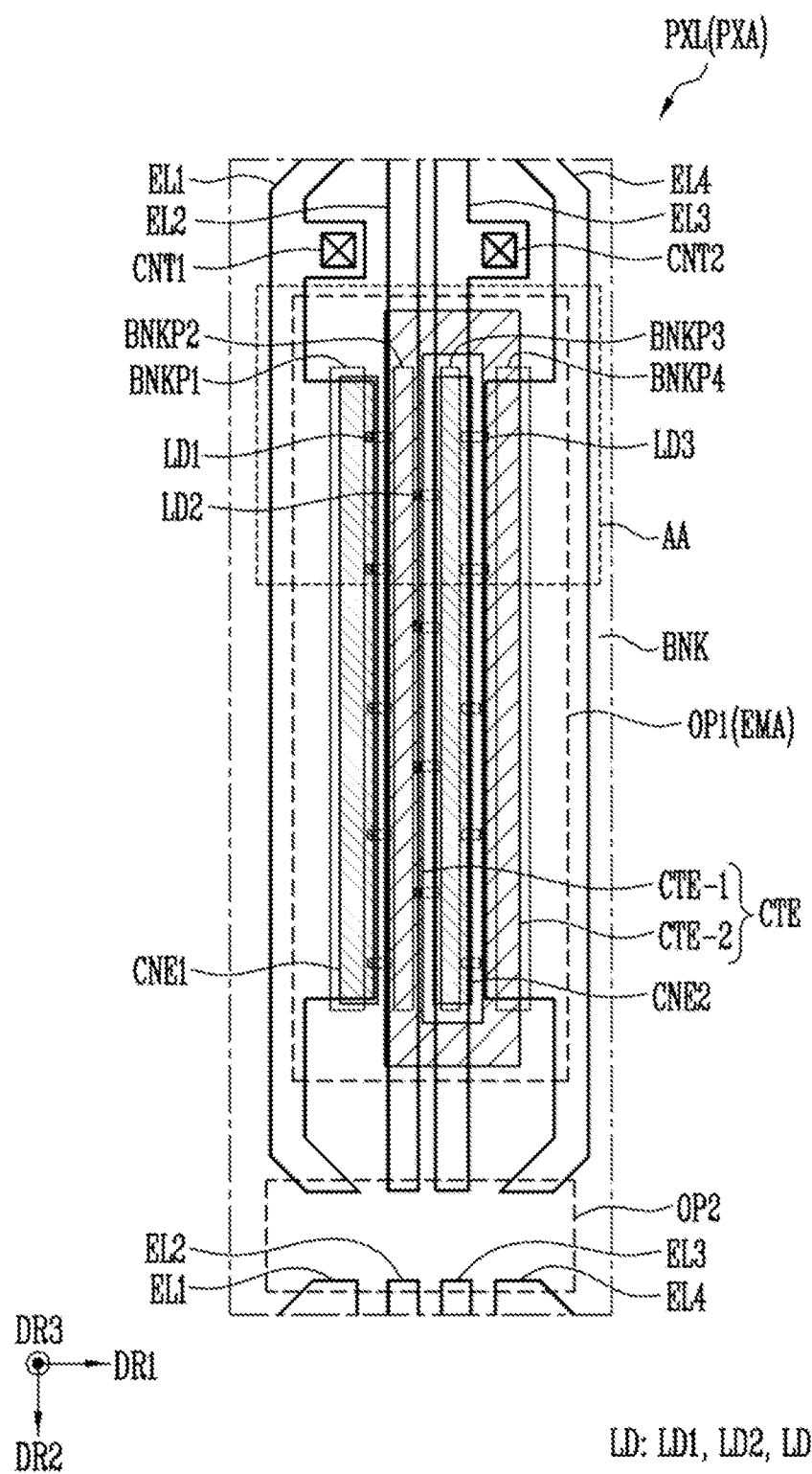
FIG. 5 is a plan view schematically illustrating one pixel among pixels shown in FIG. 3.
Figure 6:
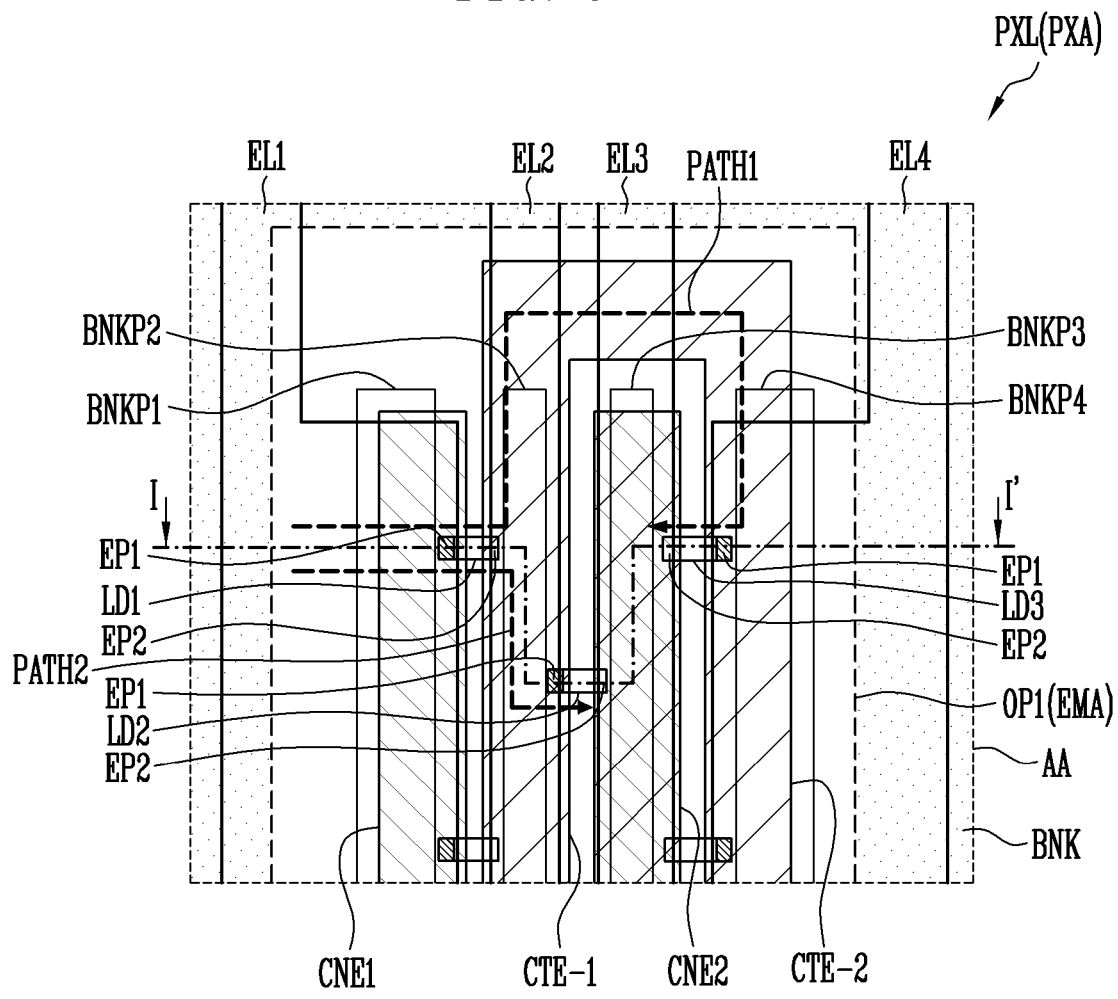
FIG. 6 is a schematic enlarged plan view of a first area shown in FIG. 5.

FIG. 5 is a plan view schematically illustrating a pixel among the pixels shown in FIG. 3. FIG. 6 is a schematic enlarged plan view of a first area AA shown in FIG. 5.

The pixel PXL shown in FIG. 5 may be one of the pixels shown in FIGS. 4A, 4B, and 4C.

In FIG. 5, illustration of transistors connected to light emitting elements and signal lines connected to the transistors is omitted for convenience of description, and the pixel PXL is briefly illustrated based on the light emitting unit EMU described with reference to FIGS. 4A, 4B, and 4C.

Referring to FIGS. 3, 4A, 5, and 6, the pixel PXL may be formed in a pixel area PXA defined on the substrate SUB. The pixel area PXA may include an emission area EMA. In some embodiments, the pixel PXL may include a bank BNK and may be defined by the bank BNK surrounding the emission area EMA. As shown in FIGS. 5 and 6, the bank BNK may include a first opening OP1 and a second opening OP2, which expose a lower configuration (or structure), and the emission area EMA may be defined by the first opening OP1. The second opening OP2 is located in the pixel area PXA to be spaced apart from the first opening OP1 and may be located adjacent to a side (e.g., a lower side or upper side) of the pixel area PXA.

The pixel PXL may include a first electrode EL1, a second electrode EL2, a third electrode EL3, and a fourth electrode EL4, which are physically separated or spaced apart from each other. The first electrode EL1, the second electrode EL2, the third electrode EL3, and the fourth electrode EL4 may respectively correspond to the first electrode EL1, the second electrode EL2, the third electrode EL3, and the fourth electrode EL4, which are described with reference to FIGS. 4A, 4B, and 4C.

The first electrode EL1, the second electrode EL2, the third electrode EL3, and the fourth electrode EL4 may be sequentially arranged in the first direction DR1. Each of the first electrode EL1, the second electrode EL2, the third electrode EL3, and the fourth electrode EL4 may extend in the second direction DR2 intersecting the first direction DR1. End portions of the first electrode EL1, the second electrode EL2, the third electrode EL3, and the fourth electrode EL4 may be located in the second opening OP2 of the bank BNK. As will be described below with reference to FIG. 10, the first electrode EL1, the second electrode EL2, the third electrode EL3, and the fourth electrode EL4 may extend to adjacent pixel areas before light emitting elements LD are supplied onto the substrate SUB in a manufacturing process of the display device, and may be separated from other electrodes (e.g., electrodes of an adjacent pixel adjacent to the pixel PXL in the second direction DR2) in the second opening OP2 after the light emitting elements LD are supplied and arranged in the pixel area PXA. For example, the second opening OP2 of the bank BNK may be provided to perform a separation process on the first electrode EL1, the second electrode EL2, the third electrode EL3, and the fourth electrode EL4.

The first electrode EL1 may include a protrusion part protruding in the first direction DR1 toward the second electrode EL2 in the emission area EMA. The protrusion part of the first electrode EL1 may be provided to maintain a distance between the first electrode EL1 and the second electrode E2 in the emission area EMA. Similarly, the fourth electrode EL4 may include a protrusion part protruding in the first direction DR1 toward the third electrode EL3 in the emission area EMA. The protrusion part of the fourth electrode EL4 may be provided to maintain a distance between the third electrode EL3 and the fourth electrode EL4 in the emission area EMA.

However, the first electrode EL1, the second electrode EL2, the third electrode EL3, and the fourth electrode EL4 are not limited thereto. For example, the shape and/or arrangement of the first electrode EL1, the second electrode EL2, the third electrode EL3, and the fourth electrode EL4 may be variously modified. For example, each of the first electrode EL1 and the fourth electrode EL4 does not include the protrusion part but may have a curved shape. In another example, the third electrode EL3 may extend up to an adjacent pixel in the second direction DR2.

The first electrode EL1 may be electrically connected to the first transistor T1 described with reference to FIG. 4A through a first contact hole CNT1, and the third electrode EL3 may be electrically connected to the second driving power source VSS (or the second power line PL2) described with reference to FIG. 4A through a second contact hole CNT2.

In some embodiments, each of the first electrode EL1, the second electrode EL2, the third electrode EL3, and the fourth electrode EL4 may have a single- or multi-layered structure. In an example, the first electrode EL1, the second electrode EL2, the third electrode EL3, and the fourth electrode EL4 may have a multi-layered structure including a reflective electrode and a conductive capping layer. The reflective electrode may have a single- or multi-layered structure. In an example, the reflective electrode may include at least one reflective conductive layer, and selectively further include at least one transparent conductive layer disposed on or under the reflective conductive layer.

In some embodiments, the pixel PXL may include a first bank pattern BNKP1 overlapping an area of the first electrode EL1, a second bank pattern BNKP2 overlapping an area of the second electrode EL2, a third bank pattern BNKP3 overlapping an area of the third electrode EL3, and a fourth bank pattern BNKP4 overlapping an area of the fourth electrode EL4.

The first bank pattern BNKP1, the second bank pattern BNKP2, the third bank pattern BNKP3, and the fourth bank pattern BNKP4 may be disposed in the emission area EMA to be spaced apart from each other, and may allow the area of each of the first electrode EL1, the second electrode EL2, the third electrode EL3, and the fourth electrode EL4 to protrude in an upward direction. For example, the first electrode EL1 (or the protrusion part of the first electrode EL1) may be disposed on the first bank pattern BNKP1 to protrude in the third direction DR3 (i.e., a thickness direction of the substrate SUB) by means of the first bank pattern BNKP1, the second electrode EL2 may be disposed on the second bank pattern BNKP2 to protrude in the third direction DR3 by means of the second bank pattern BNKP2, the third electrode EL3 may be disposed on the third bank pattern BNKP3 to protrude in the third direction DR3 by means of the third bank pattern BNKP3, and the fourth electrode EL4 (or the protrusion part of the fourth electrode EL4) may be disposed on the fourth bank pattern BNKP4 to protrude in the third direction DR3 by means of the fourth bank pattern BNKP4.

The pixel PXL may include a first light emitting element LD1, a second light emitting element LD2, and a third light emitting element LD3. The pixel PXL may include the reverse light emitting element LDr described with reference to FIG. 4A.

The first light emitting element LD1 may be disposed between the first electrode EL1 and the second electrode EL2. A first end portion EP1 of the first light emitting element LD1 may face the first electrode EL1, and a second end portion EP2 of the first light emitting element LD1 may face the second electrode EL2. In case that there are multiple first light emitting elements LD1, the first light emitting elements LD1 may be electrically connected in parallel to each other between the first electrode EL1 and the second electrode EL2, and may form the first stage SET1 described with reference to FIG. 4A.

Similarly, the second light emitting element LD2 may be disposed between the second electrode EL2 and the third electrode EL3. A first end portion EP1 of the second light emitting element LD2 may face the second electrode EL2, and a second end portion EP2 of the second light emitting element LD2 may face the third electrode EL3. The first end portion EP1 of the first light emitting element LD1 and the first end portion EP1 of the second light emitting element LD2 may include a semiconductor layer of a same type (e.g., the first semiconductor layer 11 described with reference to FIG. 1A). In case that there are multiple second light emitting elements LD2, the second light emitting elements LD2 may be electrically connected in parallel to each other between the second electrode EL2 and the third electrode EL3, and may form the second stage SET2 described with reference to FIG. 4A.

The third light emitting element LD3 may be disposed between the third electrode EL3 and the fourth electrode EL4. A first end portion EP1 of the third light emitting element LD3 may face the fourth electrode EL4, and a second end portion EP2 of the third light emitting element LD3 may face the third electrode EL3. The second end portion EP2 of the second light emitting element LD2 and the second end portion EP2 of the third light emitting element LD3 may include a semiconductor layer of a same type (e.g., the second semiconductor layer 13 described with reference to FIG. 1A), and may face each other with the third electrode EL3 interposed therebetween. In case that there are multiple third light emitting elements LD3, the third light emitting elements LD3 may be electrically connected in parallel to each other between the third electrode EL3 and the fourth electrode EL4, and may form the third stage SET3 described with reference to FIG. 4A.

Although a case where light emitting elements LD are aligned in the first direction DR1 between the first, second, third, and fourth electrodes EL1, EL2, EL3, and EL4 has been illustrated in FIGS. 5 and 6, the alignment direction of the light emitting elements LD is not limited thereto. For example, at least one of the light emitting elements LD may be arranged in an oblique direction.

The first light emitting element LD1, the second light emitting element LD2, and the third light emitting element LD3 may be electrically connected between the first electrode EL1 and the third electrode EL3. For example, the first end portion EP1 of the first light emitting element LD1 may be electrically connected to the first electrode EL1, and the second end portion EP2 of the second light emitting element LD2 and the second end portion EP2 of the third light emitting element LD3 may be electrically connected to the third electrode EL3.

In an embodiment, the first end portion EP1 of the first light emitting element LD1 is not directly disposed on the first electrode EL1, but may be electrically connected to the first electrode EL1 through at least one contact electrode, e.g., a first contact electrode CNE1. Similarly, the second end portion EP2 of the second light emitting element LD2 and the second end portion EP2 of the third light emitting element LD3 are not directly disposed on the third electrode EL3, but may be electrically connected to the third electrode EL3 through at least one contact electrode, e.g., a second contact electrode CNE2. However, the disclosure is not limited thereto. For example, the first end portion EP1 of the first light emitting element LD1 may directly contact the first electrode EL1 to be electrically connected to the first electrode EL1.

In some embodiments, each of the first light emitting element LD1, the second light emitting element LD2, and the third light emitting element LD3 may be a light emitting diode having a size, e.g., to a degree of nano or micro scale, which is manufactured using a material having an inorganic crystalline structure. For example, each of the first light emitting element LD1, the second light emitting element LD2, and the third light emitting element LD3 may be the light emitting element LD shown in at least one of FIGS. 1A to 2B.

In some embodiments, the light emitting elements LD are prepared in a form in which the light emitting elements LD are dispersed in a predetermined solution to be provided in the emission area EMA of the pixel area PXA through an inkjet printing process or a slit coating process. In an example, the light emitting elements LD may be mixed with a volatile solvent to be supplied to the emission area EMA. In case that a predetermined voltage is applied between the first electrode EL1 and the second electrode EL2, between the second electrode EL2 and the third electrode EL3 and between the third electrode EL3 and the fourth electrode EL4, the light emitting elements LD are self-aligned between the first, second, third, and fourth electrodes EL1, EL2, EL3, and EL4, while an electric field is formed between the first electrode EL1 and the second electrode EL2, between the second electrode EL2 and the third electrode EL3 and between the third electrode EL3 and the fourth electrode EL4. After the light emitting elements LD are aligned, the solvent is volatilized or removed through another process, so that the light emitting elements LD can be stably arranged between the first, second, third, and fourth electrodes EL1, EL2, EL3, and EL4.

In some embodiments, the pixel PXL may include the first contact electrode CNE1, the second contact electrode CNE2, and an intermediate electrode CTE.

The first contact electrode CNE1 may be formed on the first end portion EP1 of the first light emitting element LD1 and at least one area of the first electrode EL1, which corresponds thereto, to physically and/or electrically connect the first end portion EP1 of the first light emitting element LD1 with the first electrode EL1.

The second contact electrode CNE2 may be formed on the second end portion EP2 of the second light emitting element LD2, the second end portion EP2 of the third light emitting element LD3, and at least one area of the third electrode EL3, which corresponds thereto, to physically and/or electrically connect the second end portion EP2 of the second light emitting element LD2 and the second end portion EP2 of the third light emitting element LD3 with the third electrode EL3.

The intermediate electrode CTE may include a first sub-intermediate electrode CTE-1 (or first intermediate electrode) and a second sub-intermediate electrode CTE-2 (or second intermediate electrode), which extend in the second direction DR2. The first sub-intermediate electrode CTE-1 may be formed on the second end portion EP2 of the first light emitting element LD1, the first end portion EP1 of the second light emitting element LD2, and at least one area of the second electrode EL2, which corresponds thereto. The intermediate electrode CTE may extend from the first sub-intermediate electrode CTE-1 while detouring the second contact electrode CNE2 or the second light emitting element LD2, and the second sub-intermediate electrode CTE-2 may be formed on the first end portion EP1 of the third light emitting element LD3 and at least one area of the fourth electrode EL4, which corresponds thereto. The intermediate electrode CTE may electrically connect the second end portion EP2 of the first light emitting element LD1, the first end portion EP1 of the second light emitting element LD2, and the first end portion EP1 of the third light emitting element LD3 with each other.

As shown in FIG. 5, the intermediate electrode CTE is spaced apart from the second contact electrode CNE2, and may have a closed loop shape surrounding the second contact electrode CNE2.

Therefore, the second light emitting element LD2 and the third light emitting element LD3 may be electrically connected in parallel to each other through the intermediate electrode CTE between the second electrode EL2 and the third electrode EL3, and be electrically connected in series to the first light emitting element LD1 through the intermediate electrode CTE between the first electrode EL1 and the third electrode EL3.

During each frame period, a driving current may flow along a first path PATH1 and a second path PATH2 in the pixel PXL, and the pixel PXL may emit light with a luminance corresponding to the driving current while the first, second, and third light emitting elements LD1, LD2, and LD3 electrically connected in a forward direction between the first electrode EL1 and the third electrode EL3 of the pixel PXL emit light.

As described with reference to FIGS. 5 and 6, the first, second, and third light emitting elements LD1, LD2, and LD3 may be disposed between the first to fourth electrodes EL1, EL2, EL3, and EL4, and the second light emitting element LD2 and the third light emitting element LD3 may be electrically connected in parallel to each other through the intermediate electrode CTE between the second electrode EL2 and the third electrode EL3, and may be electrically connected in series to the first light emitting element LD1 through the intermediate electrode CTE between the first electrode EL1 and the third electrode EL3. In this manner, the light emitting unit EMU of the pixel PXL may be configured by connecting, in a series/parallel hybrid structure, the first, second, and third light emitting elements LD1, LD2, and LD3 aligned in the pixel area PXA of the pixel PXL. Accordingly, the light emitting unit EMU can be configured in a series/parallel structure including three stages while minimizing an area occupied by alignment electrodes (or while not increasing a number of alignment electrodes), and thus the display device having a high resolution and a fine pitch can be easily implemented.

Figure 7A:
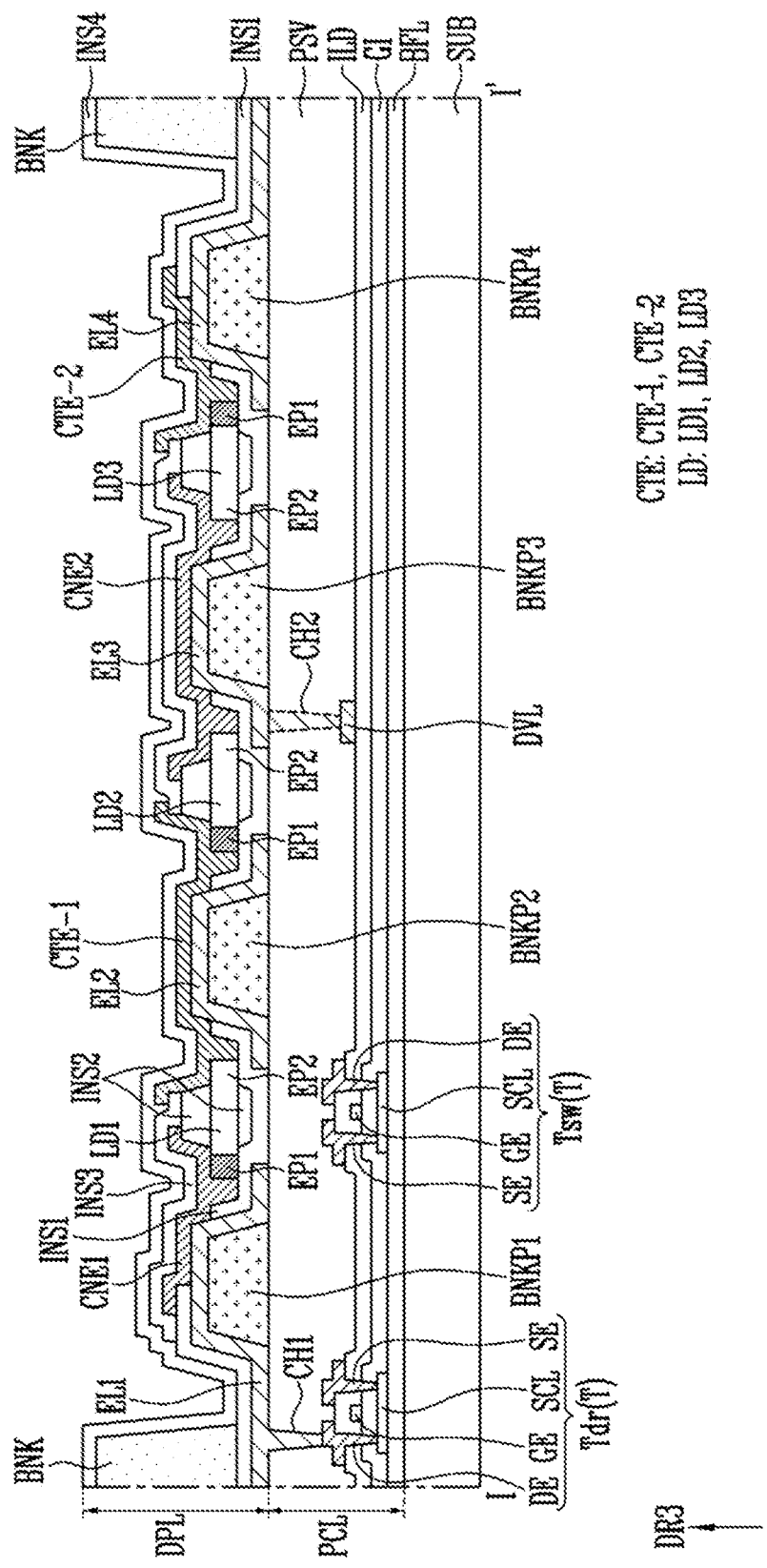
Figure 7C:
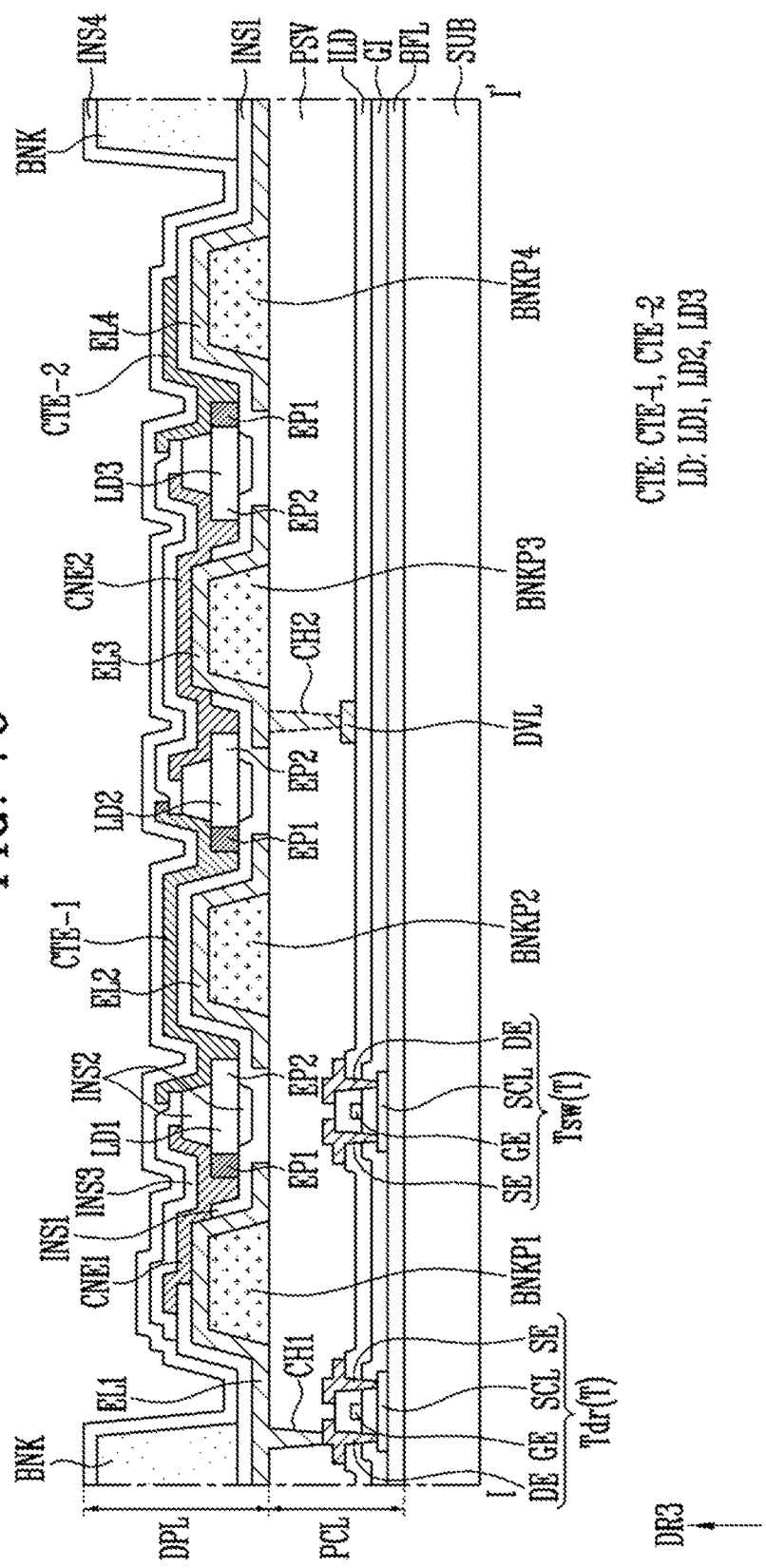

FIGS. 7A, 7B, and 7C are schematic cross-sectional views illustrating various embodiments of the pixel taken along line I-I' shown in FIG. 6.

Referring to FIGS. 3, 5, 6, and 7A, a pixel circuit layer PCL and a display element layer DPL (or light emitting element layer) may be sequentially disposed on the substrate SUB. In some embodiments, the pixel circuit layer PCL and the display element layer DPL may be entirely formed in the display area DA of the display device DD.

The pixel circuit layer PCL may include a buffer layer BFL, a transistor T, and a protective layer PSV. As shown in FIG. 7A, the buffer layer BFL, the transistor T, and the protective layer PSV may be sequentially stacked on the substrate SUB.

The buffer layer BFL may prevent an impurity from being diffused into transistors T. The buffer layer BFL may be an inorganic insulating layer including an inorganic material. The buffer layer BFL may include, for example, at least one of silicon nitride ($SiN_x$), silicon oxide ($SiO_x$), silicon oxynitride (SiON), and metal oxide such as aluminum oxide ($AlO_x$). The buffer layer BFL may be provided as a single layer or a multi-layer including at least two layers. In case that the buffer layer BFL is provided as the multi-layer, the layers may be formed of the same material or different materials. The buffer layer BFL may be omitted according to the material and process conditions of the substrate SUB.

The transistor T may include a driving transistor Tdr for controlling a driving current of the light emitting elements LD and a switching transistor Tsw connected to the driving transistor Tdr. In case that the driving transistor Tdr and the switching transistor Tsw are inclusively designated, each of the transistors or the transistors are referred to as a transistor T or transistors T. The driving transistor Tdr may be the first transistor T1 described with reference to FIG. 4A, and the switching transistor Tsw may be the second transistor T2 described with reference to FIG. 4A.

Each of the driving transistor Tdr and the switching transistor Tsw may include a semiconductor pattern SCL, a gate electrode GE, a first terminal SE, and a second terminal DE. The first terminal SE may be any one of a source electrode and a drain electrode, and the second terminal DE may be the other of the source electrode and the drain electrode. In an example, in case that the first terminal SE is the source electrode, the second terminal DE may be the drain electrode.

The semiconductor pattern SCL may be provided and/or formed on the buffer layer BFL. The semiconductor pattern SCL may include a first contact region contacting the first terminal SE and a second contact region contacting the second terminal DE. A region between the first contact region and the second contact region may be a channel region. The channel region may overlap the gate electrode GE of the corresponding transistor T. The semiconductor pattern SCL may be made of poly-silicon, amorphous silicon, oxide semiconductor, etc. The channel region is a semiconductor pattern not doped with an impurity and may be an intrinsic semiconductor. Each of the first contact region and the second contact region may be a semiconductor pattern doped with the impurity.

A gate insulating layer GI may be provided and/or formed over (or on) the semiconductor pattern SCL. The gate insulating layer GI may be an inorganic insulating layer including an inorganic material. In an example, the gate insulating layer GI may include the same material as the buffer layer BFL or may include at least one selected from the materials forming the buffer layer BFL. In some embodiments, the gate insulating layer GI may be an organic insulating layer including an organic material. The gate insulating layer GI may be provided as a single layer or a multi-layer including at least two layers.

The gate electrode GE may be provided and/or formed on the gate insulating layer GI to correspond to the channel region of the semiconductor pattern SCL. The gate electrode GE may be provided on the gate insulating layer GI to overlap with the channel region of the semiconductor pattern SCL. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or may be formed in a double- or multi-layered structure including molybdenum (Mo), titanium (Ti), copper (Cu), aluminum (Al) or silver (Ag), which is a low-resistance material so as to decrease wiring resistance.

An interlayer insulating layer ILD may be provided and/or formed over (or on) the gate electrode GE. The interlayer insulating layer ILD may include the same material as the gate insulating layer GI or at least one selected from the materials forming the gate insulating layer GI.

The first terminal SE and the second terminal DE may be provided and/or formed on the interlayer insulating layer ILD and may respectively contact the first contact region and the second contact region of the semiconductor pattern SCL through corresponding contact holes sequentially penetrating the gate insulating layer GI and the interlayer insulating layer ILD. Each of the first and second terminals SE and DE may include the same material as the gate electrode GE or include at least one selected from the materials forming the gate electrode GE.

Although it has been described that the first and second terminals SE and DE of each of the driving transistor Tdr and the switching transistor Tsw are separate electrodes electrically connected to the semiconductor pattern SCL through contact holes sequentially penetrating the gate insulating layer GI and the interlayer insulating layer ILD, the disclosure is not limited thereto. In some embodiments, the first terminal SE of each of the driving transistor Tdr and the switching transistor Tsw may be the first contact region adjacent to the channel region of the corresponding semiconductor pattern SCL, and the second terminal DE of each of the driving transistor Tdr and the switching transistor Tsw may be the second contact region adjacent to the channel region of the corresponding semiconductor pattern SCL. The second terminal DE of the driving transistor Tdr may be electrically connected to the light emitting elements LD of the corresponding pixel PXL through a separate connection means such as a bridge electrode.

In an embodiment, the transistors T may be implemented with a low temperature poly-silicon (LTPS) thin film transistor, but the disclosure is not limited thereto. In some embodiments, the transistors T may be implemented with an oxide semiconductor thin film transistor. A case where the transistors T is implemented with a thin film transistor having a top gate structure has been described as an example, but the disclosure is not limited thereto. The structure of the transistors T may be variously modified.

The pixel circuit layer PCL may include a driving voltage line DVL provided and/or formed on the interlayer insulating layer ILD. The driving voltage line DVL may be the second power line PL2 described with reference to FIG. 4A. In an embodiment, it has been described that the driving voltage line DVL and the first and second terminals SE and DE of the driving transistor Tdr are provided on/in the same layer, but the disclosure is not limited thereto. In some embodiments, the driving voltage line DVL and any one conductive layer among conductive layers provided in the pixel circuit layer PCL may be provided on/in the same layer. For example, the position of the driving voltage line DVL in the pixel circuit layer PCL may be variously changed.

The driving voltage line DVL may include a conductive material. In an example, the driving voltage line DVL may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or may be formed in a double- or multi-layered structure including molybdenum (Mo), titanium (Ti), copper (Cu), aluminum (Al) or silver (Ag), which is a low-resistance material so as to decrease wiring resistance. In an example, the driving voltage line DVL may be configured as a double layer in which titanium (Ti)/copper (Cu) are sequentially stacked.

The protective layer PSV may be provided and/or formed over (or on) the transistors T and the driving voltage line DVL.

The protective layer PSV may be provided in a form including an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride (SiON), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, polyphenylene ethers resin, poly-phenylene sulfides resin, and benzocyclobutene resin.

The protective layer PSV may include a first contact hole CH1 exposing the second terminal DE of the driving transistor Tdr and a second contact hole CH2 exposing the driving voltage line DVL.

The display element layer DPL may be provided on the protective layer PSV.

The display element layer DPL may include first to fourth bank patterns BNKP1, BNKP2, BNKP3, and BNKP4, first to fourth electrodes EL1, EL2, EL3, and EL4, a first insulating layer INS1 (or first passivation layer), first to third light emitting elements LD1, LD2, and LD3, a second insulating layer INS2 (or second passivation layer), first and second contact electrodes CNE1 and CNE2, a third insulating layer INS3, an intermediate electrode CTE, and a fourth insulating layer INS4, which are sequentially disposed or formed on the protective layer PSV (or the pixel circuit layer PCL).

The first to fourth bank patterns BNKP1, BNKP2, BNKP3, and BNKP4 may be disposed on the protective layer PSV. The first to fourth bank patterns BNKP1, BNKP2, BNKP3, and BNKP4 may be disposed in the emission area EMA (see FIG. 6) to be spaced apart from each other. The first to fourth bank patterns BNKP1, BNKP2, BNKP3, and BNKP4 may protrude in the third direction DR3 on the pixel circuit layer PCL. In some embodiments, the first to fourth bank patterns BNKP1, BNKP2, BNKP3, and BNKP4 may substantially have the same height, but the disclosure is not limited thereto.

In some embodiments, the first bank pattern BNKP1 may be disposed between the protective layer PSV and the first electrode EL1. The first bank pattern BNKP1 may be disposed adjacent to a first end portion EP1 of the first light emitting element LD1. In an example, a side surface of the first bank pattern BNKP1 may be located adjacent to the first end portion EP1 of the first light emitting element LD1 to face the first end portion EP1 of the first light emitting element LD1.

In some embodiments, the second bank pattern BNKP2 may be disposed between the protective layer PSV and the second electrode EL2. The second bank pattern BNKP2 may be disposed adjacent to a second end portion EP2 of the first light emitting element LD1. In an example, a side surface of the second bank pattern BNKP2 may be located adjacent to the second end portion EP2 of the first light emitting element LD1 to face the second end portion EP2 of the first light emitting element LD1. The second bank pattern BNKP2 may be disposed adjacent to a first end portion EP1 of the second light emitting element LD2. In an example, the other side surface of the second bank pattern BNKP2 may be located adjacent to the first end portion EP1 of the second light emitting element LD2 to face the first end portion EP1 of the second light emitting element LD2.

In some embodiments, the third bank pattern BNKP3 may be disposed between the protective layer PSV and the third electrode EL3. The third bank pattern BNKP3 may be disposed adjacent to a second end portion EP2 of the second light emitting element LD2. In an example, a side surface of the third bank pattern BNKP3 may be disposed adjacent to the second end portion EP2 of the second light emitting element LD2 to face the second end portion EP2 of the second light emitting element LD2. The third bank pattern BNKP3 may be disposed adjacent to a second end portion EP2 of the third light emitting element LD3. In an example, the other side surface of the third bank pattern BNKP3 may be located adjacent to the second end portion EP2 of the third light emitting element LD3 to face the second end portion EP2 of the third light emitting element LD3.

In some embodiments, the fourth bank pattern BNKP4 may be disposed between the protective layer PSV and the fourth electrode EL4. The fourth bank pattern BNKP4 may be disposed adjacent to a first end portion EP1 of the third light emitting element LD3. In an example, a side surface of the fourth bank pattern BNKP4 may be located adjacent to the first end portion EP1 of the third light emitting element LD3 to face the first end portion EP1 of the third light emitting element LD3.

In some embodiments, the first to fourth bank patterns BNKP1, BNKP2, BNKP3, and BNKP4 may have various shapes. In an example, the first to fourth bank patterns BNKP1, BNKP2, BNKP3, and BNKP4 may have a sectional shape of a trapezoid, the width of which decreases toward the top surface thereof as shown in FIG. 7A. Each of the first to fourth bank patterns BNKP1, BNKP2, BNKP3, and BNKP4 may have an inclined surface on at least one side surface. In another example, the first to fourth bank patterns BNKP1, BNKP2, BNKP3, and BNKP4 may have a section of a semicircle or semi-ellipse, the width of which decreases toward the top surface thereof. Each of the first to fourth bank patterns BNKP1, BNKP2, BNKP3, and BNKP4 may have a curved surface on at least one side surface. For example, the shape of the first to fourth bank patterns BNKP1, BNKP2, BNKP3, and BNKP4 is not particularly limited, and may be variously modified. In some embodiments, at least one of the first to fourth bank patterns BNKP1, BNKP2, BNKP3, and BNKP4 may be omitted, or the positions of the first to fourth bank patterns BNKP1, BNKP2, BNKP3, and BNKP4 may be changed.

The first to fourth bank patterns BNKP1, BNKP2, BNKP3, and BNKP4 may include an insulating material including an inorganic material and/or an organic material. In an example, the first to fourth bank patterns BNKP1, BNKP2, BNKP3, and BNKP4 may include at least one inorganic layer including various inorganic insulating materials known in the art, including silicon nitride ($SiN_x$) or silicon oxide ($SiO_x$). As another example, the first to fourth bank patterns BNKP1, BNKP2, BNKP3, and BNKP4 may include at least one organic layer and/or at least one photoresist layer, including various organic insulating materials known in the art, or may be formed as a single- or multi-layered insulator complexly including organic/inorganic materials. In other words, the material constituting the first to fourth bank patterns BNKP1, BNKP2, BNKP3, and BNKP4 may be variously changed.

In an embodiment, the first to fourth bank patterns BNKP1, BNKP2, BNKP3, and BNKP4 may function as a reflective member. In an example, the first to fourth bank patterns BNKP1, BNKP2, BNKP3, and BNKP4 along with the first to fourth electrodes EL1, EL2, EL3, and EL4 provided thereon may function as a reflective member which guides light emitted from each of the light emitting elements LD in a desired direction, thereby improving the light emission efficiency of the pixel PXL.

The first to fourth electrodes EL1, EL2, EL3, and EL4 may be respectively disposed on the first to fourth bank patterns BNKP1, BNKP2, BNKP3, and BNKP4. The first to fourth electrodes EL1, EL2, EL3, and EL4 may be disposed in the emission area EMA (see FIG. 6) to be spaced apart from each other.

In some embodiments, the first to fourth electrodes EL1, EL2, EL3, and EL4 disposed on the first to fourth bank patterns BNKP1, BNKP2, BNKP3, and BNKP4 may have shapes corresponding to at least a portion of those of the first to fourth bank patterns BNKP1, BNKP2, BNKP3, and BNKP4, respectively. For example, the first to fourth electrodes EL1, EL2, EL3, and EL4 may protrude in the third direction DR3 while respectively having inclined surfaces or curved surfaces corresponding to the first to fourth bank patterns BNKP1, BNKP2, BNKP3, and BNKP4.

Each of the first to fourth electrodes EL1, EL2, EL3, and EL4 may be made of a material having a constant reflexibility so as to allow light emitted from each of the light emitting elements LD to advance in an image display direction (or front direction) of the display device. Each of the first to fourth electrodes EL1, EL2, EL3, and EL4 may be made of a conductive material (or substance) having a constant reflexibility. The conductive material (or substance) may include an opaque metal advantageous in reflecting lights emitted from the light emitting elements LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or alloys thereof. In some embodiments, each of the first to fourth electrodes EL1, EL2, EL3, and EL4 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly (3,4-ethylenedioxythiophene) (PEDOT), and the like. In case that each of the first to fourth electrodes EL1, EL2, EL3, and EL4 includes the transparent conductive material, a separate conductive layer may be additionally included, which is made of an opaque metal for reflecting lights emitted from the light emitting elements LD in the image display direction of the display device. However, the material of each of the first to fourth electrodes EL1, EL2, EL3, and EL4 is not limited to the above-described materials.

Each of the first to fourth electrodes EL1, EL2, EL3, and EL4 may be formed as a single layer or a multi-layer. In an example, each of the first to fourth electrodes EL1, EL2, EL3, and EL4 may include at least one reflective electrode layer. Each of the first to fourth electrodes EL1, EL2, EL3, and EL4 may selectively further include at least one of at least one transparent electrode layer disposed on or under the reflective electrode layer and at least one conductive capping layer covering or overlapping the reflective electrode layer and/or the transparent electrode layer.

In some embodiments, the reflective electrode layer of each of the first to fourth electrodes EL1, EL2, EL3, and EL4 may be made of a conductive material having a uniform reflexibility. In an example, the reflective electrode layer may include an opaque metal, but the disclosure is not limited thereto. For example, the reflective electrode layer may be made of various reflective conductive materials. In case that each of the reflective electrode layers includes the material having a uniform reflexibility, the reflective electrode layer may allow light emitted from both ends, i.e., the first and second end portions EP1 and EP2 of each of the light emitting elements LD to further advance in the third direction DR3 (i.e., a direction in which an image is displayed). In case that the first to fourth electrodes EL1, EL2, EL3, and EL4 are disposed to face the first and second end portions EP1 and EP2 of the light emitting elements LD while including the inclined surfaces or curved surfaces corresponding to the first to fourth bank patterns BNKP1, BNKP2, BNKP3, and BNKP4, light emitted from the first and second end portions EP1 and EP2 of each of the light emitting elements LD may be reflected by the first to fourth electrodes EL1, EL2, EL3, and EL4 to further advance in the third direction DR3. Accordingly, the efficiency of light emitted from the light emitting elements LD may be improved.

The transparent electrode layer of each of the first to fourth electrodes EL1, EL2, EL3, and EL4 may include various transparent conductive materials. In an embodiment, each of the first to fourth electrodes EL1, EL2, EL3, and EL4 may be formed as a triple-layer having a stacked structure of ITO/Ag/ITO. As described above, in case that each of the first to fourth electrodes EL1, EL2, EL3, and EL4 is formed as a multi-layer including at least two layers, a voltage drop caused by signal delay (RC delay) can be minimized. Accordingly, a desired voltage can be effectively transferred to the light emitting elements LD.

In case that each of the first to fourth electrodes EL1, EL2, EL3, and EL4 includes the conductive capping layer covering or overlapping the reflective electrode layer and/or the transparent electrode layer, the reflective electrode layer, etc. of each of the first to fourth electrodes EL1, EL2, EL3, and EL4 can be prevented from being damaged in a manufacturing process of the pixel PXL. However, the conductive capping layer may be selectively included in the first to fourth electrodes EL1, EL2, EL3, and EL4. In some embodiments, the conductive capping layer may be omitted. The conductive capping layer may be considered as a component of each of the first to fourth electrodes EL1, EL2, EL3, and EL4, or may be considered as a separate component disposed on the first to fourth electrodes EL1, EL2, EL3, and EL4.

The first insulating layer INS1 may be disposed over (or on) an area of each of the first to fourth electrodes EL1, EL2, EL3, and EL4. For example, the first insulating layer INS1 may be formed to cover or overlap an area of each of the first to fourth electrodes EL1, EL2, EL3, and EL4, and may include an opening exposing another area of each of the first to fourth electrodes EL1, EL2, EL3, and EL4.

In an embodiment, the first insulating layer INS1 may be primarily formed to entirely cover the first to fourth electrodes EL1, EL2, EL3, and EL4. After the light emitting elements LD are supplied and aligned on the first insulating layer INS1, the first insulating layer INS1 may be partially opened to expose the first to fourth electrodes EL1, EL2, EL3, and EL4 at predetermined first and second contact portions as shown in FIG. 7A. As another example, after the light emitting elements LD are supplied and aligned on the first insulating layer INS1, the first insulating layer INS1 may be patterned in the shape of a separate pattern locally disposed under the light emitting elements LD.

For example, the first insulating layer INS1 is interposed between the first and second electrodes EL1 and EL2 and the first light emitting element LD1, between the second and third electrodes EL2 and EL3 and the second light emitting element LD2, and between the third and fourth electrodes EL3 and EL4 and the third light emitting element LD3, and may expose at least one area of each of the first to fourth electrodes EL1, EL2, EL3, and EL4. The first insulating layer INS1 may be formed to cover or overlap the first to fourth electrodes EL1, EL2, EL3, and EL4 after the first to fourth electrodes EL1, EL2, EL3, and EL4 are formed, to prevent the first to fourth electrodes EL1, EL2, EL3, and EL4 from being damaged or to prevent metal from being extracted in a subsequent process. The first insulating layer INS1 may stably support the light emitting elements LD. In some embodiments, the first insulating layer INS1 may be omitted.

In some embodiments, a bank BNK may be disposed or formed on the first insulating layer INS1. In an example, the bank BNK may be formed between the pixel PXL and other pixels to surround the emission area EMA of the pixel PXL to form a pixel defining layer defining the emission area EMA of the pixel PXL. The bank BNK may function as a dam structure which prevents a solution including the light emitting elements LD from being introduced to an emission area EMA of an adjacent pixel PXL or controls a certain amount of solution to be supplied to each emission area EMA, in a process of supplying the light emitting elements LD to the emission area EMA.

The light emitting elements LD may be supplied and aligned in the emission area EMA (see FIG. 6) in which the first insulating layer INS1 is formed. In an example, the light emitting elements LD are supplied to the emission area EMA through an inkjet process or the like, and may be aligned between the first and second electrodes EL1 and EL2, between the second and third electrodes EL2 and EL3, and between the third and fourth electrodes EL3 and EL4 by a predetermined alignment voltage (or alignment signal) applied to the first to fourth electrodes EL1, EL2, EL3, and EL4.

The second insulating layer INS2 may be disposed on the light emitting elements LD, for example, each of the first light emitting element LD1 aligned between the first and second electrodes EL1 and EL2, the second light emitting element LD2 aligned between the second and third electrodes EL2 and EL3, and the third light emitting element LD3 aligned between the third and fourth electrodes EL3 and EL4, and may expose the first and second end portions EP1 and EP2 of each of the light emitting elements LD. For example, the second insulating layer INS2 does not overlap the first and second end portions EP1 and EP2 of each of the light emitting elements LD and may be disposed only partially on an area of each of the light emitting elements LD. The second insulating layer INS2 may be formed as an independent pattern, but the disclosure is not limited thereto. In case that a separation space exists between the first insulating layer INS1 and the light emitting elements LD before the second insulating layer INS2 is formed, the space may be filled by the second insulating layer INS2. Accordingly, the light emitting elements LD can be more stably supported.

The first contact electrode CNE1 may be disposed on the first electrode EL1 and the first end portion EP1 of the first light emitting element LD1. The first contact electrode CNE1 may electrically connect the first electrode EL1 with the first end portion EP1 of the first light emitting element LD1.

The first contact electrode CNE1 may be disposed on an area of the first electrode EL1, which is not overlapped by the first insulating layer INS1 to electrically contact the first electrode EL1. The first contact electrode CNE1 may be disposed on the first end portion EP1 of the first light emitting element LD1 to electrically contact the first end portion EP1 of the first light emitting element LD1, which is adjacent to the first electrode EL1. For example, the first contact electrode CNE1 may be disposed to overlap the first end portion EP1 of the first light emitting element LD1 and at least one area of the first electrode EL1, which corresponds thereto.

Similarly, the second contact electrode CNE2 may be disposed on the third electrode EL3, the second end portion EP2 of the second light emitting element LD2, and the second end portion EP2 of the third light emitting element LD3. The second contact electrode CNE2 may electrically connect the third electrode EL3, the second end portion EP2 of the second light emitting element LD2, and the second end portion EP2 of the third light emitting element LD3 with each other.

The second contact electrode CNE2 may be disposed on an area of the third electrode EL3, which is not overlapped by the first insulating layer INS1 to electrically contact the third electrode EL3. The second contact electrode CNE2 may be disposed on the second end portion EP2 of the second light emitting element LD2 and the second end portion EP2 of the third light emitting element LD3 to electrically contact the second end portion EP2 of the second light emitting element LD2 and the second end portion EP2 of the third light emitting element LD3, which are adjacent to the third electrode EL3. For example, the second contact electrode CNE2 may be disposed to cover the second end portion EP2 of the second light emitting element LD2, the second end portion EP2 of the third light emitting element LD3, and at least one area of the third electrode EL3, which corresponds thereto.

The first contact electrode CNE1 and the second contact electrode CNE2 may be disposed on the same layer as shown in FIG. 7A. The first contact electrode CNE1 and the second contact electrode CNE2 may be formed of the same conductive material through the same process, but the disclosure is not limited thereto.

The third insulating layer INS3 may be disposed on the first contact electrode CNE1 and the second contact electrode CNE2. The third insulating layer INS3 may overlap the first contact electrode CNE1 and the second contact electrode CNE2.

The intermediate electrode CTE may be disposed on the second end portion EP2 of the first light emitting element LD1, the second electrode EL2, the first end portion EP1 of the second light emitting element LD2, the first end portion EP1 of the third light emitting element LD3, and the fourth electrode EL4. As shown in FIG. 7A, a first sub-intermediate electrode CTE-1 may be disposed on the second end portion EP2 of the first light emitting element LD1, the second electrode EL2, and the first end portion EP1 of the second light emitting element LD2, whereas a second sub-intermediate electrode CTE-2 may be disposed on the first end portion EP1 of the third light emitting element LD3 and the fourth electrode EL4.

The first sub-intermediate electrode CTE-1 may electrically connect the second end portion EP2 of the first light emitting element LD1, the second electrode EL2, and the first end portion EP1 of the second light emitting element LD2 with each other. However, the disclosure is not limited thereto. As shown in FIG. 7C, the first sub-intermediate electrode CTE-1 is not connected to the second electrode EL2 and may be electrically disconnected from the second electrode EL2.

The second sub-intermediate electrode CTE-2 may electrically connect the first end portion EP1 of the third light emitting element LD3 with the fourth electrode EL4. However, the disclosure is not limited thereto. As shown in FIG. 7C, the second sub-intermediate electrode CTE-2 is not connected to the fourth electrode EL4 and may be electrically disconnected from the fourth electrode EL4.

The fourth insulating layer INS4 may be disposed over (or on) the intermediate electrode CTE. The fourth insulating layer INS4 may be entirely formed or disposed on the substrate SUB, to cover or overlap the intermediate electrode CTE, the third insulating layer INS3, and the bank BNK.

In some embodiments, each of the first to fourth insulating layers INS1, INS2, INS3, and INS4 may be configured as a single layer or a multi-layer, and may include at least one inorganic insulating material and/or at least one organic insulating material. For example, each of the first to fourth insulating layers INS1, INS2, INS3, and INS4 may include organic/inorganic insulating materials of various kinds known in the art, including silicon nitride ($SiN_x$), and the material forming each of the first to fourth insulating layers INS1, INS2, INS3, and INS4 is not particularly limited. The first to fourth insulating layers INS1, INS2, INS3, and INS4 may include different insulating materials, or at least some of the first to fourth insulating layers INS1, INS2, INS3, and INS4 may include the same insulating material.

In some embodiments, the fourth insulating layer INS4 may include a thin film encapsulation layer including at least one inorganic layer and/or at least one organic layer, but the disclosure is not limited thereto. In some embodiments, at least one overcoat layer (e.g., a layer planarizing a top surface of the display element layer DPL) may be further disposed on the fourth insulating layer INS4.

Although a case where the intermediate electrode CTE is disposed on a layer different from that of the first contact electrode CNE1 and the second contact electrode CNE2 is illustrated in FIG. 7A, the intermediate electrode CTE is not limited thereto. In another embodiment, the intermediate electrode CTE, the first contact electrode CNE1, and the second contact electrode CNE2 may be disposed on the same layer. As shown in FIG. 7B, the intermediate electrode CTE, the first contact electrode CNE1, and the second contact electrode CNE2 may be disposed on the same layer. The third insulating layer INS3 described with reference to FIG. 7A may be removed, and the manufacturing process of the display device DD (see FIG. 3) can be simplified.

Figure 8:
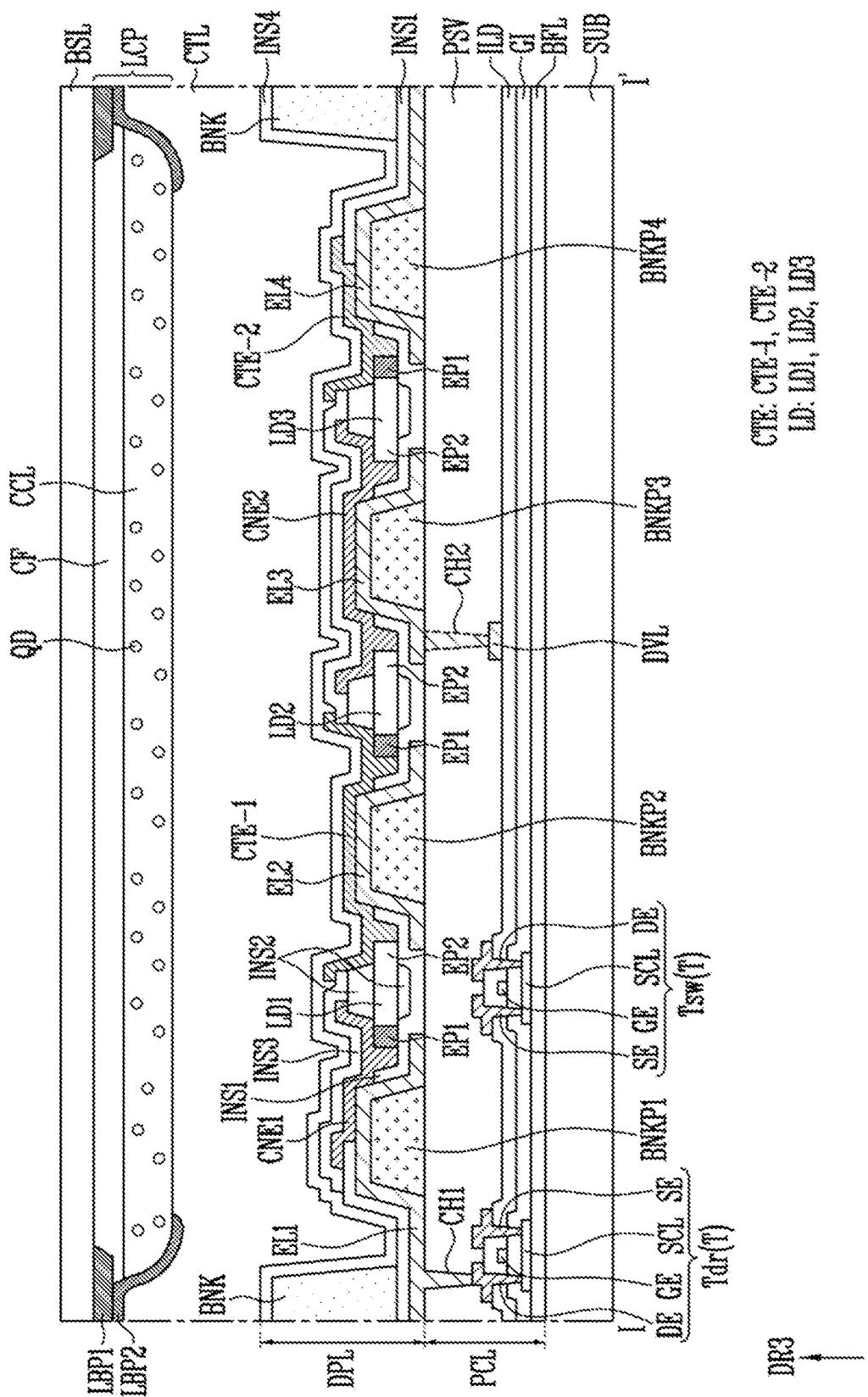
FIG. 8 is a schematic cross-sectional view illustrating another embodiment of the pixel taken along the line I-I' shown in FIG. 6.

FIG. 8 is a schematic cross-sectional view illustrating another embodiment of the pixel taken along the line I-I' shown in FIG. 6.

Referring to FIGS. 5, 6, 7A, and 8, an upper substrate may be further disposed over the third insulating layer INS3.

The upper substrate may be disposed on the display element layer DPL to cover or overlap the display area DA in which the pixels PXL are disposed. The upper substrate may form an encapsulation substrate (or thin film encapsulation layer) and/or a window member of the display device. An intermediate layer CTL may be provided between the upper substrate and the display element layer DPL. The intermediate layer CTL may be a transparent adhesive layer (or cohesive layer), e.g., an optically clear adhesive layer for reinforcing adhesion between the display element layer DPL and the upper substrate, but the disclosure is not limited thereto.

The upper substrate may include a base layer BSL and a light conversion pattern layer LCP.

The base layer BSL may be a rigid or flexible substrate, and the material or property of the base layer BSL is not particularly limited. The base layer BSL may be made of the same material as the substrate SUB or may be made of a material different from that of the substrate SUB.

The light conversion pattern layer LCP may be disposed on the base layer BSL to face the pixels PXL of the substrate SUB. The light conversion pattern layer LCP may include a color conversion layer CCL and a color filter CF, which correspond to a predetermined color.

The color conversion layer CCL may include color conversion particles QD corresponding to a specific color. The color filter CF may allow light of the specific color to be selectively transmitted therethrough. A color conversion layer CCL may be disposed on a surface of the base layer BSL to face a pixel PXL (or a sub-pixel) and may include color conversion particles QD for converting light of a color, which is emitted from light emitting elements LD disposed in the pixel PXL, into light of a specific color. For example, in case that the pixel PXL is a red pixel, the color conversion layer CCL may include color conversion particles QD of a red quantum dot for converting light emitted from the light emitting elements LD into light of red. In another example, in case that the pixel PXL is a green pixel, the color conversion layer CCL may include color conversion particles QD of a green quantum dot for converting light emitted from the light emitting elements LD into light of green. In still another example, in case that the pixel PXL is a blue pixel, the color conversion layer CCL may include color conversion particles QD of a blue quantum dot for converting light emitted from the light emitting elements LD into light of blue.

The color filter CF may be disposed between the color conversion layer CCL and the base layer BSL and may include a color filter material for allowing light of a specific color, which is converted by color conversion layer CCL to be selectively transmitted therethrough. The color filter CF may include a red color filter, a green color filter, and a blue color filter.

A first light blocking pattern LBP1 may be disposed between the color filter CF corresponding to the pixel PXL and a color filter (not shown) corresponding to a pixel adjacent to the pixel PXL. The first light blocking pattern LBP1 may be provided on the base layer BSL to overlap a bank BNK provided in the pixel area PXA of a corresponding pixel PXL. In some embodiments, a second light blocking pattern LBP2 may be disposed on the first light blocking pattern LBP1. The first light blocking pattern LBP1 and the second light blocking pattern LBP2 may include the same material. In an example, the first light blocking pattern LBP1 and the second light blocking pattern LBP2 may correspond to a black matrix.

Figure 9A:
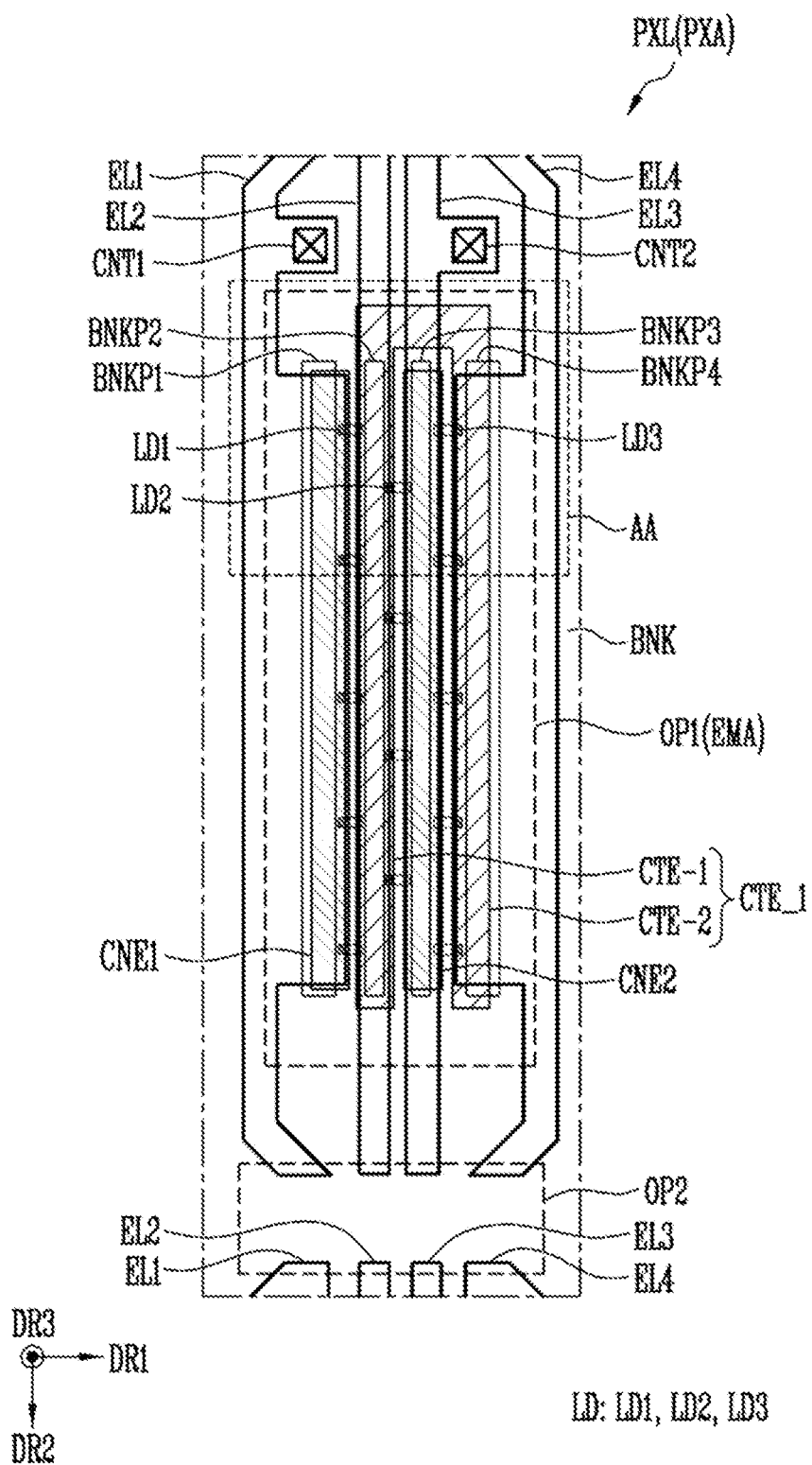
FIGS. 9A and 9B are plan views schematically illustrating other embodiments of the pixel shown in FIG. 5.
Figure 9B:
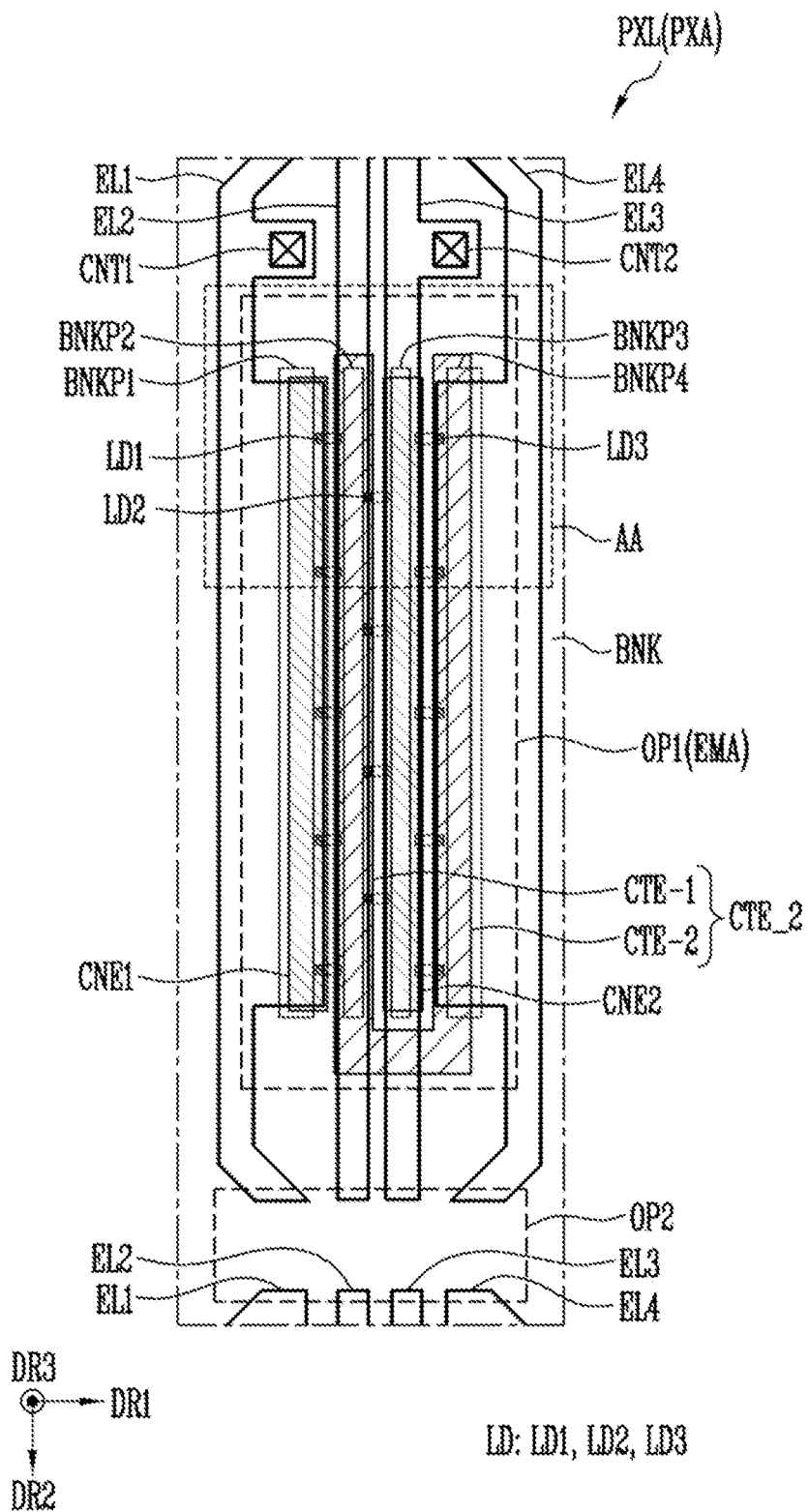

FIGS. 9A and 9B are schematic plan views illustrating other embodiments of the pixel shown in FIG. 5. A pixel PXL corresponding to FIG. 5 is illustrated in FIGS. 9A and 9B.

Referring to FIGS. 5, 6, 9A, and 9B, a pixel PXL shown in each of FIGS. 9A and 9B may be substantially identical or similar to the pixel PXL shown in FIG. 5, except for intermediate electrodes CTE_1 and CTE_2. Therefore, repetitive descriptions will be omitted.

As shown in FIG. 9A, the intermediate electrode CTE_1 may extend from the first sub-intermediate electrode CTE-1 (or the second electrode EL2) to the second sub-intermediate electrode CTE-2 (or the fourth electrode EL4) while being adjacent to a first end of the second contact electrode CNE2, and may include an open space while being adjacent to a second end of the second contact electrode CNE2.

As another example, as shown in FIG. 9B, the intermediate electrode CTE_2 may extend from the first sub-intermediate electrode CTE-1 (or the second electrode EL2) to the second sub-intermediate electrode CTE-2 (or the fourth electrode EL4) while being adjacent to the second end of the second contact electrode CNE2, and may include an open space while being adjacent to the first end of the second contact electrode CNE2.

For example, in case that the intermediate electrode CTE includes a portion extending between the second electrode EL2 and the fourth electrode EL4, the position of the extending portion may be variously modified.

Figure 10:
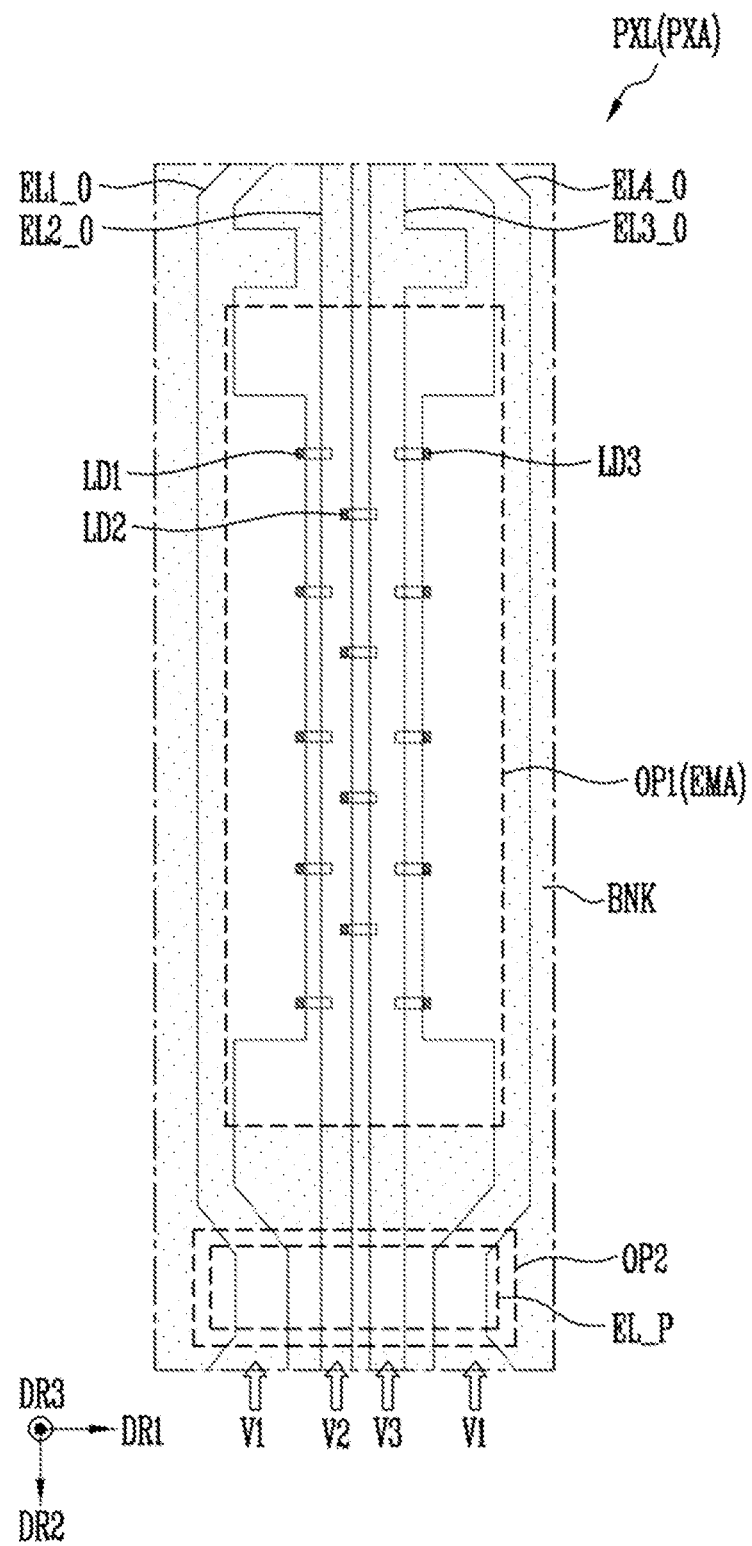
FIG. 10 is a plan view schematically illustrating a method of aligning light emitting elements in the pixel shown in FIG. 5.

FIG. 10 is a schematic plan view illustrating a method of aligning light emitting elements in the pixel shown in FIG. 5.

Referring to FIGS. 3, 5, and 10, first to fourth alignment electrodes EL1_0, EL2_0, EL3_0, and EL4_0 (or mother electrodes) may be disposed or formed in the pixel area PXA of the substrate SUB, the bank BNK defining the emission area EMA may be disposed on the first to fourth alignment electrodes EL1_0, EL2_0, EL3_0, and EL4_0, and the light emitting elements LD may be supplied in the emission area EMA (or the first opening OP1 of the bank BNK).

The first to fourth alignment electrodes EL1_0, EL2_0, EL3_0, and EL4_0 may extend in the second direction DR2, and may be disposed to be spaced apart from each other in the first direction DR1. The first to fourth alignment electrodes EL1_0, EL2_0, EL3_0, and EL4_0 may extend to another pixel area. For example, the first to fourth alignment electrodes EL1_0, EL2_0, EL3_0, and EL4_0 may be disposed to intersect the second opening OP2 of the bank BNK. The first to fourth alignment electrodes EL1_0, EL2_0, EL3_0, and EL4_0 may be electrodes before the electrodes EL1, EL2, EL3, and EL4 described with reference to FIG. 5 are separated from other electrodes (e.g., electrodes of an adjacent pixel).

After the light emitting elements LD are supplied, a predetermined voltage may be applied to the first to fourth alignment electrodes EL1_0, EL2_0, EL3_0, and EL4_0.

For example, a first voltage V1 may be applied to the first alignment electrode EL1_0 and the fourth alignment electrode EL4_0, a second voltage V2 may be applied to the second alignment electrode EL2_0, and a third voltage V3 may be applied to the third alignment electrode EL3_0. The first voltage V1 may be higher than the second voltage V2, and the second voltage V2 may be higher than the third voltage V3. For example, the first voltage V1 may be an AC voltage of about 50V, the second voltage V2 may be an AC voltage of about 20V, and the third voltage V3 may be about a ground voltage.

An electric field may be formed between the first alignment electrode EL1_0 and the second alignment electrode EL2_0 by an AC voltage applied between the first alignment electrode EL1_0 and the second alignment electrode EL2_0, and the first light emitting element LD1 may be self-aligned between the first alignment electrode EL1_0 and the second alignment electrode EL2_0. Similarly, an electric field may be formed between the second alignment electrode EL2_0 and the third alignment electrode EL3_0 by an AC voltage applied between the second alignment electrode EL2_0 and the third alignment electrode EL3_0, and the second light emitting element LD2 may be self-aligned between the second alignment electrode EL2_0 and the third alignment electrode EL3_0. An electric field may be formed between the fourth alignment electrode EL4_0 and the third alignment electrode EL3_0 by an AC voltage applied between the fourth alignment electrode EL4_0 and the third alignment electrode EL3_0, and the third light emitting element LD3 may be self-aligned between the fourth alignment electrode EL4_0 and the third alignment electrode EL3_0.

After the alignment of the light emitting elements LD is completed, the first to fourth alignment electrodes EL1_0, EL2_0, EL3_0, and EL4_0 may be cut or separated from each other in the second opening OP2 of the bank BNK. For example, a portion EL_P of the first to fourth alignment electrodes EL1_0, EL2_0, EL3_0, and EL4_0 extending to another pixel area is cut or removed, so that the first to fourth electrodes EL1, EL2, EL3, and EL4 described with reference to FIG. 5 can be formed.

As described with reference to FIG. 10, the first voltage V1, the second voltage V2 (i.e., an intermediate voltage between the first voltage V1 and the third voltage V3), the third voltage V3, and the first voltage V1 are respectively applied to the first alignment electrode EL1_0, the second alignment electrode EL2_0, the third alignment electrode EL3_0, and the fourth alignment electrode EL4_0, so that the light emitting elements LD can be aligned in the series/parallel hybrid structure.

Figure 11:
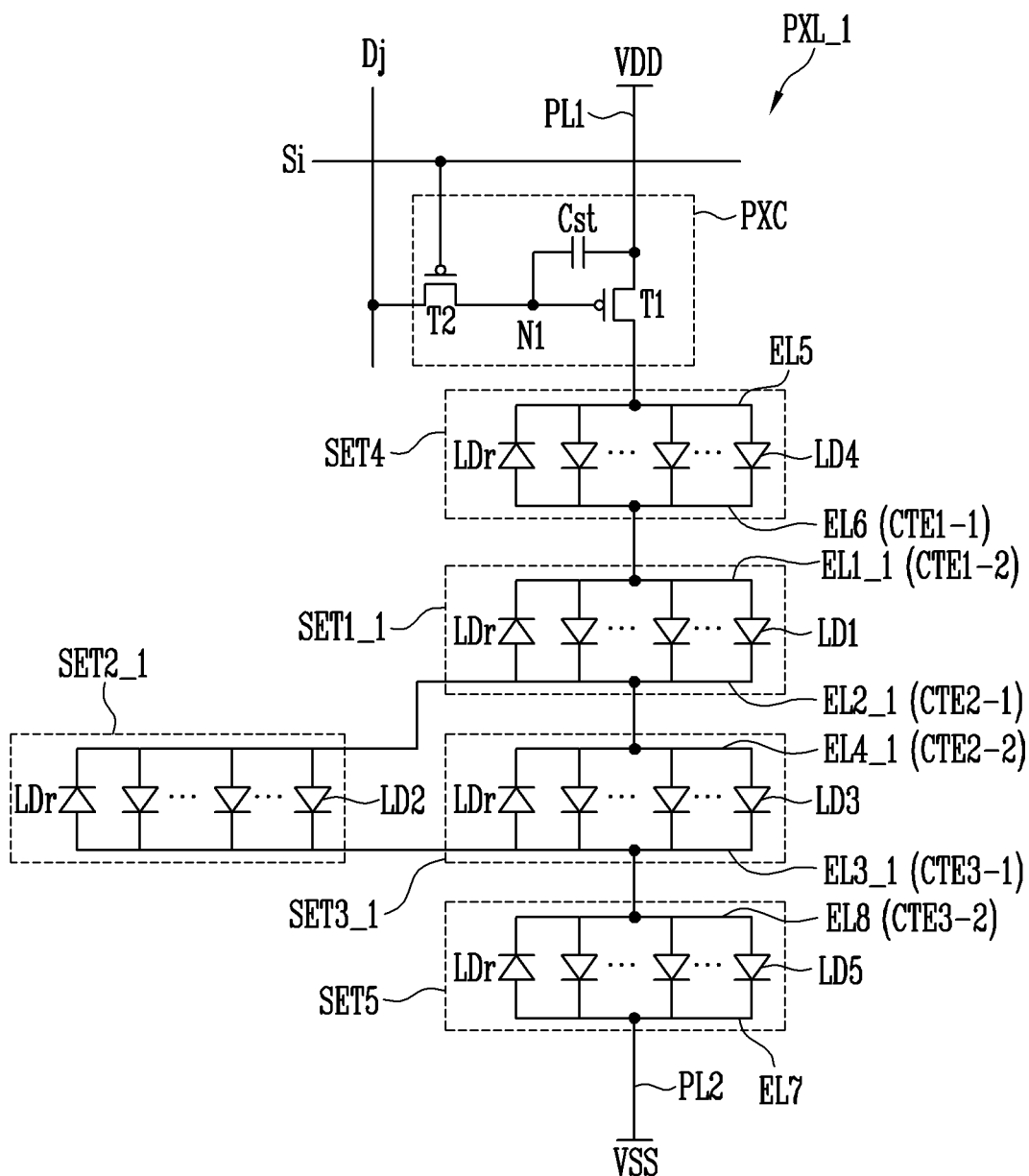
FIG. 11 is a schematic circuit diagram illustrating another embodiment of the electrical connection relationship between the components included in the one pixel shown in FIG. 3.

FIG. 11 is a schematic circuit diagram illustrating another embodiment of the electrical connection relationship between the components included in the pixel shown in FIG. 3. A circuit diagram corresponding to FIG. 4A is illustrated in FIG. 11.

Referring to FIGS. 4A and 11, a pixel PXL_1 may include a light emitting unit EMU_1 and a pixel circuit PXC. The pixel circuit PXC is substantially identical to the pixel circuit PXC described with reference to FIG. 4A, and therefore, repetitive descriptions will be omitted.

The light emitting unit EMU_1 may include light emitting elements LD electrically connected in series/parallel between the first power line PL1, to which the voltage of the first driving power source VDD (or the first power voltage) is applied, and the second power line PL2, to which the voltage of the second driving power source VSS (or the second power voltage) is applied.

The light emitting unit EMU_1 may include a fourth stage SET4 (or fourth sub-light emitting unit), a first stage SET1_1 (or first sub-light emitting unit), a third stage SET3_1 (or third sub-light emitting unit), and a fifth stage SET5, which are sequentially connected between the first and second driving power sources VDD and VSS, and may include a second stage SET2_1 (or second sub-light emitting unit) connected in parallel to the third stage SET3_1. The light emitting unit EMU_1 may include first to eighth electrodes EL1_1, EL2_1, EL3_1, EL4_1, EL5, EL6, EL7, and EL8, and each of the first to fifth stages SET1 to SET5 may include light emitting elements LD connected in parallel in the same direction between two electrodes among the first to eighth electrodes EL1_1, EL2_1, EL3_1, EL4_1, EL5, EL6, EL7, and EL8.

The first stage SET1_1, the second stage SET2_1, and the third stage SET3_1 may be substantially identical or similar to the first stage SET1, the second stage SET2, and the third stage SET3, respectively, which are described with reference to FIG. 4A.

The first stage SET1_1 may include the first electrode EL1_1 (or a 1-2-th intermediate electrode CTE1-2) and the second electrode EL2_1 (or a 2-1-th intermediate electrode CTE2-1), and may include at least one first light emitting element LD1 electrically connected between the first electrode EL1_1 (or the 1-2-th intermediate electrode CTE1-2) and the second electrode EL2_1 (or the 2-1-th intermediate electrode CTE2-1).

The second stage SET2_1 may include the second electrode EL2_1 (or the 2-1-th intermediate electrode CTE2-1) and the third electrode EL3_1 (or a 3-1-th intermediate electrode CTE3-1), and may include at least one second light emitting element LD2 connected between the second electrode EL2_1 (or the 2-1-th intermediate electrode CTE2-1) and the third electrode EL3_1 (or the 3-1-th intermediate electrode CTE3-1).

The third stage SET3_1 may include the fourth electrode EL4_1 (or a 2-2-th intermediate electrode CTE2-2) and the third electrode EL3_1 (or the 3-1-th intermediate electrode CTE3-1), and may include at least one third light emitting element LD3 connected between the fourth electrode EL4_1 (or the 2-2-th intermediate electrode CTE2-2) and the third electrode EL3_1 (or the 3-1-th intermediate electrode CTE3-1).

The fourth stage SET4 may include the fifth electrode EL5 and the sixth electrode EL6 (or a 1-1-th intermediate electrode CTE1-1), and include at least one fourth light emitting element LD4 connected between the fifth electrode EL5 and the sixth electrode EL6 (or the 1-1-th intermediate electrode CTE1-1).

The fifth stage SET5 may include the eighth electrode EL8 (or a 3-2-th intermediate electrode CTE3-2) and the seventh electrode EL7, and include at least one fifth light emitting element LD5 connected between the eighth electrode EL8 (or the 3-2-th intermediate electrode CTE3-2) and the seventh electrode EL7.

The 1-1-th intermediate electrode CTE1-1 of the fourth stage SET4 and the 1-2-th intermediate electrode CTE1-2 of the first stage SET1_1 may be integrally provided to be connected to each other. For example, the 1-1-th intermediate electrode CTE1-1 and the 1-2-th intermediate electrode CTE1-2 may form a first intermediate electrode CTE1 which electrically connects the fourth stage SET4 and the first stage SET1_1 with each other, which are consecutive. In case that the 1-1-th intermediate electrode CTE1-1 and the 1-2-th intermediate electrode CTE1-2 are integrally provided, the 1-1-th intermediate electrode CTE1-1 and the 1-2-th intermediate electrode CTE1-2 may be different areas of the first intermediate electrode CTE1.

Similarly, the 2-1-th intermediate electrode CTE2-1 of the first stage SET1_1 and the 2-2-th intermediate electrode CTE2-2 of the third stage SET3_1 may be integrally provided to be connected to each other. For example, the 2-1-th intermediate electrode CTE2-1 and the 2-2-th intermediate electrode CTE2-2 may form a second intermediate electrode CTE2 which electrically connects the first stage SET1_1 and the third stage SET3_1 with each other, which are consecutive.

Similarly, the 3-1-th intermediate electrode CTE3-1 of the third stage SET3_1 and the 3-2-th intermediate electrode CTE3-2 of the fifth stage SET5 may be integrally provided to be connected to each other. For example, the 3-1-th intermediate electrode CTE3-1 and the 3-2-th intermediate electrode CTE3-2 may form a third intermediate electrode CTE3 which electrically connects the third stage SET3_1 with the fifth stage SET5.

In the above-described embodiment, the fifth electrode EL5 may be an anode electrode of the light emitting unit EMU_1 of the pixel PXL_1, and the seventh electrode EL7 may be a cathode electrode of the light emitting unit EMU_1.

As described above, the light emitting unit EMU_1 of the pixel PXL_1, which includes the stages SET1_1, SET2_1, SET3_1, SET4, and SET5 (or the light emitting unit EMU_1 of the pixel PXL_1 including the light emitting elements LD) connected in a series/parallel hybrid structure, can easily control driving current/voltage conditions to be suitable for specifications of a product to which the light emitting unit EMU_1 is applied.

The light emitting unit EMU_1 of the pixel PXL_1, which includes the stages SET1_1, SET2_1, SET3_1, SET4, and SET5 (or the light emitting unit EMU_1 of the pixel PXL_1 including the light emitting elements LD) connected in a series/parallel hybrid structure, can decrease a driving current, as compared with a light emitting unit having a structure in which stages (or light emitting elements LD) are connected only in parallel. The light emitting unit EMU_1 of the pixel PXL_1, which includes the stages SET1_1, SET2_1, SET3_1, SET4, and SET5 (or the light emitting unit EMU_1 of the pixel PXL_1 including the light emitting elements LD) connected in a series/parallel hybrid structure, can decrease a driving current applied to both ends of the light emitting unit EMU_1, as compared with a light emitting unit having a structure in which the same number of light emitting elements LD are all connected in series. The emitting unit EMU_1 of the pixel PXL_1, which includes the stages SET1_1, SET2_1, SET3_1, SET4, and SET5 (or the light emitting unit EMU_1 of the pixel PXL_1 including the light emitting elements LD) connected in a series/parallel hybrid structure, can include a larger number of light emitting elements LD (or the stages SET1_1, SET2_1, SET3_1, SET4, and SET5) between the same number of electrodes EL1_1, EL2_1, EL3_1, EL4_1, EL5, EL6, EL7, and EL8, as compared with a light emitting unit having a structure in which stages are all connected in series. Thus, the light emission efficiency of the light emitting elements LD can be improved, and a ratio of light emitting elements LD which do not emit light due to a failure is relatively decreased even in case that the failure occurs in a specific stage. Accordingly, deterioration of the light emission efficiency of the light emitting elements LD can be reduced.

The structure of the pixel PXL_1 is not limited to the embodiment shown in FIG. 11, and the corresponding pixel PXL_1 may have various structures. For example, the pixel PXL_1 may include the pixel circuit PXC described with reference to FIG. 4B or 4C. In another example, the pixel PXL_1 may be configured in a passive type light emitting display device. The pixel circuit PXC may be omitted, and both end portions of the light emitting elements LD included in the light emitting unit EMU_1 may be directly connected to the i-th scan line Si, the j-th data line Dj, the first power line PL1 to which the first driving power source VDD is applied, the second power line PL2 to which the second driving power source VSS is applied, and/or a predetermined control line.

Figure 12:
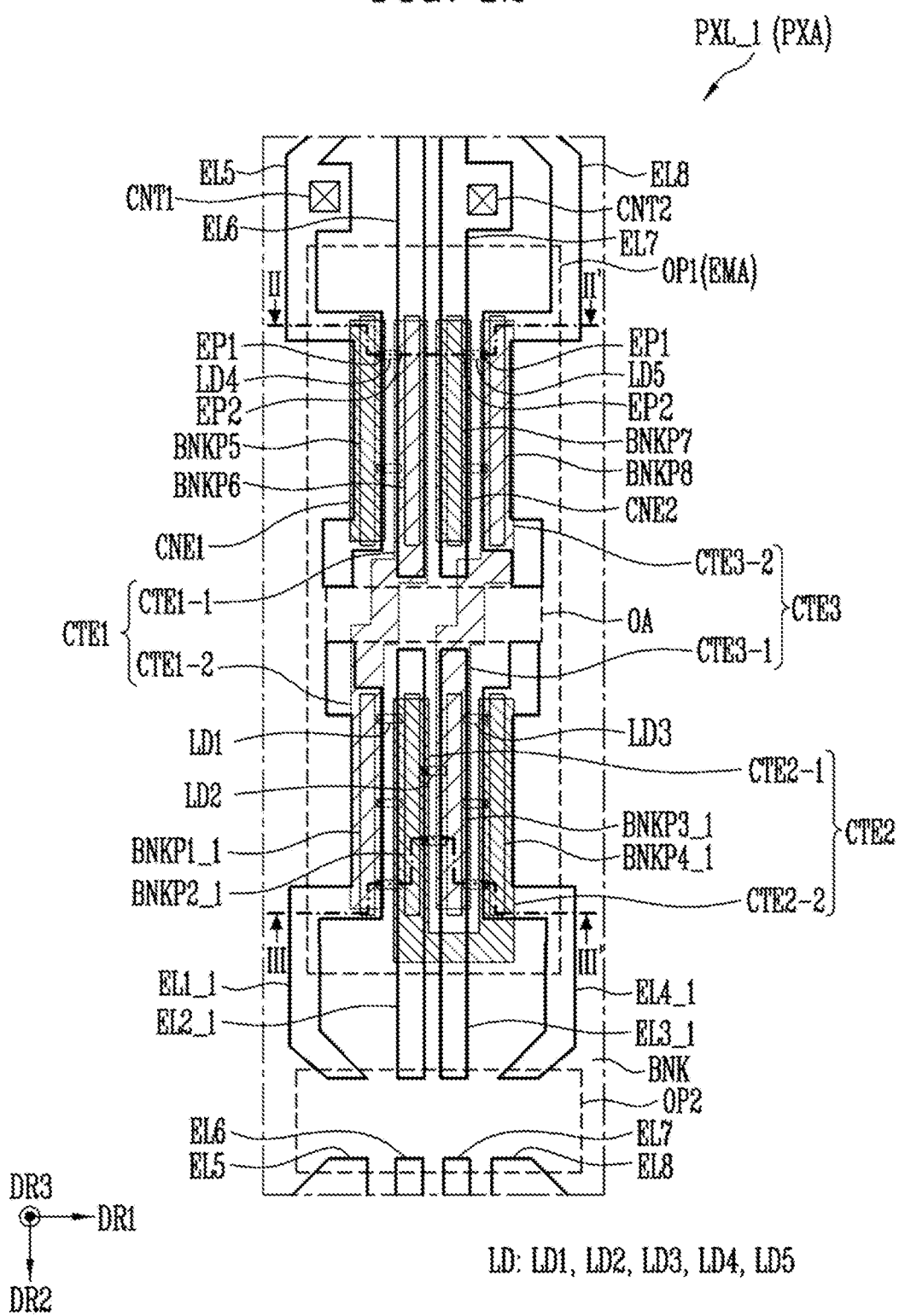
FIG. 12 is a plan view schematically illustrating the pixel shown in FIG. 11.

FIG. 12 is a plan view schematically illustrating the pixel shown in FIG. 11.

In FIG. 12, illustration of transistors connected to light emitting elements and signal lines connected to the transistors is omitted for the sake of convenience, and the pixel PXL_1 is briefly illustrated based on the light emitting unit EMU_1 described with reference to FIG. 11.

Referring to FIGS. 3, 11, and 12, the pixel PXL_1 may be formed in a pixel area PXA defined on the substrate SUB. The pixel area PXA may include an emission area EMA. In some embodiments, the pixel PXL_1 may include a bank BNK and may be defined by the bank BNK surrounding the emission area EMA. The bank BNK has been described with reference to FIG. 5, and therefore, repetitive descriptions will be omitted.

The pixel PXL_1 may include a first electrode EL1_1, a second electrode EL2_1, a third electrode EL3_1, a fourth electrode EL4_1, a fifth electrode EL5, a sixth electrode EL6, a seventh electrode EL7, and an eighth electrode EL8, which are physically separated or spaced apart from each other.

The first electrode EL1_1, the second electrode EL2_1, the third electrode EL3_1, and the fourth electrode EL4_1 may be sequentially arranged in the first direction DR1. Each of the first electrode EL1_1, the second electrode EL2_1, the third electrode EL3_1, and the fourth electrode EL4_1 may extend in the second direction DR2 intersecting the first direction DR1.

The fifth electrode EL5, the sixth electrode EL6, the seventh electrode EL7, and the eighth electrode EL8 may be disposed to be respectively spaced apart from the first electrode EL1_1, the second electrode EL2_1, the third electrode EL3_1, and the fourth electrode EL4_1 in the second direction DR2, and be sequentially arranged in the first direction DR1. Each of the fifth electrode EL5, the sixth electrode EL6, the seventh electrode EL7, and the eighth electrode EL8 may extend in the second direction DR2.

An end portion of each of the first electrode EL1_1, the second electrode EL2_1, the third electrode EL3_1, and the fourth electrode EL4_1 and an end portion of each of the fifth electrode EL5, the sixth electrode EL6, the seventh electrode EL7, and the eighth electrode EL8 may be located in an open area OA in the emission area EMA. The open area OA may correspond to a center area of the emission area EMA.

As will be described below with reference to FIG. 17, the first electrode EL1_1, the second electrode EL2_1, the third electrode EL3_1, and the fourth electrode EL4_1 may be integrally formed with the fifth electrode EL5, the sixth electrode EL6, the seventh electrode EL7, and the eighth electrode EL8, respectively, before light emitting elements LD are supplied onto the substrate SUB in a manufacturing process of the display device, and may be separated from the fifth electrode EL5, the sixth electrode EL6, the seventh electrode EL7, and the eighth electrode EL8, respectively, in the open area OA (and a second opening OP2 of the bank BNK) after the light emitting elements LD are supplied and arranged in the pixel area PXA.

The first electrode EL1_1, the second electrode EL2_1, the third electrode EL3_1, and the fourth electrode EL4_1 are respectively symmetrical to the fifth electrode EL5, the sixth electrode EL6, the seventh electrode EL7, and the eighth electrode EL8 with respect to the open area OA, and therefore, the fifth electrode EL5, the sixth electrode EL6, the seventh electrode EL7, and the eighth electrode EL8 will be mainly described.

The fifth electrode EL5 may have a shape curved in the first direction DR1 toward the sixth electrode EL6 in the emission area EMA. The curved shape of the fifth electrode EL5 may be provided to maintain a distance between the fifth electrode EL5 and the sixth electrode EL6 in the emission area EMA. Similarly, the eighth electrode EL8 may have a shape curved in the first direction DR1 toward the seventh electrode EL7 in the emission area EMA. The curved shape of the eighth electrode EL8 may be provided to maintain a distance between the seventh electrode EL7 and the eighth electrode EL8 in the emission area EMA. However, the fifth electrode EL5 and the eighth electrode EL8 are not limited thereto. For example, the fifth electrode EL5 and the eighth electrode EL8 may include the protrusion part described with reference to FIG. 5 instead of the curved shape.

The fifth electrode EL5 may be electrically connected to the first transistor T1 shown in FIG. 11 through a first contact hole CNT1, and the seventh electrode EL7 may be electrically connected to the second driving power source VSS (or the second power line PL2) shown in FIG. 11 through a second contact hole CNT2.

A structure (e.g., a single- or multi-layered structure) of each of the first electrode EL1_1, the second electrode EL2_1, the third electrode EL3_1, the fourth electrode EL4_1, the fifth electrode EL5, the sixth electrode EL6, the seventh electrode EL7, and the eighth electrode EL8 may be substantially identical or similar to that of corresponding one of the first to fourth electrodes EL1, EL2, EL3, and EL4 described with reference to FIG. 5.

In some embodiments, the pixel PXL_1 may include a first bank pattern BNKP1_1 overlapping an area of the first electrode EL1_1, a second bank pattern BNKP2_1 overlapping an area of the second electrode EL2_1, a third bank pattern BNKP3_1 overlapping an area of the third electrode EL3_1, a fourth bank pattern BNKP4_1 overlapping an area of the fourth electrode EL4_1, a fifth bank pattern BNKP5 overlapping an area of the fifth electrode EL5, a sixth bank pattern BNKP6 overlapping an area of the sixth electrode EL6, a seventh bank pattern BNKP7 overlapping an area of the seventh electrode EL7, and an eighth bank pattern BNKP8 overlapping an area of the eighth electrode EL8.

The first bank pattern BNKP1_1, the second bank pattern BNKP2_1, the third bank pattern BNKP3_1, the fourth bank pattern BNKP4_1, the fifth bank pattern BNKP5, the sixth bank pattern BNKP6, the seventh bank pattern BNKP7, and the eighth bank pattern BNKP8 may be disposed to be spaced apart from each other in the emission area EMA and may allow the area of each of the first electrode EL1_1, the second electrode EL2_1, the third electrode EL3_1, the fourth electrode EL4_1, the fifth electrode EL5, the sixth electrode EL6, the seventh electrode EL7, and the eighth electrode EL8 to protrude in an upward direction.

Although a case where the first bank pattern BNKP1_1, the second bank pattern BNKP2_1, the third bank pattern BNKP3_1, and the fourth bank pattern BNKP4_1 are respectively separated from the fifth bank pattern BNKP5, the sixth bank pattern BNKP6, the seventh bank pattern BNKP7, and the eighth bank pattern BNKP8 is illustrated in FIG. 12, the disclosure is not limited thereto. For example, the first bank pattern BNKP1_1 may be integrally formed with the fifth bank pattern BNKP5, and the fourth bank pattern BNKP4_1 may be integrally formed with the eighth bank pattern BNKP8.

The pixel PXL_1 may include a first light emitting element LD1, a second light emitting element LD2, a third light emitting element LD3, a fourth light emitting element LD4, and a fifth light emitting element LD5. The first light emitting element LD1, the second light emitting element LD2, and the third light emitting element LD3 are substantially identical or similar to the first light emitting element LD1, the second light emitting element LD2, and the third light emitting element LD3 described with reference to FIG. 5, respectively, and therefore, repetitive descriptions will be omitted.

The fourth light emitting element LD4 may be disposed between the fifth electrode EL5 and the sixth electrode EL6. A first end portion EP1 of the fourth light emitting element LD4 may face the fifth electrode EL5, and a second end portion EP2 of the fourth light emitting element LD4 may face the sixth electrode EL6. In case that there are multiple fourth light emitting elements LD4, the fourth light emitting elements LD4 may be electrically connected in parallel to each other between the fifth electrode EL5 and the sixth electrode EL6 and may form the fourth stage SET4 described with reference to FIG. 11.

The fifth light emitting element LD5 may be disposed between the seventh electrode EL7 and the eighth electrode EL8. A first end portion EP1 of the fifth light emitting element LD5 may face the eighth electrode EL8, and a second end portion EP2 of the fifth light emitting element LD5 may face the seventh electrode EL7. The first end portion EP1 of the fourth light emitting element LD4 and the first end portion EP1 of the fifth light emitting element LD5 may include the same type semiconductor layer (e.g., the first semiconductor layer 11 described with reference to FIG. 1A). In case that there are multiple fifth light emitting elements LD5, the fifth light emitting elements LD5 may be electrically connected in parallel to each other between the seventh electrode EL7 and the eighth electrode EL8 and may form the fifth stage SET5 described with reference to FIG. 11.

In some embodiments, each of the first light emitting element LD1, the second light emitting element LD2, the third light emitting element LD3, the fourth light emitting element LD4, and the fifth light emitting element LD5 may be a light emitting diode having a size, e.g., to a degree of nano or micro scale, which is manufactured using a material having an inorganic crystalline structure. For example, each of the first light emitting element LD1, the second light emitting element LD2, the third light emitting element LD3, the fourth light emitting element LD4, and the fifth light emitting element LD5 may be the light emitting element shown in any one of FIGS. 1A to 2B.

In some embodiments, the pixel PXL_1 may include a first contact electrode CNE1, a second contact electrode CNE2, a first intermediate electrode CTE1, a second intermediate electrode CTE2, and a third intermediate electrode CTE3.

The first contact electrode CNE1 may be formed on the first end portion EP1 of the fourth light emitting element LD4 and at least one area of the fifth electrode EL5, which corresponds thereto, to physically and/or electrically connect the first end portion EP1 of the fourth light emitting element LD4 to the fifth electrode EL5.

The second contact electrode CNE2 may be formed on the second end portion EP2 of the fifth light emitting element LD5 and at least one area of the seventh electrode EL7, which corresponds thereto, to physically and/or electrically connect the second end portion EP2 of the fifth light emitting element LD5 to the seventh electrode EL7.

The first intermediate electrode CTE1 may include a 1-1-th intermediate electrode CTE1-1 and a 1-2-th intermediate electrode CTE1-2, which extend in the second direction DR2. The 1-1-th intermediate electrode CTE1-1 may be formed on the second end portion EP2 of the fourth light emitting element LD4 and at least one area of the sixth electrode EL6, which corresponds thereto. The first intermediate electrode CTE1 may extend to the first electrode EL1_1 (or the 1-2-th intermediate electrode CTE1-2) from the sixth electrode EL6 (or the 1-1-th intermediate electrode CTE1-1), and the 1-2-th intermediate electrode CTE1-2 may be formed on a first end portion EP1 of the first light emitting element LD1 and at least one area of the first electrode EL1_1, which corresponds thereto. The first intermediate electrode CTE1 may electrically connect the second end portion EP2 of the fourth light emitting element LD4 with the first end portion EP1 of the first light emitting element LD1.

The second intermediate electrode CTE2 may include a 2-1-th intermediate electrode CTE2-1 and a 2-2-th intermediate electrode CTE2-2, which extend in the second direction DR2. The 2-1-th intermediate electrode CTE2-1 may be formed on a second end portion EP2 of the first light emitting element LD1, a first end portion EP1 of the second light emitting element LD2, and at least one area of the second electrode EL2_1, which corresponds thereto. The second intermediate electrode CTE2 may extend from the second electrode EL2_1 while detouring the third intermediate electrode CTE3 or the second light emitting element LD2, and the 2-2-th intermediate electrode CTE2-2 may be formed on a first end portion EP1 of the third light emitting element LD3 and at least one area of the fourth electrode EL4_1, which corresponds thereto. The second intermediate electrode CTE2 may electrically connect the second end portion EP2 of the first light emitting element LD1, the first end portion EP1 of the second light emitting element LD2, and the first end portion EP1 of the third light emitting element LD3 with each other.

The third intermediate electrode CTE3 may include a 3-1-th intermediate electrode CTE3-1 and a 3-2-th intermediate electrode CTE3-2, which extend in the second direction DR2. The 3-1-th intermediate electrode CTE3-1 may be formed on a second end portion EP2 of the second light emitting element LD2, a second end portion EP2 of the third light emitting element LD3, and at least one area of the third electrode EL3_1, which corresponds thereto. The third intermediate electrode CTE3 may extend to the eighth electrode EL8 (or the 3-2-th intermediate electrode CTE3-2) from the third electrode EL3_1 (or the 3-1-th intermediate electrode CTE3-1), and the 3-2-th intermediate electrode CTE3-2 may be formed on the first end portion EP1 of the fifth light emitting element LD5 and at least one area of the eighth electrode EL8, which corresponds thereto. The third intermediate electrode CTE3 may electrically connect the second end portion EP2 of the second light emitting element LD2, the second end portion EP2 of the third light emitting element LD3, and the first end portion EP1 of the fifth light emitting element LD5 with each other.

Therefore, the first light emitting element LD1 may be electrically connected in series to the fourth light emitting element LD4 through the first intermediate electrode CTE1. The second light emitting element LD2 and the third light emitting element LD3 may be electrically connected in parallel to each other through the second intermediate electrode CTE2, and be electrically connected in series to the first light emitting element LD1. The fifth light emitting element LD5 may be electrically connected to the second light emitting element LD2 and the third light emitting element LD3 through the third intermediate electrode CTE3.

During each frame period, in the pixel PXL_1, a driving current may flow from the fifth electrode EL5 to the seventh electrode EL7 via the fourth light emitting element LD4, the first intermediate electrode CTE1, the first light emitting element LD1, the second intermediate electrode CTE2, the second and third light emitting elements LD2 and LD3, the third intermediate electrode CTE3, and the fifth light emitting element LD5.

As described with reference to FIGS. 5 and 12, the fourth light emitting element LD4, the first light emitting element LD1, the third light emitting element LD3, and the fifth light emitting element LD5 may be electrically connected in series through the first intermediate electrode CTE1, the second intermediate electrode CTE2, and the third intermediate electrode CTE3 between the fifth electrode EL5 and the seventh electrode EL7, and the second light emitting element LD2 and the third light emitting element LD3 may be electrically connected in parallel to each other through the second intermediate electrode CTE2. In this manner, the light emitting unit EMU_1 of the pixel PXL_1 can be configured by electrically connecting the light emitting elements LD aligned in the pixel area PXA of the pixel PXL_1 in the series/parallel hybrid structure. Accordingly, the light emitting unit EMU_1 can be configured in a series/parallel structure including five stages while minimizing areas occupied by alignment electrodes (or while not increasing a number of alignment electrodes), and thus the display device having a high resolution and a fine pitch can be easily implemented.

Figure 13:
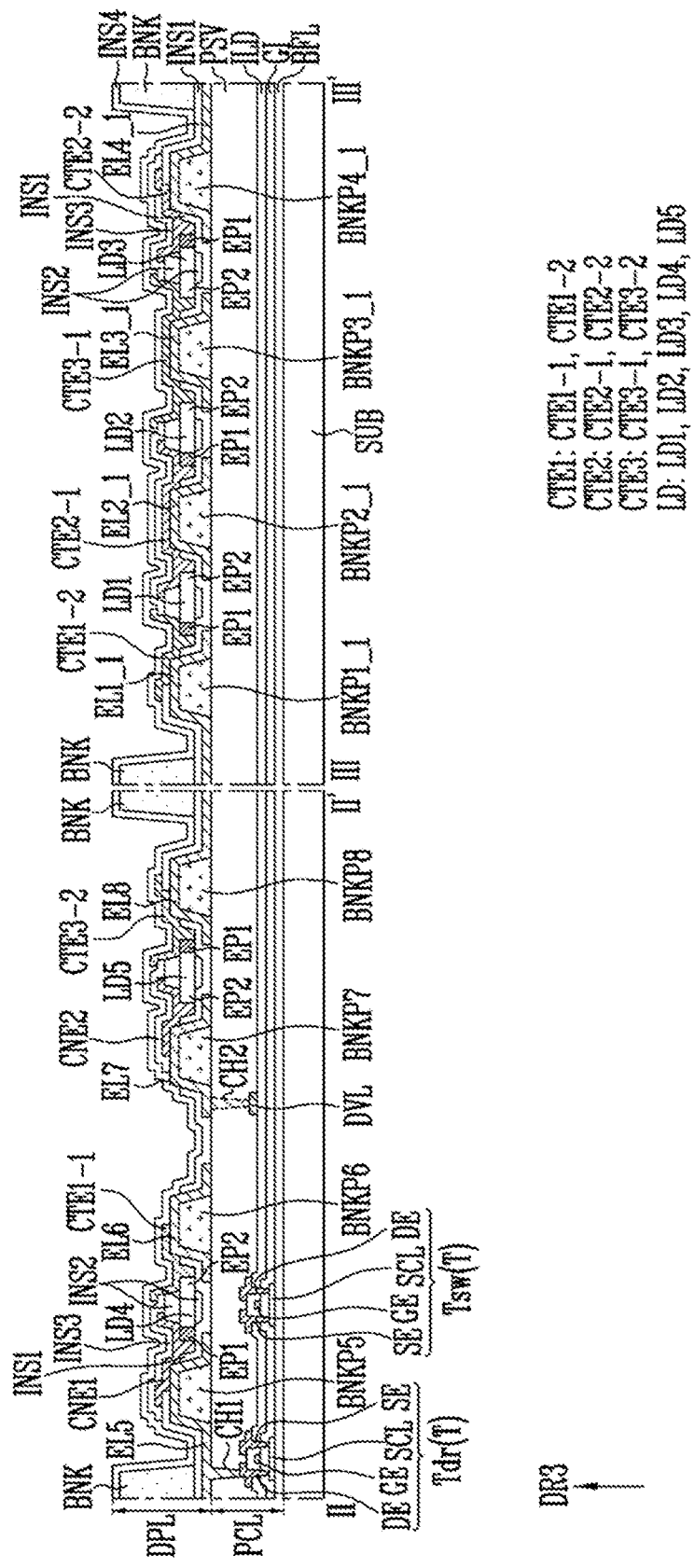
FIG. 13 is a schematic cross-sectional view illustrating the pixel taken along lines II-II' and III-III' shown in FIG. 12.

FIG. 13 is a schematic cross-sectional view illustrating the pixel taken along lines II-II' and III-III' shown in FIG. 12. A diagram corresponding to FIG. 7A is illustrated in FIG. 13.

Referring to FIGS. 3, 12, and 13, a pixel circuit layer PCL and a display element layer DPL (or light emitting element layer) may be sequentially disposed on a substrate SUB. The substrate SUB and the pixel circuit layer PCL are substantially identical or similar to the substrate SUB and the pixel circuit layer PCL, which are described with reference to FIG. 7A, and therefore, repetitive descriptions will be omitted.

The display element layer DPL may include first to eighth bank patterns BNKP1_1, BNKP2_1, BNKP3_1, BNKP4_1, BNKP5, BNKP6, BNKP7, and BNKP8, first to eighth electrodes EL1_1, EL2_1, EL3_1, EL4_1, EL5, EL6, EL7, and EL8, a first insulating layer INS1 (or first passivation layer), first to fifth light emitting elements LD1, LD2, LD3, LD4, and LD5, a second insulating layer INS2 (or second passivation layer), first and second contact electrodes CNE1 and CNE2, a second intermediate electrode CTE2, a third insulating layer INS3, first and third intermediate electrode CTE1 and CTE3, and a fourth insulating layer INS4, which are sequentially disposed or formed on a protective layer PSV (or the pixel circuit layer PCL).

The first to eighth bank patterns BNKP1_1, BNKP2_1, BNKP3_1, BNKP4_1, BNKP5, BNKP6, BNKP7, and BNKP8, the first to eighth electrodes EL1_1, EL2_1, EL3_1, EL4_1, EL5, EL6, EL7, and EL8, the first insulating layer INS1 (or first passivation layer), the first to fifth light emitting elements LD1, LD2, LD3, LD4, and LD5, and the second insulating layer INS2 (or second passivation layer) may be substantially identical or similar to the first to fourth bank patterns BNKP1, BNKP2, BNKP3, and BNKP4, the first to fourth electrodes EL1, EL2, EL3, and EL4, the first insulating layer INS1, the first to third light emitting elements LD1, LD2, and LD3, and the second insulating layer INS2, which are described with reference to FIG. 7A, respectively. Therefore, repetitive descriptions will be omitted.

The fifth bank pattern BNKP5 may be disposed between the protective layer PSV and the fifth electrode EL5. The fifth bank pattern BNKP5 may be disposed adjacent to a first end portion EP1 of the fourth light emitting element LD4. In an example, a side surface of the fifth bank pattern BNKP5 may be located adjacent to the first end portion EP1 of the fourth light emitting element LD4 to face the first end portion EP1 of the fourth light emitting element LD4.

The sixth bank pattern BNKP6 may be disposed between the protective layer PSV and the sixth electrode EL6. The sixth bank pattern BNKP6 may be disposed adjacent to a second end portion EP2 of the fourth light emitting element LD4. In an example, a side surface of the sixth bank pattern BNKP6 may be located adjacent to the second end portion EP2 of the fourth light emitting element LD4 to face the second end portion EP2 of the fourth light emitting element LD4.

The seventh bank pattern BNKP7 may be disposed between the protective layer PSV and the seventh electrode EL7. The seventh bank pattern BNKP7 may be disposed adjacent to the second end portion EP2 of the fifth light emitting element LD5. In an example, a side surface of the seventh bank pattern BNKP7 is located adjacent to the second end portion EP2 of the fifth light emitting element LD5 to face the second end portion EP2 of the fifth light emitting element LD5.

The eighth bank pattern BNKP8 may be disposed between the protective layer PSV and the eighth electrode EL8. The eighth bank pattern BNKP8 may be disposed adjacent to a first end portion EP1 of the fifth light emitting element LD5. In an example, a side surface of the eighth bank pattern BNKP8 may be located adjacent to the first end portion EP1 of the fifth light emitting element LD5, to face the first end portion EP1 of the fifth light emitting element LD5.

The first to eighth electrodes EL1_1, EL2_1, EL3_1, EL4_1, EL5, EL6, EL7, and EL8 may be respectively disposed on the first to eighth bank patterns BNKP1_1, BNKP2_1, BNKP3_1, BNKP4_1, BNKP5, BNKP6, BNKP7, and BNKP8. The first to eighth electrodes EL1_1, EL2_1, EL3_1, EL4_1, EL5, EL6, EL7, and EL8 may be disposed in the emission area EMA (see FIG. 12) to be spaced apart from each other.

The first insulating layer INS1 may be disposed over an area of each of the first to eighth electrodes EL1_1, EL2_1, EL3_1, EL4_1, EL5, EL6, EL7, and EL8. For example, the first insulating layer INS1 may be formed to cover or overlap the area of each of the first to eighth electrodes EL1_1, EL2_1, EL3_1, EL4_1, EL5, EL6, EL7, and EL8, and include an opening exposing another area of each of the first to eighth electrodes EL1_1, EL2_1, EL3_1, EL4_1, EL5, EL6, EL7, and EL8.

The first insulating layer INS1 may be interposed between the fifth and sixth electrodes EL5 and EL6 and the fourth light emitting element LD4, between the sixth and seventh electrodes EL6 and EL7, and between the seventh and eighth electrodes EL7 and EL8 and the fifth light emitting element LD5, and may expose at least one area of each of the fifth to eighth electrodes EL5, EL6, EL7, and EL8.

In some embodiments, a bank BNK may be disposed or formed on the first insulating layer INS1.

Light emitting elements LD may be supplied and aligned in the emission area EMA (see FIG. 12) in which the first insulating layer INS1 is formed.

In an example, the light emitting elements LD may be supplied to the emission area EMA through an inkjet process or the like and may be aligned between the fifth and sixth electrode EL5 and EL6, between the seventh and eighth electrodes EL7 and EL8, between the first and second electrodes EL1_1 and EL2_1, between the second and third electrodes EL2_1 and EL3_1, and between the third and fourth electrodes EL3_1 and EL4_1, by a predetermined alignment voltage (or alignment signal) applied to the first to eighth electrodes EL1_1, EL2_1, EL3_1, EL4_1, EL5, EL6, EL7, and EL8. The light emitting element may be aligned between the sixth electrode EL6 and the seventh electrode EL7. However, in case that the second insulating layer INS2, which will be described below, is not formed between the sixth electrode EL6 and the seventh electrode EL7, the light emitting element may not be disposed between the sixth electrode EL6 and the seventh electrode EL7.

The second insulating layer INS2 may be disposed on each of the light emitting elements LD, for example, on each of the fourth light emitting element LD4 aligned between the fifth and sixth electrodes EL5 and EL6 and the fifth light emitting element LD5 aligned between the seventh and eighth electrodes EL7 and EL8, and may expose first and second end portions EP1 and EP2 of each of the light emitting elements LD. As an example, the second insulating layer INS2 does not cover or overlap the first and second end portions EP1 and EP2 of each of the light emitting elements LD and may be partially disposed only on an area of each of the light emitting elements LD.

The first contact electrode CNE1 may be disposed on the fifth electrode EL5 and the first end portion EP1 of the fourth light emitting element LD4. The first contact electrode CNE1 may electrically connect the fifth electrode EL5 with the first end portion EP1 of the fourth light emitting element LD4.

The first contact electrode CNE1 may be disposed on an area of the fifth electrode EL5, which is not overlapped by the first insulating layer INS1, to electrically contact the fifth electrode EL5. The first contact electrode CNE1 may be disposed on the first end portion EP1 of the fourth light emitting element LD4 to electrically contact the first end portion EP1 of the fourth light emitting element LD4, which is adjacent to the fifth electrode EL5. For example, the first contact electrode CNE1 may be disposed to overlap the first end portion EP1 of the fourth light emitting element LD4 and at least one area of the fifth electrode EL5, which corresponds thereto.

Similarly, the second contact electrode CNE2 may be disposed on the seventh electrode EL7 and the second end portion EP2 of the fifth light emitting element LD5. The second contact electrode CNE2 may electrically connect the seventh electrode EL7 with the second end portion EP2 of the fifth light emitting element LD5.

The second contact electrode CNE2 may be disposed on an area of the seventh electrode EL7, which is not overlapped by the first insulating layer INS1, to electrically contact the seventh electrode EL7. The second contact electrode CNE2 may be disposed on the second end portion EP2 of the fifth light emitting element LD5 to electrically contact the second end portion EP2 of the fifth light emitting element LD5, which is adjacent to the seventh electrode EL7. For example, the second contact electrode CNE2 may be disposed to overlap the second end portion EP2 of the fifth light emitting element LD5 and at least one area of the seventh electrode EL7, which corresponds thereto.

The second intermediate electrode CTE2 may be disposed on a second end portion EP2 of the first light emitting element LD1, the second electrode EL2_1, a first end portion EP1 of the second light emitting element LD2, a first end portion EP1 of the third light emitting element LD3, and the fourth electrode EL4_1. As shown in FIG. 13, a 2-1-th intermediate electrode CTE2-1 may be disposed on the second end portion EP2 of the first light emitting element LD1, the second electrode EL2_1, and the first end portion EP1 of the second light emitting element LD2, and a 2-2-th intermediate electrode CTE2-2 may be disposed on the first end portion EP1 of the third light emitting element LD3 and the fourth electrode EL4_1.

The first contact electrode CNE1, the second contact electrode CNE2, and the second intermediate electrode CTE2 may be disposed on the same layer as shown in FIG. 13. The first contact electrode CNE1, the second contact electrode CNE2, and the second intermediate electrode CTE2 may be formed of the same conductive material through the same process, but the disclosure is not limited thereto.

The third insulating layer INS3 may be disposed over the first contact electrode CNE1, the second contact electrode CNE2, and the second intermediate electrode CTE2. The third insulating layer INS3 may overlap the first contact electrode CNE1, the second contact electrode CNE2, and the second intermediate electrode CTE2.

The first intermediate electrode CTE1 may be disposed on the second end portion EP2 of the fourth light emitting element LD4, the sixth electrode EL6, a first end portion EP1 of the first light emitting element LD1, and the first electrode EL1_1. As shown in FIG. 13, a 1-1-th intermediate electrode CTE1-1 may be disposed on the second end portion EP2 of the fourth light emitting element LD4 and the sixth electrode EL6, and a 1-2-th intermediate electrode CTE1-2 may be disposed on the first end portion EP1 of the first light emitting element LD1 and the first electrode EL1_1.

The third intermediate electrode CTE3 may be disposed on a second end portion EP2 of the second light emitting element LD2, a second end portion EP2 of the third light emitting element LD3, the third electrode EL3_1, the first end portion EP1 of the fifth light emitting element LD5, and the eighth electrode EL8. As shown in FIG. 13, a 3-1-th intermediate electrode CTE3-1 may be disposed on the second end portion EP2 of the second light emitting element LD2, the second end portion EP2 of the third light emitting element LD3, and the third electrode EL3_1, and a 3-2-th intermediate electrode CTE3-2 may be disposed on the first end portion EP1 of the fifth light emitting element LD5 and the eighth electrode EL8.

The fourth insulating layer INS4 may be disposed over the first intermediate electrode CTE1 and the third intermediate electrode CTE3. The fourth insulating layer INS4 may be entirely formed or disposed on the substrate SUB to cover the first intermediate electrode CTE1, the third intermediate electrode CTE3, the third insulating layer INS3, and the bank BNK.

Although a case where the first intermediate electrode CTE1 and the third intermediate electrode CTE3 are disposed on a layer different from that of the first contact electrode CNE1, the second contact electrode CNE2, and the second intermediate electrode CTE2 is illustrated in FIG. 13, the first and second contact electrodes CNE1 and CNE2 and the first to third intermediate electrodes CTE1, CTE2, and CTE3 are not limited thereto. As described with reference to FIG. 7B, the first and second contact electrodes CNE1 and CNE2 and the first to third intermediate electrodes CTE1, CTE2, and CTE3 may be disposed on the same layer.

Figure 14:
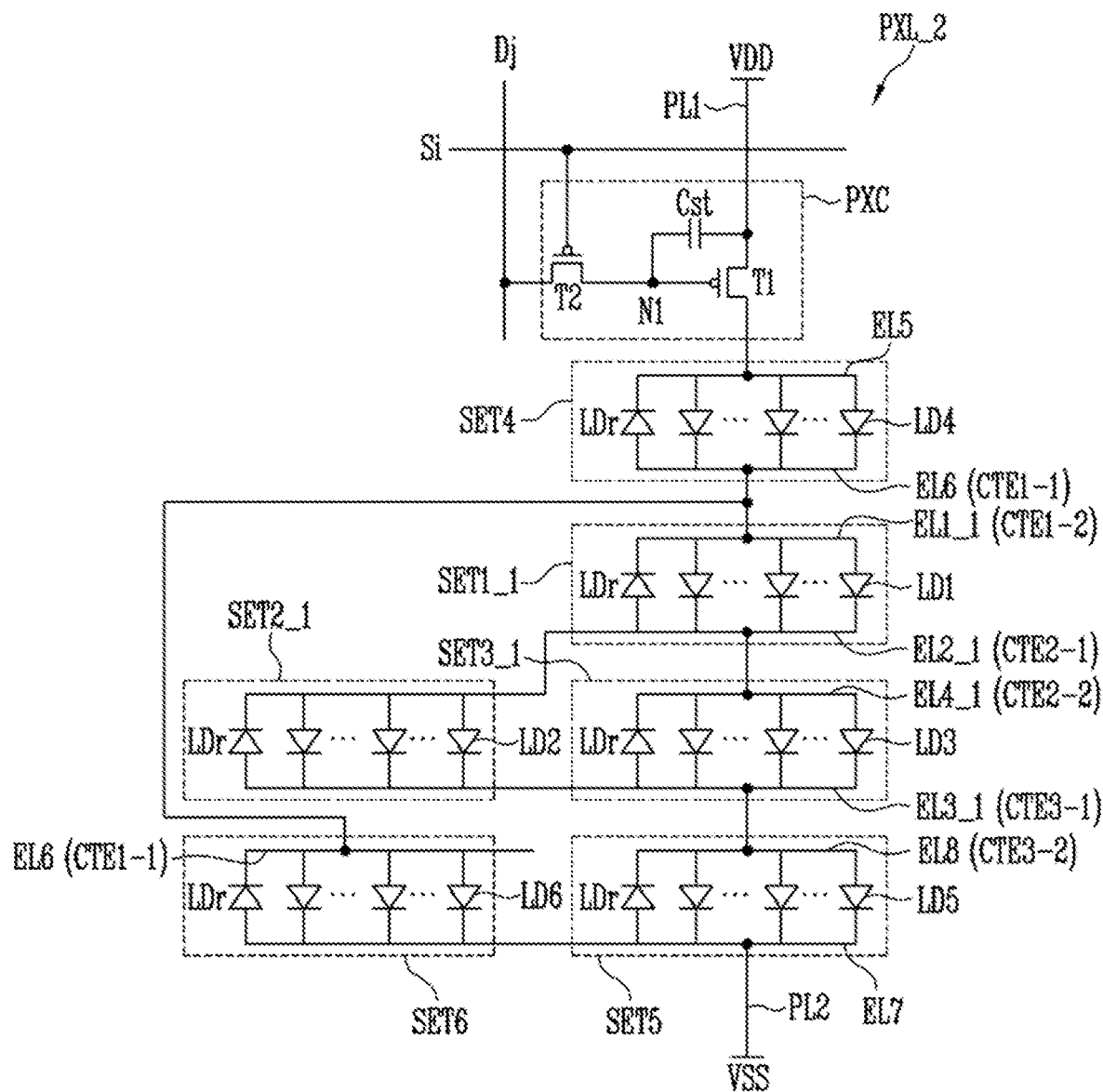
FIG. 14 is a schematic circuit diagram illustrating another embodiment of the electrical connection relationship between the components included in the one pixel shown in FIG. 3.

FIG. 14 is a schematic circuit diagram illustrating another embodiment of the electrical connection relationship between the components included in the pixel shown in FIG. 3. A circuit diagram corresponding to FIG. 11 is illustrated in FIG. 14.

Referring to FIGS. 11 and 14, a pixel PXL_2 may include a light emitting unit EMU_2 and a pixel circuit PXC. The light emitting unit EMU_2 and the pixel circuit PXC are substantially identical to the light emitting unit EMU_1 and the pixel circuit PXC, which are described with reference to FIG. 11, respectively, and therefore, repetitive descriptions will be omitted.

As compared with the light emitting unit EMU_1 shown in FIG. 11, the light emitting unit EMU_2 may further include a sixth stage SET6 electrically connected in parallel to the series/parallel hybrid structure of the first stage SET1_1, the second stage SET2_1, the third stage SET3_1, and the fifth state SET5.

The sixth stage SET6 may include a sixth electrode EL6 (or a 1-1-th intermediate electrode CTE1-1) and a seventh electrode EL7, and may include at least one sixth light emitting element LD6 electrically connected between the sixth electrode EL6 (or the 1-1-th intermediate electrode CTE1-1) and the seventh electrode EL7.

As compared with the light emitting unit EMU_1 of the pixel PXL_1 shown in FIG. 11, the light emitting unit EMU_2 of the pixel PXL_2, which further includes the sixth stage SET6, may include a larger number of light emitting elements LD (or first to sixth stages SET1_1, SET2_1, SET3_1, SET4, SET5, and SET6) between the same number of electrodes EL1_1, EL2_1, EL3_1, EL4_1, EL5, EL6, EL7, and EL8. Thus, the light emission efficiency of the light emitting elements LD can be improved, and a ratio of light emitting elements LD which do not emit light due to a failure is relatively decreased even in case that the failure occurs in a specific stage. Accordingly, deterioration of the light emission efficiency of the light emitting elements LD can be reduced.

Figure 15:
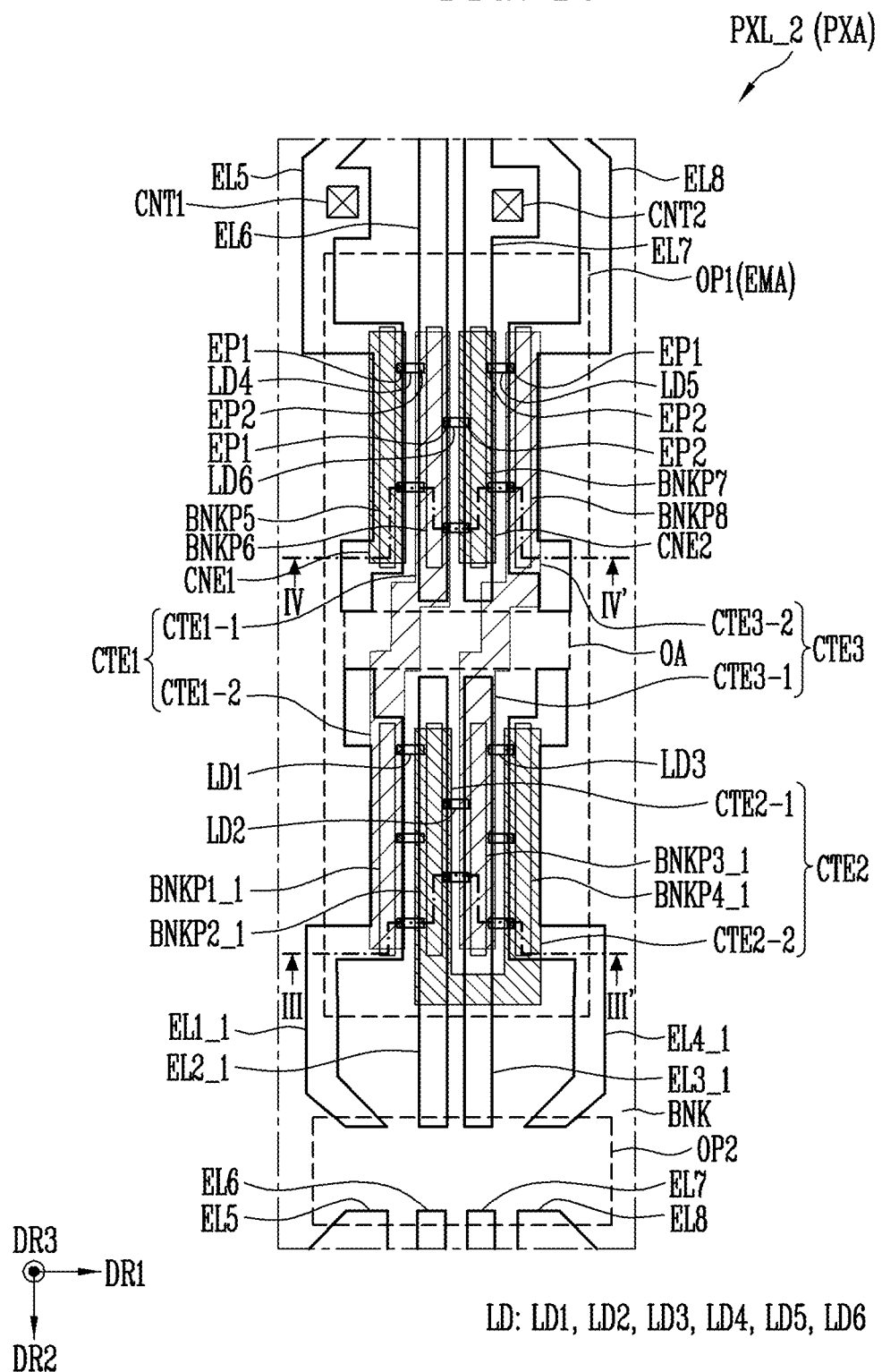
FIG. 15 is a plan view schematically illustrating the pixel shown in FIG. 14.
Figure 16:
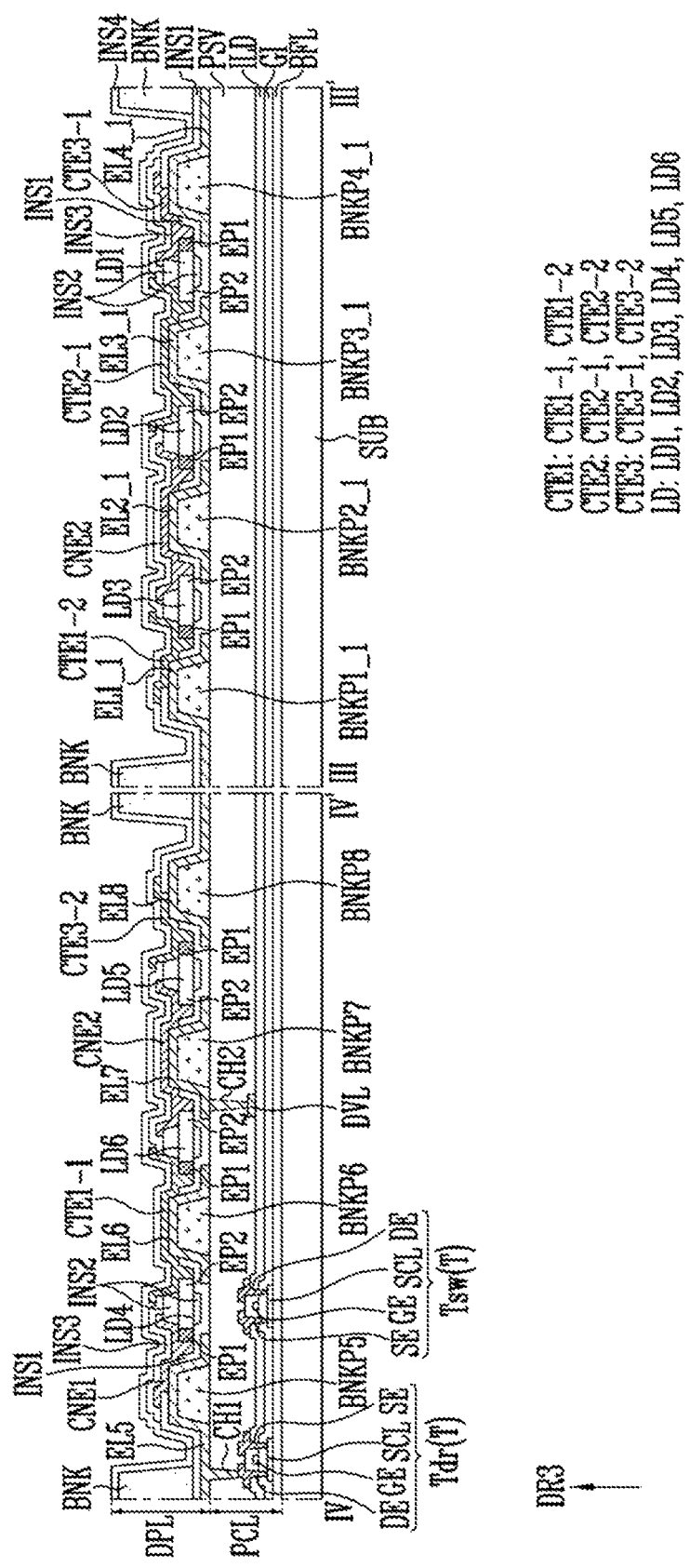
FIG. 16 is a schematic cross-sectional view illustrating the pixel taken along lines IV-IV' and III-III' shown in FIG. 15.

FIG. 15 is a plan view schematically illustrating the pixel shown in FIG. 14. A diagram corresponding to FIG. 12 is illustrated in FIG. 15. FIG. 16 is a schematic cross-sectional view illustrating the pixel taken along lines IV-IV' and III-III' shown in FIG. 15. A diagram corresponding to FIG. 13 is illustrated in FIG. 16.

Referring to FIGS. 3, 12, 13, 14, 15, and 16, the pixel PXL_2 is different from the pixel PXL_1 shown in FIGS. 12 and 13 in that the pixel PXL_2 further includes a sixth light emitting element LD6. The pixel PXL_2 is substantially identical or similar to the pixel PXL_1 shown in FIGS. 12 and 13 except for the sixth light emitting element LD6, and therefore, repetitive descriptions will be omitted.

The sixth light emitting element LD6 may be disposed between the sixth electrode EL6 and the seventh electrode EL7. A first end portion EP1 of the sixth light emitting element LD6 may face the sixth electrode EL6, and a second end portion EP2 of the sixth light emitting element LD6 may face the seventh electrode EL7. The second end portion EP2 of the sixth light emitting element LD6 and the second end portion EP2 of the fifth light emitting element LD5 may include a semiconductor layer of the same type (e.g., the second semiconductor layer 13 described with reference to FIG. 1A), and may face each other, with the seventh electrode EL7 interposed therebetween. In case that there are multiple sixth light emitting elements LD6, the sixth light emitting elements LD 6 may be electrically connected in parallel between the sixth electrode EL6 and the seventh electrode EL7, and may form the sixth stage SET6 described with reference to FIG. 14.

Light emitting elements LD may be supplied and aligned in the emission area EMA in which the first insulating layer INS1 is formed.

The light emitting element LD may be supplied to the emission area EMA through an inkjet process or the like, and the sixth light emitting element LD6 may be aligned between the sixth and seventh electrodes EL6 and EL7 by a predetermined alignment voltage (or alignment signal) applied to the sixth electrode EL6 and the seventh electrode EL7.

The second insulating layer INS2 may be disposed on the sixth light emitting element LD6 aligned between the sixth and seventh electrodes EL6 and EL7, and may expose the first and second end portions EP1 and EP2 of the sixth light emitting element LD6.

The second contact electrode CNE2 may be disposed on the second end portion EP2 of the sixth light emitting element LD6, the seventh electrode EL7, and the second end portion EP2 of the fifth light emitting element LD5. The second contact electrode CNE2 may electrically connect the second end portion EP2 of the sixth light emitting element LD6, the seventh electrode EL7, and the second end portion EP2 of the fifth light emitting element LD5 with each other.

The second contact electrode CNE2 may be disposed on an area of the seventh electrode EL7, which is not overlapped by the first insulating layer INS1 to electrically contact the seventh electrode EL7. The second contact electrode CNE2 may be disposed on the second end portion EP2 of the sixth light emitting element LD6 to electrically contact the second end portion EP2 of the sixth light emitting element LD6, which is adjacent to the seventh electrode EL7. For example, the second contact electrode CNE2 may be disposed to overlap the second end portion EP2 of the sixth light emitting element LD6 and at least one area of the seventh electrode EL7, which corresponds thereto.

The first intermediate electrode CTE1 may be disposed on the second end portion EP2 of the fourth light emitting element LD4, the sixth electrode EL6, the first end portion EP1 of the sixth light emitting element LD6, the first end portion EP1 of the first light emitting element LD1, and the first electrode EL1_1. As shown in FIG. 16, the 1-1-th intermediate electrode CTE1-1 may be disposed on the second end portion EP2 of the fourth light emitting element LD4, the sixth electrode EL6, and the first end portion EP1 of the sixth light emitting element LD6.

Figure 17:
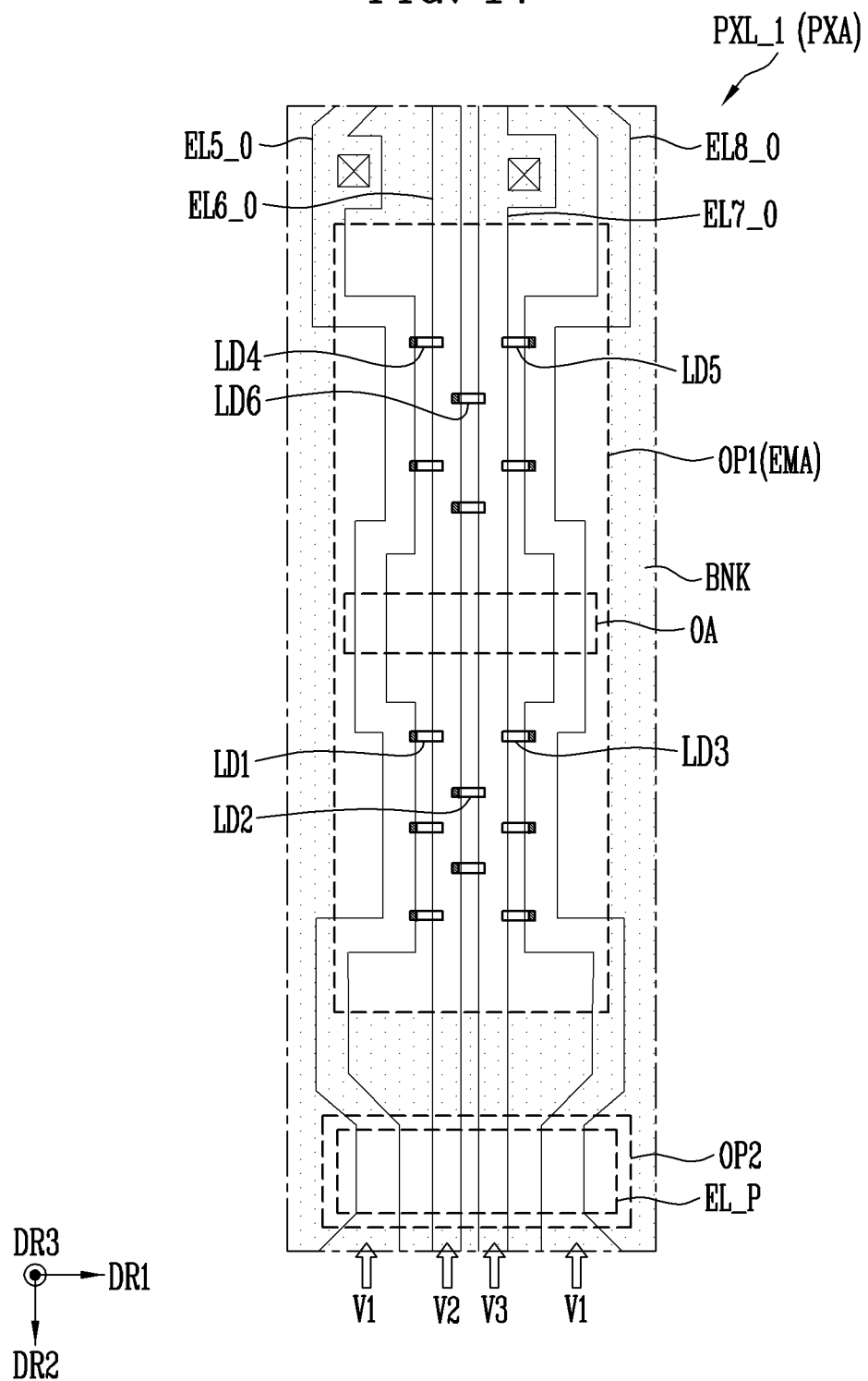
FIG. 17 is a schematic plan view illustrating a method of aligning light emitting elements in the pixel shown in FIG. 14.

FIG. 17 is a schematic plan view illustrating a method of aligning light emitting elements in the pixel shown in FIG. 14. A diagram corresponding to FIG. 10 is illustrated in FIG. 17.

Referring to FIGS. 3, 10, 14, and 17, fifth to eighth alignment electrodes EL5_0, EL6_0, EL7_0, and EL8_0 (or mother electrodes) may be disposed or formed in the pixel area PXA of the substrate SUB, a bank BNK defining the emission area EMA may be disposed on the fifth to eighth alignment electrodes EL5_0, EL6_0, EL7_0, and EL8_0, and light emitting elements LD may be supplied in the emission area EMA (or a first opening OP1 of the bank BNK).

The fifth to eighth alignment electrodes EL5_0, EL6_0, EL7_0, and EL8_0 may extend in the second direction DR2, and may be disposed to be spaced apart from each other in the first direction DR1. The fifth to eighth alignment electrodes EL5_0, EL6_0, EL7_0, and EL8_0 may extend up to another pixel area. For example, the fifth to eighth alignment electrodes EL5_0, EL6_0, EL7_0, and EL8_0 may be disposed to intersect a second opening OP2 of the bank BNK in a plan view. The fifth to eighth alignment electrodes EL5_0, EL6_0, EL7_0, and EL8_0 may be disposed to intersect an open area OA in a plan view. The fifth to eighth alignment electrodes EL5_0, EL6_0, EL7_0, and EL8_0 may be electrodes before the first to eighth electrodes EL1_1, EL2_1, EL3_1, EL4_1, EL5, EL6, EL7, and EL8 described with reference to FIG. 15 (and FIG. 12) are separated from other electrodes (e.g., electrodes of an adjacent pixel).

After the light emitting elements LD are supplied, a predetermined voltage may be applied to the fifth to eighth alignment electrodes EL5_0, EL6_0, EL7_0, and EL8_0.

For example, a first voltage V1 may be applied to the fifth alignment electrode EL5_0 and the eighth alignment electrode EL8_0, a second voltage V2 may be applied to the sixth alignment electrode EL6_0, and a third voltage V3 may be applied to the seventh alignment electrode EL7_0. The first voltage V1 may be higher than the second voltage V2, and the second voltage V2 may be higher than the third voltage V3.

An electric field may be formed between the fifth alignment electrode EL5_0 and the sixth alignment electrode EL6_0 by a voltage (e.g., an AC voltage) applied between the fifth alignment electrode EL5_0 and the sixth alignment electrode EL6_0, and the first light emitting element LD1 and the fourth light emitting element LD4 may be self-aligned between the fifth alignment electrode EL5_0 and the sixth alignment electrode EL6_0. Similarly, an electric field may be formed between the sixth alignment electrode EL6_0 and the seventh alignment electrode EL7_0 by an AC voltage applied between the sixth alignment electrode EL6_0 and the seventh alignment electrode EL7_0, and the second light emitting element LD2 and the sixth light emitting element LD6 may be self-aligned between the sixth alignment electrode EL6_0 and the seventh alignment electrode EL7_0. An electric field may be formed between the eighth alignment electrode EL8_0 and the seventh alignment electrode EL7_0 by an AC voltage applied between the eighth alignment electrode EL8_0 and the seventh alignment electrode EL7_0, and the third light emitting element LD3 and the fifth light emitting element LD5 may be self-aligned between the eighth alignment electrode EL8_0 and the seventh alignment electrode EL7_0.

After the alignment of the light emitting elements LD is completed, the fifth to eighth alignment electrodes EL5_0, EL6_0, EL7_0, and EL8_0 may be cut or separated from each other in the second opening OP2 of the bank BNK. For example, a portion EL_P of the fifth to eighth alignment electrodes EL5_0, EL6_0, EL7_0, and EL8_0 extending up to another pixel area may be removed or cut. The fifth to eighth alignment electrodes EL5_0, EL6_0, EL7_0, and EL8_0 may be cut or separated from each other in the open area OA. Accordingly, the first to eighth electrodes EL1_1, EL2_1, EL3_1, EL4_1, EL5, EL6, EL7, and EL8 described with reference to FIGS. 12 and 15 can be formed.

As described with reference to FIG. 17, the first voltage V1, the second voltage V2 (i.e., an intermediate voltage between the first voltage V1 and the third voltage V3), the third voltage V3, and the first voltage V1 are respectively applied to the fifth alignment electrode EL5_0, the sixth alignment electrode EL6_0, the seventh alignment electrode EL7_0, and the eighth alignment electrode EL8_0, so that the light emitting elements LD can be aligned in the series/parallel hybrid structure.

In accordance with the disclosure, the pixel and the display device include stages connected in series and parallel, and each of the stages includes light emitting elements. A number of stages (and light emitting elements) provided to a pixel through stages connected in parallel can be increased, and accordingly, the light emission efficiency of the light emitting elements can be improved. Further, although a failure occurs in a specific stage among the stages, a ratio of light emitting elements that do not emit light due to the failure is relatively decreased. Accordingly, deterioration of the light emission efficiency of the light emitting elements can be reduced.

Example embodiments have been disclosed herein, and although specific terms are employed, they are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the claims.

What is claimed is:
1. A pixel comprising:
   a first electrode, a second electrode, a third electrode, and a fourth electrode each disposed on and above a substrate and physically separated from each other;
   at least one first light emitting element disposed between the first electrode and the second electrode;

at least one second light emitting element disposed between the second electrode and the third electrode;

at least one third light emitting element disposed between the third electrode and the fourth electrode;

a first contact electrode disposed on and above the first electrode and electrically contacting the first electrode and a first end of the at least one first light emitting element;

a first intermediate electrode disposed on the second electrode and electrically contacting a second end of the at least one first light emitting element and a first end of the at least one second light emitting element;

a second contact electrode disposed on the third electrode and electrically contacting the third electrode, a second end of the at least one second light emitting element, and a second end of the at least one third light emitting element; and a second intermediate electrode disposed on the fourth electrode and electrically contacting a first end of the at least one third light emitting element, wherein the first intermediate electrode and the second intermediate electrode are electrically connected to each other, the second contact electrode forms an electrical connection between the third electrode and the second end of the at least one second light emitting element, and the second contact electrode forms an electrical connection between the third electrode and the second end of the at least one third light emitting element.

2. The pixel of claim 1, wherein the first electrode, the second electrode, the third electrode, and the fourth electrode are disposed on the same layer and are sequentially arranged in a first direction.

3. The pixel of claim 1, wherein the first end of the at least one first light emitting element, the first end of the at least one second light emitting element, and the first end of the at least one third light emitting element include a semiconductor layer of a same type.

4. The pixel of claim 3, wherein
the at least one second light emitting element and the at least one third light emitting element are electrically connected in parallel to each other, and
the at least one second light emitting element and the at least one third light emitting element are electrically connected in series to the at least one first light emitting element between the first electrode and the third electrode.

5. The pixel of claim 4, wherein
the first electrode is electrically connected to one of a transistor and a power line, and
the third electrode is electrically connected to the other of the transistor and the power line.

6. The pixel of claim 5, wherein the intermediate electrode has a closed loop structure.

7. The pixel of claim 1, further comprising a bank disposed on the substrate and including a first opening and a second opening spaced apart from each other,
wherein in a plan view:
the first contact electrode, the second contact electrode, the first intermediate electrode, and the second intermediate electrode are located in the first opening, and
a first end of each of the first electrode, the second electrode, the third electrode, and the fourth electrode is located in the second opening.

8. The pixel of claim 1, wherein
the first intermediate electrode electrically contacts the second electrode, and
the second intermediate electrode electrically contacts the fourth electrode.

9. The pixel of claim 1, wherein
the first intermediate electrode and the second intermediate electrode do not electrically contact the second electrode and the fourth electrode, and
the second electrode and the fourth electrode are electrically disconnected from the first electrode and the third electrode.

10. The pixel of claim 1, wherein the first contact electrode and the first intermediate electrode are disposed on a same layer.

11. The pixel of claim 1, wherein
the first intermediate electrode is disposed on and above the second electrode,
the second contact electrode is disposed on and above the third electrode,
a second intermediate electrode is disposed on and above the fourth electrode, and
the first intermediate electrode is electrically separated from any power line.

12. The pixel of claim 1, The pixel of claim 1, wherein
the first intermediate electrode is disposed on and above the second electrode,
the second contact electrode is disposed on and above the third electrode,
a second intermediate electrode is disposed on and above the fourth electrode, and
the second contact electrode is a same electrical node of an anode of at least one light emitting element and of a cathode of at least other light emitting element.

13. A pixel comprising:
a first electrode, a second electrode, a third electrode, and a fourth electrode each disposed on a substrate and physically separated from each other;
at least one first light emitting element disposed between the first electrode and the second electrode;
at least one second light emitting element disposed between the second electrode and the third electrode;
at least one third light emitting element disposed between the third electrode and the fourth electrode;
a first contact electrode disposed on the first electrode and electrically contacting the first electrode and a first end of the at least one first light emitting element;
a first intermediate electrode disposed on the second electrode and electrically contacting a second end of the at least one first light emitting element and a first end of the at least one second light emitting element;
a second contact electrode disposed on the third electrode and electrically contacting the third electrode, a second end of the at least one second light emitting element, and a second end of the at least one third light emitting element; and
a second intermediate electrode disposed on the fourth electrode and electrically contacting a first end of the at least one third light emitting element, wherein
the first intermediate electrode and the second intermediate electrode are electrically connected to each other, and
the first intermediate electrode and the second intermediate electrode are integral with each other and form an intermediate electrode.

14. The pixel of claim 13, wherein the intermediate electrode is spaced apart from the second contact electrode and surrounds at least a portion of the second contact electrode in a plan view.

15. A pixel comprising:
a first electrode, a second electrode, a third electrode, a fourth electrode, a fifth electrode, a sixth electrode, a seventh electrode, and an eighth electrode each disposed on and above a substrate and physically separated from each other;
at least one first light emitting element disposed between the first electrode and the second electrode;
at least one second light emitting element disposed between the second electrode and the third electrode;
at least one third light emitting element disposed between the third electrode and the fourth electrode;
at least one fourth light emitting element disposed between fifth electrode and the sixth electrode;
at least one fifth light emitting element disposed between the seventh electrode and the eighth electrode;
a first contact electrode disposed on and above the fifth electrode and electrically contacting the fifth electrode and a first end of the at least one fourth light emitting element;
a first intermediate electrode disposed on the sixth electrode and the first electrode and electrically contacting a second end of the at least one fourth light emitting element and a first end of the at least one first light emitting element;
a second intermediate electrode disposed on the second electrode and the fourth electrode and electrically contacting a second end of the at least one first light emitting elements, a first end of the at least one second light emitting element, and a first end of the third light emitting element;
a third intermediate electrode disposed on the third electrode and the eighth electrode and electrically contacting a second end of the at least one second light emitting element, a second end of the at least one third light emitting element, and a first end of the at least one fifth light emitting element; and
a second contact electrode disposed on the seventh electrode and electrically contacting a second end of the at least one fifth light emitting elements, wherein
the third intermediate electrode forms an electrical connection between the third electrode and the second end of the at least one second light emitting element, and
the third intermediate electrode forms an electrical connection between the third electrode and the second end of the at least one third light emitting element.

16. The pixel of claim 15, wherein
the first electrode, the second electrode, the third electrode, the fourth electrode, the fifth electrode, the sixth electrode, the seventh electrode, and the eighth electrode are disposed on the same layer,
the first electrode, the second electrode, the third electrode, and the fourth electrode are sequentially arranged in a first direction in a plan view,
the fifth electrode, the sixth electrode, the seventh electrode, and the eighth electrode are sequentially arranged in the first direction in the plan view, and
the fifth electrode, the sixth electrode, the seventh electrode, and the eighth electrode are spaced apart from the first electrode, the second electrode, the third electrode, and the fourth electrode, respectively, in a second direction intersecting the first direction in the plan view.

17. The pixel of claim 16, wherein
the first intermediate electrode includes:
a 1-1-th intermediate electrode overlapping the sixth electrode; and
a 1-2-th intermediate electrode which extends in the second direction from the 1-1-th intermediate electrode and overlaps the first electrode,
the third intermediate electrode includes:
a 3-1-th intermediate electrode overlapping the third electrode; and
a 3-2-th intermediate electrode which extends in the second direction from the 3-1-th intermediate electrode and overlaps the eighth electrode, and
the second intermediate electrode includes:
a 2-1-th intermediate electrode overlapping the second electrode; and
a 2-2-th intermediate electrode which extends from the 2-1-th intermediate electrode while detouring the 3-1-th intermediate electrode and overlaps the fourth electrode.

18. The pixel of claim 17, wherein
the fifth electrode is electrically connected to one of a transistor and a power line, and
the seventh electrode is electrically connected to the other of the transistor and the power line.

19. The pixel of claim 15, wherein the first end of the at least one first light emitting element, the first end of the at least one second light emitting element, the first end of the at least one third light emitting element, the first end of the at least one fourth light emitting element, and the first end of the at least one fifth light emitting element include a semiconductor layer of a same type.

20. The pixel of claim 19, wherein
the at least one second light emitting element and the at least one third light emitting element are electrically connected in parallel to each other, and
the at least one first light emitting element, the at least one second light emitting element, the at least one fourth light emitting element, and the at least one fifth light emitting element are electrically connected in series between the fifth electrode and the seventh electrode.

21. The pixel of claim 15, further comprising at least one sixth light emitting element disposed between the sixth electrode and the seventh electrode,
wherein
the first intermediate electrode electrically contacts a first end of the at least one sixth light emitting element, and
the second contact electrode electrically contacts a second end of the at least one sixth light emitting element.

22. A display device comprising:
a substrate including a plurality of pixel areas; and
a pixel provided in each of the pixel areas,
wherein the pixel includes:
a first electrode, a second electrode, a third electrode, and a fourth electrode, each disposed on the substrate and physically separated from each other;
at least one first light emitting element disposed between the first electrode and the second electrode;
at least one second light emitting element disposed between the second electrode and the third electrode;
at least one third light emitting element disposed between the third electrode and the fourth electrode;
a first contact electrode disposed on the first electrode and electrically contacting the first electrode and a first end of the at least one first light emitting element;
a first intermediate electrode disposed on the second electrode and electrically contacting a second end of the at least one first light emitting element and a first end of the at least one second light emitting element;

a second contact electrode disposed on the third electrode and electrically contacting the third electrode, a second end of the at least one second light emitting element, and a second end of the at least one third light emitting element; and a second intermediate electrode disposed on the third electrode and electrically contacting a first end of the at least one third light emitting element, wherein the first intermediate electrode and the second intermediate electrode are electrically connected to each other, the second contact electrode forms an electrical connection between the third electrode and the second end of the at least one second light emitting element, and the second contact electrode forms an electrical connection between the third electrode and the second end of the at least one third light emitting element.

* * * * *